(12) United States Patent
Suhara

(10) Patent No.: US 7,043,820 B2
(45) Date of Patent: May 16, 2006

(54) ELECTRIC-COMPONENT MOUNTING SYSTEM

(75) Inventor: Shinsuke Suhara, Kariya (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 632 days.

(21) Appl. No.: 10/200,291

(22) Filed: Jul. 23, 2002

(65) Prior Publication Data

US 2003/0116339 A1 Jun. 26, 2003

(30) Foreign Application Priority Data

Jul. 27, 2001 (JP) ............................ 2001-227695
Jul. 27, 2001 (JP) ............................ 2001-227696

(51) Int. Cl.
*B23P 23/00* (2006.01)
(52) U.S. Cl. ........................ 29/564.1; 29/739; 29/740; 29/741; 29/742; 29/743
(58) Field of Classification Search ............... 29/564.1, 29/740, 741, 739, 742, 743
See application file for complete search history.

(56) References Cited

U.S. PATENT DOCUMENTS

| | | | | |
|---|---|---|---|---|
| 5,249,356 A | * | 10/1993 | Okuda et al. .................. | 29/833 |
| 5,566,447 A | * | 10/1996 | Sakurai ........................ | 29/832 |
| 5,778,525 A | * | 7/1998 | Hata et al. .................... | 29/836 |
| 5,839,186 A | * | 11/1998 | Onodera ....................... | 29/720 |
| 5,864,944 A | * | 2/1999 | Kashiwagi et al. ........... | 29/833 |
| 6,408,505 B1 | * | 6/2002 | Hata et al. .................... | 29/740 |
| 6,535,291 B1 | * | 3/2003 | Skunes et al. ............... | 356/614 |
| 6,744,499 B1 | * | 6/2004 | Skunes et al. ........... | 356/243.1 |
| 6,842,974 B1 | * | 1/2005 | Maenishi et al. .............. | 29/832 |

FOREIGN PATENT DOCUMENTS

JP    A 6-155186    6/1994

* cited by examiner

*Primary Examiner*—Carl J. Arbes
(74) *Attorney, Agent, or Firm*—Oliff & Berridge, PLC

(57) ABSTRACT

An electric-component mounting system including a substrate-holding device for holding at least one circuit substrate, at least one first mounting unit and at least one second mounting unit, each of which has at least one mounting head each operable to receive a selected one of the electric components while each mounting unit is located in a component-supplying area, and to mount the electric component onto the at least one circuit substrate held by the substrate-holding device located in a component-mounting area, and a mounting-unit moving device operable to move the at least one first mounting unit and the at least one second mounting unit past each other, between the component-supplying and component-mounting areas in opposite directions, along respective two paths, without an interference between the first mounting unit and second mounting units.

47 Claims, 19 Drawing Sheets

ELECTRIC-COMPONENT MOUNTING SYSTEM

This application is based on Japanese Patent Application Nos. 2001-227695 and 2001-227696 filed on Jul. 27, 2001, the contents of which are incorporated hereinto by reference.

BACKGROUND OF THE INVENTION

1. Field of the Invention

The present invention relates to an electric-component mounting system arranged to mount electric components (including electronic components) on a circuit substrate, and a process of fabricating a printed-circuit board, which includes a step of mounting the electric components on the circuit substrate.

2. Discussion of Related Art

An electric-component mounting system is arranged to mount electric components on a circuit substrate which is held at a predetermined component-mounting position. A typical type of such an electric-component mounting system widely used in the art includes (A) a substrate-holding device arranged to hold the circuit substrate on which the electric components are to be mounted, (B) a mounting unit provided with a mounting head operable to receive and hold a selected electric component in a predetermined component-supplying area, and mount the electric component onto the component-mounting surface of the circuit substrate in a predetermined component-mounting area, and (C) a mounting-unit moving device operable to move the mounting unit in a plane parallel to the circuit substrate, between an appropriate component-supplying position in the component-supplying area and an appropriate component-mounting position in the component-mounting area.

A representative example of the mounting-unit moving device used in the electric-component mounting system of the type indicated above uses a so-called "XY slide assembly type" (XY robot type) including an X-axis slide and a Y-axis slide. This XY slide assembly type mounting-unit moving device generally includes (A) a relatively long X-axis slide, (B) an X-axis-slide moving device operable to move the X-axis slide in an X-axis direction perpendicular to its longitudinal direction and parallel to the surface of the circuit substrate, (C) a Y-axis slide slidably mounted on the X-axis slide, and (D) a Y-axis-slide moving device operable to move the Y-axis slide on the X-axis slide in a Y-axis direction perpendicular to the X-axis direction and parallel to the longitudinal direction of the X-axis slide. The mounting unit is mounted on the Y-axis slide, so that the mounting unit is movable in the X-axis and Y-axis directions in the plane parallel to the circuit substrate. Usually, a printed-circuit board is fabricated by mounting a multiplicity of electric components of various kinds on the circuit substrate. To fabricate the printed-circuit board, therefore, the mounting-unit moving device of the XY slide assembly type is required to be reciprocated a large number of times between the component-supplying area and the component-mounting area. In this respect, the electric-component mounting system using the mounting-unit moving device of the XY slide assembly type generally suffers from a comparatively low degree of efficiency in fabricating the printed-circuit board.

To improve the efficiency of mounting the electric components on the circuit substrate in the electric-component mounting system of the XY slide assembly type discussed above, it is considered to use a mounting device of twin-unit type (twin head type) which includes two mounting units. For instance, the mounting device of the twin-unit type may include two X-axis slides movable on the same guide rails, and two Y-axis slides which are slidably mounted on the respective two X-axis slides and on which the respective two mounting units are mounted. In this case, two component-supplying devices are provided on the respective opposite sides of the circuit substrate, and the mounting head is arranged such that the mounting unit mounted on the Y-axis slide on one of the two X-axis slides is assigned to receive the electric components from one of the two component-supplying devices, and the mounting head mounted on the Y-axis slide on the other X-axis slide is assigned to receive the electric components from the other component-supplying device, so that the two mounting units alternately operate to mount the electric components on the circuit substrate. Namely, one of the two mounting units receives the electric component from one of the two component-supplying devices, while at the same time the other mounting unit mounts the electric component on the circuit substrate in the component-mounting area.

In the electric-component mounting system using the mounting device of the twin-unit type having two mounting units that are moved in a plane between the component-supplying area and the component-mounting area, however, a need of avoiding a mutual interference of the two mounting units makes it difficult for the two mounting units to stay in the component-mounting area at the same time, and requires the two mounting units to be moved relative to each other in a suitably timed relation with each other. Accordingly, either one of the two mounting units is often required to be held stationary until a risk of the interference with the other mounting unit is eliminated. In this respect, a considerable improvement in the component-mounting efficiency is not expected. In addition, the provision of the two component-supplying devices on the opposite sides of the component-mounting area (circuit substrate) undesirably increases the overall size of the electric-component mounting system including the component-supplying devices, and the required space for installation of the system, leading to deteriorated efficiency of space utilization on the side of the user.

To improve the efficiency of mounting the electric components on the circuit substrate in the electric-component mounting system of the XY slide assembly type discussed above, it is also considered to use a mounting device which includes a plurality of mounting units, which are mounted on respective Y-axis slides slidably mounted on a single X-axis slide, for example. In the electric-component mounting system of this type, the mounting units can be moved independently of each other, so that the required number of times of reciprocation of the mounting units between the component-supplying and component-mounting areas can be reduced, and the component-mounting efficiency can be improved to some extent.

However, the component-mounting spots on which the electric components are to be mounted on the circuit substrate are not necessarily spaced from each other in the Y-axis direction parallel to the longitudinal direction of the X-axis slide. In the electric-component mounting system of the type described just above, therefore, it is difficult to perform component-mounting operations such that a plurality of electric components are simultaneously mounted on the respective component-mounting spots on the circuit substrate, by the respective two or more mounting units which are mounted on the respective Y-axis slides carried by the single X-axis slide. That is, a component-mounting operation by each mounting unit cannot be initiated after the completion of a component-mounting operation by the other mounting unit, until the X-axis slide is moved to a position corresponding to the component-mounting spot at which the electric component is to be mounted by the above-indicated each mounting unit. Thus, there is a limitation in the improvement in the component-mounting efficiency in the electric-component mounting system of the type using a plurality of mounting units on a single X-axis slide.

SUMMARY OF THE INVENTION

The present invention was made in view of a recent increase of a demand for printed-circuit boards and a need of improving the efficiency of mounting electric components to fabricate the printed-circuit boards, while assuring high efficiency of space utilization. It is a first object of the present invention to provide an electric-mounting system capable of fabricating the printed-circuit board with improved component-mounting efficiency and space utilization efficiency. A second object of this invention is to provide a process of fabricating the printed-circuit board with improved efficiency. Each of the objects indicated above may be achieved according to any appropriate one of the following modes of the present invention in the form of an electric-component mounting system or a printed-circuit board fabricating process, each of which is numbered like the appended claims and depends from the other mode or modes, where appropriate, for easier understanding of technical features disclosed in the present application and possible combinations of those technical features. However, it is to be understood that the invention is not limited to those technical features or combinations thereof, and that any one of a plurality of technical features described below with respect to any one mode of the invention may be a subject of the present invention, without the other technical feature or features being combined with that one feature.

(1) An electric-component mounting system comprising:

a substrate-holding device operable to hold at least one circuit substrate on which electric components are to be mounted;

at least one first mounting unit and at least one second mounting unit, each of which has at least one mounting head each of which is operable to receive a selected one of the electric components while each mounting unit is located in a component-supplying area in which the electric components are supplied, each mounting head being further operable to mount the electric component onto the at least one circuit substrate held by the substrate-holding device located in a component-mounting area; and a mounting-unit moving device operable to move the at least one first mounting unit and the at least one second mounting unit past each other, between the component-supplying and component-mounting areas in opposite directions, along respective two paths, without an interference between the at least one first mounting unit and the at least one second mounting unit. Since the first and second mounting units are free from an interference during their movements past each other, there are reduced restrictions or limitations in the component-mounting operations to be performed by the present electric-component mounting system. Accordingly, the present system assures a high degree of efficiency of the component-mounting operations.

The electric-component mounting system constructed according to the above mode (1) of the present invention includes a plurality of mounting units operable to receive, hold and mount the electric components. The mounting units consist of at least one first mounting unit and at least one second mounting unit.

The present electric-component mounting system is capable of fabricating a desired printed-circuit board of any type, by mounting a large number of electric components of different kinds on a printed-wiring board or any other circuit board. The electric components to be mounted on the circuit substrates include electronic components, and may be of various kinds and configurations such as resisters, capacitors or any other electric components in the form of chips or flat packages, which may or may not have connectors, terminals (contactors) and lead wires.

In the present electric-component mounting system, the electric components may be supplied from at least one component-supplying device, which may or may not be a part of the present system. The component-supplying device (s) may be of any desired type. The type of the component-supplying device to be used is usually determined depending upon the specific types of the electric components to be supplied. When the electric components have comparatively small sizes, the electric-component mounting system may use a component-supplying device of feeder type such as a tape feeder type and a bulk feeder type. Where the electric components have comparatively large sizes, the system may use a component-supplying device of tray type. Each component-supplying device of any desired type is preferably disposed relatively close to the substrate-holding device provided to hold the circuit substrate on which the electric components are to be mounted.

The substrate-holding device is arranged to hold the circuit substrate or substrates at a predetermined position or positions, while a series of component-mounting operations are performed on the circuit substrate or substrates. The substrate-holding device may use suitable holding means of any type for holding the circuit substrate or substrates. Where the circuit substrate is held with its the component-mounting surface facing upwards, the substrate-holding device may include a substrate supporting device arranged to fixedly support the substrate at its lower surface opposite to the upper component-mounting surface, such that the substrate is fixed on the substrate supporting device. Where the electric-component mounting system is provided with a conveyor device for loading the circuit substrates onto the substrate-holding device and/or unloading the circuit substrates from the substrate-holding device, the substrate-holding device may be constructed to be operatively connected to the conveyor device and operated in a predetermined timed relationship with the conveyor device. The present electric-component mounting system may be operated so as to complete the fabrication of a printed-circuit board within the system, or may be used in combination with other electric-component mounting system or systems or equipment such as a solder-paste applying or printing system, and/or a re-flow furnace. In the latter case, the present electric-component mounting system constitutes a part of a printed-circuit-board fabricating line, and the provision of conveyor devices such as substrate conveyor devices between the individual systems is effective to improve the printed-circuit-board fabricating efficiency. The substrate-holding device may be either stationary or movable in a plane parallel to the component-mounting surface of the circuit substrate. In the former case, the substrate-holding device is merely capable of holding the circuit substrate at a predetermined position. In the latter case, the substrate-holding device is provided with a positioning device operable to move the circuit substrate in the above-indicated plane, so as to eliminate a positioning error of the circuit substrate as held by the substrate-holding device, depending upon the component-mounting spots at which the electric components are to be mounted.

Each mounting head provided in the present electric-component mounting system has a function of receiving and holding the electric component and releasing the electric component to mount it onto the circuit substrate. For example, the mounting head includes a component-holding portion for holding the electric component, and a shaft portion which holds the component-holding portion and which is supported by the corresponding mounting unit such that the shaft portion is axially movable and rotatable about its axis. In the electric-component mounting system in which each mounting head has the component-holding portion and shaft portion described above and which is arranged to mount the electric components on the upper surface of the circuit substrate, each mounting head is supported by the mounting unit such that its axis of rotation extends in the vertical direction, and the component-holding portion is mounted on the lower end portion of the shaft portion. In the mounting head of this type, the component-holding portion may use any desired component-holding mechanism, for instance, include a suction nozzle for holding the electric component at its lower end face, by suction under a negative pressure. Alternatively, the component-holding portion may use a suitable chuck for mechanically gripping the electric component. The mounting head may be arranged such that the component-holding portion can be changed depending upon the size and/or configuration of the electric component to be held. Where the mounting unit uses the mounting head of the type described above, the mounting unit may be provided with an axial head drive device operable to move the mounting head in the axial direction, and a head rotating device operable to rotate the mounting head about its axis. The axial head drive device may be controlled to advance or lower the mounting head when the mounting head receives the electric component or transfers the electric component onto the circuit substrate, and retract or elevate the mounting head when the mounting unit is moved between the component-supplying and component-mounting areas. Further, the axial head drive device may be controlled such that the position at which the mounting head receives or mount the electric component is adjusted depending upon the thickness of the electric component. The head rotating device may be controlled to rotate the mounting head, to mount the electric component at the predetermined angular position, while eliminating an angular positioning error of the electric component as held by the mounting head. Thus, each mounting unit is an unitary assembly incorporating the mounting head and various other devices which cooperate with the mounting head to mount the electric component on the circuit substrate, in the intended manner.

The term "component-supplying area" used herein is interpreted to mean an area in which the mounting unit is located when the mounting unit receives the electric components at a predetermined component-supply position of the component-supplying device described above, while the term "component-mounting area" used herein is interpreted to mean an area in which the mounting unit is located when the electric component held by the mounting head is transferred onto the circuit substrate as held by the substrate-holding device. Where the circuit substrate is held such that the component-mounting surface faces upwards, and the electric components are mounted on the upper component-mounting surface of the circuit substrate by a downward movement of the mounting head toward the upper component-mounting surface, the component-mounting area is a space provided above the circuit substrate. Where the electric component is held by the mounting head by a downward movement of the mounting head at the component-supplying position, the component-supplying area is a space provided above the component-supplying portion of the component-supplying device. Where the component-supplying device is of feeder type including a plurality of component feeders whose component-supply portions are arranged along a straight line, the component-supplying area is a comparatively narrow area aligned with the straight line. Where the component-supplying device is of tray type, the component-supplying area is a comparatively wide area aligned with a stack of trays. The relationship between the component-supplying and component-mounting areas corresponds to a positional relationship between the component-supplying device and the substrate-holding device, which will be described in detail.

The mounting-unit moving device provided in the present electric-component mounting system is arranged to move the first mounting unit or units and the second mounting unit or units past each other between the component-supplying and component-mounting areas in the opposite directions, as described above. The mounting-unit moving device is required to move the first and second mounting units over a distance sufficient to cover the entirety of the component-supplying area and the entirety of the component-mounting area. The mounting-unit moving device may be of any desired type such as an XY slide assembly type (XY robot type) as described before and to be described below in detail. The mounting-unit moving device is required to move the at least one first mounting unit and the at least one second mounting unit, independently of each other. For instance, the mounting-unit moving device may include two moving devices of XY slide assembly type which are arranged to move the at least one first mounting unit and the at least one second mounting unit, respectively, as described below in detail. Alternatively, the mounting-unit moving device may be a moving device of XY slide assembly type including two X-axis slides on which the first and second mounting units are movably mounted.

The mounting-unit moving device of any type as described above is required to move the at least one first mounting unit and the at least one second mounting unit, past each other, between the component-supplying and component-mounting areas in the opposite areas, along the respective paths, such that the first and second mounting units are prevented from interfering each other during their movements in the opposite directions toward one and the other of the component-supplying and component-mounting areas. At a given point of time, one of the first and second mounting units is in operation to receive the electric component in the component-supplying area, while the other mounting unit is in operation to mount the electric component on the circuit substrate in the component-mounting area. Subsequently, the mounting unit which has received the electric component is moved from the component-supplying area to the component-mounting area, while the mounting unit which has transferred the electric component onto the circuit substrate is moved from the component-mounting area to the component-supplying area. During the movements of the first and second mounting units past each other in the opposite directions, there may arise an interference between the first and second mounting units. Even where two or more component-supplying areas are provided, this interference may arise for each of the component-supplying areas. In the present electric-component mounting system constructed in view of the drawback indicated above, the mounting-unit moving device is arranged to move the first and second mounting units between the component-supplying and component-mounting areas in the opposite directions, along the respective paths that are determined so as to avoid an interference between the first and second mounting units during their movements past each other in the opposite directions. Specific arrangements for moving the first and second mounting units along those paths will be described in detail.

(2) An electric-component mounting system according to the above mode (1), wherein two component-supplying areas are provided on respective opposite sides of the component-mounting area.

(3) An electric-component mounting system according to the above mode (1), wherein one component-supplying area is provided on one of opposite sides of the component-mounting area.

The electric-component mounting system according to the above two modes (2) and (3) employ different numbers of the component-supplying areas, and different relationships between the component-supplying and component-mounting areas. The number of the component-supplying areas that are provided in the present system is not limited. For instance, four component-supplying areas are provided on respective four sides of the component-mounting area. Usually, the present system constitutes a part of a production line. In this case, it is desirable not to provide two component-supplying areas on the respective opposite sides of the substrate-holding device as viewed in a direction of loading and unloading of the circuit substrates, which is perpendicular to the longitudinal direction of the production line. In this respect, it is preferable to provide one component-supplying area or two component-supplying areas on one of opposite sides or respective opposite sides of the component-mounting area as viewed in the direction of movements of the first and second mounting units by the mounting-unit moving device, as in the above mode (3) or (2).

In the above mode (2) wherein the two component-supplying areas are provided on the respective opposite sides of the component-mounting area, a comparatively large number of component-supplying devices may be disposed in the two component-supplying areas, so that a comparatively large number of different kinds of electric components may be supplied. Further, the electric-component mounting system according to the above mode (2) may be arranged such that one of the first and second mounting units is assigned to receive the electric components primarily from the component-supplying device or devices in one of the two component-supplying areas, while the other mounting unit is assigned to receive the electric components primarily from the component-supplying device or devices in the other component-supplying area. This arrangement is effective to improve the versatility of the component-mounting operations, and to reduce the non-productive time due to a need of changing the component-holding portions (e.g., suction nozzles) of the mounting heads. In the electric-component mounting system according to the above mode (3) wherein only one component-supplying area is provided on one of the opposite sides of the component-mounting area, the required space for the system can be reduced. In this case, the component-supplying devices are desirably small-sized.

(4) An electric-component mounting system according to the above mode, further comprising a mounting-unit position control device operable to control the mounting-unit moving device such that when one of the at least one first mounting unit and the at least one second mounting unit is located in the component-mounting area, the other of the at least one first mounting unit and the at least one second mounting unit is located in the component-supplying area, to enable the at least one mounting head thereof to receive the electric component.

In the electric-component mounting system wherein the component-supplying device is located on one of opposite sides of the substrate-holding device, for reducing the required space for the system, the positions of the first and second mounting units may be controlled such that the first and second mounting units are alternately located in the component-supplying and component-mounting areas so that one of the first and second mounting units receives the electric components while the other mounting unit mounts the electric components on the circuit substrate. In this case, the first and second mounting units are repeatedly moved between the component-supplying and component-mounting areas in the opposite directions. In this case, the number of the electric components that can be mounted on the circuit substrate per unit time in the present system can be doubled with respect to that in an electric-component mounting system using a single mounting unit. Accordingly, the system according to the above mode (4) assures comparatively high component-mounting efficiency and requires a comparatively small space. Where a control device including a computer is used for controlling the mounting-unit moving device, this control device may include the above-indicated mounting-unit-position control device.

(5) An electric-component mounting system according to any one of the above modes (1)–(4), wherein the substrate-holding device holds at least two circuit substrates such that the at least two circuit substrates are arranged in a direction in which the component-supplying and component-mounting areas are spaced from each other.

In the electric-component mounting system according to the above mode (5), the substrate-holding device has at least two stations for holding the respective circuit substrates. Where the present system is a part of a printed-circuit-board fabricating line, for instance, one of the two circuit substrates, for example, is placed in a standby state while the component mounting operations are performed on the other circuit substrate. The circuit substrate in the standby state may be subjected to preparatory operations such as an operation to detect its positioning error. Alternatively, the component mounting operations may be performed concurrently on the two circuit substrates. Since the movements of the first and second mounting units between the component-supplying and component-mounting areas can be achieved without an interference between the first and second mounting units, the system may be readily operated such that the first and second mounting units are assigned to mount the electric components on the respective two circuit substrates. The present system which is operable in a selected one of different operating modes has high degrees of operating flexibility, versatility and efficiency.

(6) An electric-component mounting system according to any one of the above modes (1)–(5), wherein the mounting-unit moving device is arranged to move the at least one first mounting unit and the at least one second mounting unit between the component-supplying and component-mounting areas such that at least portions of the two paths in which the first and second mounting units are moved past each other in the opposite directions are spaced respective different distances from a predetermined reference plane which is parallel to a component-mounting surface of the at least one circuit substrate and which is set at a predetermined position in a direction perpendicular to the component-mounting surface.

The above mode (6) is one of modes available to prevent the interference between the first and second mounting units during their movements past each other in the opposite directions between the component-supplying and component-mounting areas. Where the circuit substrate is held such that its component-mounting surface faces upwards, for example, the mounting units are moved over the circuit substrate. In this case, the mounting-unit moving device provided according to the above mode (6) is arranged to move the first and second mounting units between the component-supplying and component-mounting areas in the opposite directions, along the respective two paths which are located different distances from the predetermined reference plane, namely, from the component-mounting surfaces, at least in the portions of the paths in which the first and second mounting units are moved past each other. This arrangement to avoid the interference is relatively simple. Specific forms of this arrangement will be described.

(7) An electric-component mounting system according to the above mode (6), wherein the mounting-unit moving device comprises:

a first mounting-unit moving device operable to move the at least one first mounting unit between the component-supplying and component-mounting areas, along a first plane parallel to the predetermined reference plane; and a second mounting-unit moving device operable to move the at least one second mounting unit between the component-supplying and component-mounting areas, along a second plane which is parallel to the predetermined reference plane, the first and second planes being spaced respective different distances from the predetermined reference plane.

In the electric-component mounting system according to the above mode (7), the mounting-unit moving device comprises the first and second mounting-unit moving devices respectively arranged to move the first and second mounting units along the respective first and second planes spaced from the reference planes by the different distances, over an entire area between the component-supplying and component-mounting areas. However, the first and second mounting units may be moved along the respective first and second planes, over a portion of the area between the component-supplying and component-mounting areas in which the first and second mounting units are moved past each other.

The first and second mounting-unit moving devices in the system according to the above mode (7) may be of XY slide assembly type or XY robot type (which will be described in detail), including respective two structures which carry the respective first and second mounting units and which are moved along the respective two planes which are spaced apart from each other in the direction perpendicular to the predetermined reference plane. These two structures movable along the respective planes are comparatively simple in construction. Since the interference of the first and second mounting units with each other is prevented over the entire area between the component-supplying and component-mounting areas, the system according to the above mode (7) has a comparatively high degree of freedom in the timings of receiving and mounting the electric components and initiating and terminating the movements of the first and second mounting units, and comparatively high degrees of component mounting versatility and efficiency.

The mounting-unit moving devices to move the mounting units along respective planes may be of any types other than the XY slide assembly type. For instance, the mounting-unit moving device may include (a) a generally elongate guide rail supported pivotally about a pivot axis, (b) a pivoting device operable to pivot the guide rail about the pivot axis in a plane perpendicular to the pivot axis, (c) a slide which is slidably mounted on the guide rail and which supports at least one mounting unit, and (d) a slide-moving device operable to move the slide on the guide rail in the longitudinal direction of the guide rail. The electric-component mounting system may include three or more sets of mounting units, for instance, first, second and third sets of mounting units. In this case, the mounting-unit moving device includes the first, second and third mounting-unit moving devices, for example, to move the respective three sets of mounting units along respective three planes which are spaced from the reference planes by respective different distances.

(8) An electric-component mounting system according to the above mode (7), further comprising a distance-difference eliminating device operable to eliminate a difference between the distances of the first and second mounting units to the predetermined reference plane, in at least one of a component-receiving operation in which the first and second mounting units receive the electric components in the component-supplying area, and a component-mounting operation in which the first and second mounting units mount the electric components on the at least one circuit substrate in the component-mounting area.

Where the first and second mounting units are moved along the respective planes which are spaced from the reference plane by the respective different distances, the distances from the first mounting unit (first plane) to the component-supplying device and the component-mounting surface of the circuit substrate are different from the distances from the second mounting unit (second plane) to the component-supplying device and the component-mounting surface of the circuit substrate, when the electric components are received and mounted by the mounting units. Accordingly, the first and second mounting units are required to be moved to and from the component-supplying device and the circuit substrate by the different distances. In other words, each mounting head provided on one of the first and second mounting units is required to be moved by longer distances to and from the component-supplying device and the component-mounting surface of the circuit substrate, to receive and mount the electric component. This requires different types of mounting heads to be provided on the first and second mounting units, and these different types of mounting heads must be controlled in respective different manners. In this respect, the system tends to be complicated in construction and control. In view of this drawback, the distance-difference eliminating device is provided in the system according to the above mode (8), to eliminate the difference between the distances of the first and second mounting units to the reference plane, so that the system is simplified in construction and control. The distance-difference eliminating device is preferably arranged to eliminate the above-indicated difference of the distances in both of the component-receiving and component-mounting operations in the component-supplying and component-mounting areas. This arrangement permits the first and second mounting units to have the same construction, and further improves the construction of the system as a whole.

(9) An electric-component mounting system according to the above mode (8), wherein the distance-difference eliminating device includes a distance-difference elimination moving device operable to move at least one of the first and second mounting units.

The specific arrangement of the distance-difference eliminating device is not particularly limited. The distance-difference-elimination moving device according to the above mode (9) is one of relatively simple arrangements of the distance-difference eliminating device. In the electric-component mounting system according to the above mode (9), the distance-difference-elimination moving device is provided to change the position of at least one of the first and second mounting units in the direction perpendicular to the component-mounting surface (reference plane) when the mounting units in the component-receiving and component-mounting operations, so that the first and second mounting units are located at the same position in the above-indicated plane. In other words, the distance-difference-elimination moving device moves at least one of the first and second mounting units, so as to eliminate the difference between the positions of the first and second mounting units in the above-indicated direction, which is equal to the distance between the above-indicated first and second planes along which the first and second mounting units are moved past each other between the component-supplying and component-mounting areas in the opposite directions. The stability in preventing the interference between the first and second mounting units during their movements increases with an increase in the distance between the first and second planes, that is, with an increase in the amount of difference between the above-indicated positions of the first and second mounting units during their movements. It is also noted that the distance-difference-elimination moving device may be operated to increase the amount of difference of the distances of the first and second mounting units to the reference plane, or to generate the difference of those distances. Accordingly, it is possible to move the first and second mounting units in the same plane between the component-supplying and component-mounting areas, except when the first and second mounting units are moved past each other. In this case, the distance-difference-elimination moving device is operated shortly before the first and second mounting units approach each other, so that the first and second mounting units are moved past each other along the above-indicated respective two planes, without an interference therebetween. This arrangement is one form of the mounting-unit moving device provided in the system according to the mode (6) described above. The distance-difference-elimination moving device need not be arranged to move both of the first and second mounting units, and may be arranged to move only one of the first and second mounting units. In the latter case, the mounting system can be accordingly simplified.

(10) An electric-component mounting system according to the above mode (9), wherein the distance-difference-elimination moving device includes a mounting-unit translating device operable to translate at least one of the first and second mounting units in a direction substantially perpendicular to the predetermined reference plane.

(11) An electric-component mounting system according to the above mode (9) or (10), wherein the distance-difference-elimination moving device includes a mounting-unit pivotally moving device operable to pivot at least one of the first and second mounting units each about a pivot axis substantially parallel to the predetermined reference plane.

The distance-difference-elimination moving devices provided according to the above two modes (10) and (11) are typical examples according to the mode (9). Where the circuit substrate is held with its component-mounting surface facing upwards, the distance-difference-elimination moving device provided according to the above mode (10) may be operated such that the at least one first or second mounting unit located at a higher position than the other is lowered to receive or mount the electric component. The mounting-unit pivotally moving device provided according to the above mode (11) may be operated such that the at least one first or second mounting unit located at the higher position is held in an upper position during the movements of the first and second mounting units past each other, so as to prevent an interference between the first and second mounting units, and such that when the at least one first or second mounting unit is operated to receive and mount the electric component, it is pivoted to a lower position in which the at least one mounting head extends in the vertical direction (in the direction perpendicular to the reference plane). The distance-difference-elimination moving device may include both of the mounting-unit translating device according to the above mode (10) and the mounting-unit pivotally moving device according to the above mode (11).

(12) An electric-component mounting system according to any one of the above modes (8)–(11), wherein the distance-difference eliminating device is operable to eliminate the difference between the distances of the first and second mounting units to the predetermined reference plane in at least the component-mounting operation, and includes a substrate moving device operable to move the at least one circuit substrate in a direction substantially perpendicular to the predetermined reference plane, to eliminate the difference, in at least one of a first component-mounting operation in which the electric components are mounted by the at least one first mounting unit, and a second component-mounting operation in which the electric components are mounted by the at least one second mounting unit.

The difference between the distances of the first and second mounting units to the reference plane can be eliminated in the component-mounting operation, by moving the circuit substrate(s) rather than moving at least one of the first and second mounting units. Where the circuit substrate is held with its component-mounting surface facing upwards, the difference can be eliminated by elevating and lowering the circuit substrate. In this case, the substrate moving device may be incorporated in the substrate-holding device, or may be arranged to elevate and lower the substrate-holding device to thereby elevate and lower the circuit substrate. It will be understood that the above-indicated difference in the component-receiving operation may be eliminated by moving the component-supplying position in the direction substantially perpendicular to the reference plane, for example, by moving the component-supplying device per se in the vertical direction, for instance.

(13) An electric-component mounting system according to any one of the above modes (7)–(12), wherein each of at least one of the first and second mounting-unit moving devices comprises:

an X-axis slide disposed movably in a first direction parallel to the predetermined reference plane and extending in a second direction which is parallel to the reference plane and which intersects the first direction;

an X-axis-slide moving device operable to move the X-axis slide in the first direction;

a Y-axis slide which is disposed movably in the second direction on the X-axis slide and which carries one of the first and second mounting units which is moved by the each of at least one of the first and second mounting-unit moving devices; and a Y-axis-slide moving device operable to move the Y-axis slide in the second direction on the X-axis slide.

(14) An electric-component mounting system according to the above mode (13), wherein the first mounting-unit moving device comprises (a) a first X-axis slide disposed movably in a first. X-axis direction parallel to the reference plane and extending in a first Y-axis direction which is parallel to the reference plane and which intersects the first X-axis direction, (b) a first X-axis-slide moving device operable to move the first X-axis slide in the first X-axis direction, (c) a first Y-axis slide which is disposed movably in the first Y-axis direction on the first X-axis slide and which carries the at least one first mounting unit moved by the first mounting-unit moving device, and (d) a first Y-axis-slide moving device operable to move the first Y-axis slide in the first Y-axis direction on the first X-axis slide, and wherein the second mounting-unit moving device comprises (i) a second X-axis slide disposed movably in a second X-axis direction parallel to the reference plane and extending in a second Y-axis direction which is parallel to the reference plane and which intersects the second X-axis direction, (ii) a second X-axis-slide moving device operable to move the second X-axis slide in the second X-axis direction, (iii) a second Y-axis slide which is disposed movably in the second Y-axis direction on the second X-axis slide and which carries the at least one second mounting unit moved by the second mounting-unit moving device, and (iv) a second Y-axis-slide moving device operable to move the second Y-axis slide in the second Y-axis direction on the second X-axis slide.

In the electric-component mounting systems according to the above modes (13) and (14), one or both of the first and second mounting-unit moving devices is/are of the XY slide assembly type or XY robot type. Namely, each of at least one of the first and second mounting-unit moving device is an XY-slide-assembly type moving device. The XY-slide-assembly type moving device has a high degree of freedom in the path of movement of the mounting units, and can be suitably used as the mounting-unit moving device, owing to a relatively simple arrangement for moving the mounting unit in the plane parallel to the reference plane. In the mode (13), the XY-slide-assembly type moving device is used as at least one of the first and second mounting-unit moving devices. In the mode (14) which is one form of the mode (13), the XY-slide-assembly type moving device is used as each of the first and second mounting-unit moving devices. Although some modes of the present invention which will be described include technical features relating to the above mode (14) using the XY-slide-assembly type moving device for each of the first and second mounting-unit moving devices, it will be understood that those technical features are equally applicable to the electric-component mounting system wherein the XY-slide-assembly type moving device is used for only one of the first and second mounting units.

While the XY-slide-assembly type moving device is capable of moving the mounting unit in a plane parallel to the reference plane, this moving device may incorporate or may be provided with another moving device (hereinafter referred to as "Z-axis moving device") operable to move the XY-slide-assembly type moving device per se or its X-axis slide in a third direction (Z-axis direction) perpendicular to the first and second directions in which the X-axis slide and the Y-axis slide are movable, respectively. This arrangement permits three-dimensional movements of the mounting unit. Where the XY-slide-assembly type moving device is used for each of the first and second mounting-unit moving devices as in the above mode (14), the above-indicated Z-axis moving device may be provided for at least one of the two XY-slide-assembly type moving devices. In this arrangement, the first and second mounting units may be arranged to be moved in the same plane, between the component-supplying and component-mounting areas, except in a portion of the movement path in which the first and second mounting units are moved past each other. That is, the Z-axis moving device is operated to move at least one of the two XY-slide-assembly type moving devices in the direction perpendicular to the reference plane, so that the first and second mounting units are moved past each other along the respective two paths which are spaced apart from each other, while preventing an interference between the first and second mounting units. It will be understood that the Z-axis moving device functions as the device operable to generate the difference between the distances of the first and second mounting units to the reference plane, as described above with respect to the mode (9). The mounting-unit moving device according to the above mode (6) is obtained as long as the two XY-slide-assembly type moving devices are movable relative to each other while avoiding an interference therebetween. In the above mode (14) wherein the two XY-slide-assembly type moving devices are used as the respective first and second mounting-unit moving devices, at least one of the X-axis slide is moved along a path consisting of a straight portion parallel to the reference plane, and a curved portion which is curved in the direction perpendicular to the reference plane and in which the first and second mounting units are moved past each other. The movement of the X-axis slide along the curved portion of its path makes it possible to prevent an interference between the first and second mounting units. This arrangement is also consistent with the technical feature according to the above mode (6) in which the portions of the two paths of the first and second mounting units are spaced from the reference plane by the respective different distances.

Two X-axis slides which carry the respective first and second mounting units and which are movable in the same plane parallel to the reference plane may be disposed such that one of the two X-axis slide is movable to the component-supplying area while the other X-axis slide is movable to the component-mounting area, and such that the two X-axis slides are movable to a predetermined position between the component-supplying and component-mounting areas, at which the at least one mounting head of the at least one first mounting unit mounted on one of the two X-axis slides and the at least one mounting head of the at least one second mounting unit mounted on the other X-axis slide are exchanged with each other, so that each mounting head holding the electric component is transferred from the at least one first mounting unit to the at least one second mounting unit, while each mounting head from which the electric component has been transferred onto the circuit substrate is transferred to the at least one second mounting unit to the at least one first mounting unit. This arrangement of the XY-slide-assembly type moving devices is one form of the mounting-unit moving device according to the above mode (1), which permits the movements of the first and second mounting units past each other between the component-supplying and component-mounting areas, along the respective two paths, without an interference of the first and second mounting units. In this arrangement, the two paths lie in the same plane.

Two XY-slide-assembly type moving devices which are movable in respective two planes that are parallel to the reference plane and spaced from the reference plane by respective different distances may be combined with elevating and lowering devices provided at the opposite ends of movement of each of the two X-axis slides of the two moving devices, so that each X-axis slide is movable along a loop lying in a plane which is perpendicular to the reference plane and parallel to the direction of movement of the X-axis slide. In this arrangement, the first and second mounting units can be moved along the respective loops such that the first and second mounting units are moved past each other along respective portions of the loops which are spaced from the reference plane by respective different distances. This arrangement is one form of the mode (6) described above. Mounting units other than the first and second mounting units may be moved along the same loop.

(15) An electric-component mounting system according to the above mode (14), wherein the first and second X-axis directions in which the first and second X-axis slides are moved, respectively, are substantially parallel to each other.

(16) An electric-component mounting system according to the above mode (15), wherein two component-supplying areas are provided on respective opposite sides of the component-mounting area, such that the two component-supplying areas and the component-mounting area are spaced from each other in a direction substantially parallel to the first and second X-axis directions.

(17) An electric-component mounting system according to the above mode (15), wherein the component-supplying area is provided on one of opposite sides of the component-mounting area, such that the component-supplying and component-mounting areas spaced from each other in a direction substantially parallel to the first and second X-axis directions.

(18) An electric-component mounting system according to any one of the above modes (14)–(17), wherein the substrate-holding device is operable to hold at least two circuit substrates such that the at least two circuit substrates are arranged in a direction in which the component-supplying and component-mounting areas are spaced from each other.

The above modes (15) through (18) relate to the relationships between the directions of movement of the X-axis slides of the XY-slide-assembly type moving devices for the first and second mounting units and the positions of the component-supplying and component-mounting areas, or the relationship between the positions of the component-supplying and component-mounting areas and the circuit substrates as held by the substrate-holding device. In the above mode (15), the first and second X-axis slides of the first and second mounting-unit moving devices are moved in substantially the same direction. Where these two X-axis slides are disposed so as to extend in the same direction, in particular, the two mounting-unit moving devices of the XY-slide assembly type can be similarly controlled, and the control of the electric-component mounting system can be simplified.

In the above modes (16) and (17) wherein the component-supplying and component-mounting areas are spaced from each other in a direction substantially parallel to the direction of movement of the two X-axis slides, so that the first and second mounting units are movable between the component-supplying and component-mounting areas, with a reduced possibility of an interference of the mounting unit on one of the two X-axis slides with the other X-axis slide, upon receiving and mounting of the electric components, whereby the component-mounting efficiency of the system is accordingly improved. In the above mode (18) in which the two or more circuit substrates may be held by the substrate-holding device such that the circuit substrates are arranged in the direction of arrangement of the component-supplying and component-mounting areas, the component-mounting efficiency is also improved. It is noted that the electric-component mounting systems according to the above modes (16)–(18) have substantially the same advantages as described above with respect to the above modes (2)–(5).

(19) An electric-component mounting system according to any one of the above modes (14)–(18), wherein each of at least one of the first and second Y-axis slides which has the at least one first mounting unit and the at least one second mounting unit, respectively, is provided with a distance-difference eliminating device operable to move at least one of the first and second mounting units, for eliminating a difference between the distances of the first and second mounting units to the predetermined reference plane, in at least one of a component-receiving operation in which the first and second mounting units receive the electric components in the component-supplying area, and a component-mounting operation in which the first and second mounting units mount the electric components on the at least one circuit substrate in the component-mounting area.

(20) An electric-component mounting system according to the above mode (19), wherein the distance-difference eliminating device includes a mounting-unit translating device operable to translate the each of at least one of the first and second mounting units in a direction substantially perpendicular to the predetermined reference plane.

(21) An electric component mounting system according to the above mode (19) or (20), wherein the distance-difference eliminating device includes a mounting-unit pivotally moving device operable to pivot at least one of the first and second mounting units each about a pivot axis substantially parallel to the predetermined reference plane.

The above modes (19)–(21) relate to a distance-difference eliminating device described with respect to the above mode (8), as applied to the system including the first and second mounting-unit moving devices of the XY-slide-assembly type. In these modes (19)–(21), at least one of the first and second Y-axis slides is provided with the distance-difference eliminating device, to prevent an interference of the first and second mounting units when these mounting units are moved past each other. It is noted that the electric-component mounting systems according to the above modes (19)–(21) have substantially the same advantages as described above with respect to the above modes (9)–(11).

(22) An electric-component mounting system according to any one of the above modes (14)–(21), wherein the first X-axis slide moving device includes one first X-axis guide rail extending in the first X-axis direction, and a first X-axis-slide supporting device which supports the first X-axis slide at one end portion thereof and which is movable on the first X-axis guide rail, and the second X-axis slide moving device includes one second X-axis guide rail extending in the second X-axis direction, and a second X-axis-slide supporting device which supports the second X-axis slide at one end portion thereof and which is movable on the second X-axis guide rail,

(23) An electric-component mounting system according to any one of the above modes (14)–(21), wherein the first X-axis-slide moving device includes two first X-axis guide rails extending in the first X-axis direction, and two first X-axis-slide supporting devices which support the first X-axis slide at opposite end portions thereof and which are movable on the two first X-axis guide rails, respectively, and the second X-axis-slide moving device includes two second X-axis guide rails extending in the second X-axis direction, and two second X-axis-slide supporting devices which support the second X-axis slide at opposite end portions thereof and which are movable on the two second X-axis guide rails, respectively.

The above two modes (22) and (23) relate to two different mechanisms of the first and second mounting-unit moving devices of the XY-slide-assembly type, more specifically, to different structures for supporting the X-axis slides of the first and second X-axis-slide moving devices. In the mode (22), each of the first and second X-axis slides is supported at its one end portion by a single X-axis-slide supporting device, which is movable on a single X-axis guide rail, to move the X-axis slide. Thus, each mounting-unit moving device is an XY-slide-assembly type moving device wherein the X-axis slide is of so-called "cantilever type" supported at one of its opposite end portions. In the above mode (23), each of the first and second X-axis slides is supported at its opposite end portion by respective two X-axis-slide supporting devices, which are movable on the respective two X-axis guide rails, to move the X-axis slide. Thus, each mounting-unit moving device is an XY-slide-assembly type moving device wherein the X-axis slide is supported at its opposite end portions. The XY-slide-assembly type moving devices according to the mode (22) are comparatively simple in construction and small-sized. The XY-slide-assembly type moving devices according to the mode (23) assure a comparatively high degree of positioning accuracy of the mounting units, and accordingly permit a comparatively high degree of positioning accuracy of the electric components as mounted on the circuit substrate. The two different arrangements according to the above modes (22) and (23) are selectively used depending upon the specifications of the electric-component mounting system. Although both of the two X-axis-slide moving devices use a single X-axis-slide supporting device in the above mode (22) or two X-axis-slide supporting devices in the above mode (23), it is possible that one of the two X-axis-slide moving devices uses a single X-axis-slide supporting device for supporting the corresponding X-axis slide at its one end portion, while the other X-axis-slide moving device uses two X-axis-slide supporting devices for supporting the corresponding X-axis slide at its opposite end portions.

(24) An electric-component mounting system according to any one of the above modes (14)–(23), wherein the at least one first mounting unit consists of at least two first mounting units, and the at least one second mounting unit consists of at least two second mounting units, and wherein the first mounting-unit moving device includes at least two first Y-axis slides which respectively carry the at least two first mounting units and which are moved by the first Y-axis-slide moving device independently of each other on the first X-axis slide, the second mounting-unit moving device including at least two second Y-axis slides which respectively carry the at least two second mounting units and which are moved by the second Y-axis-slide moving device independently of each other on the second X-axis slide.

In the electric-component mounting system according to the above mode (24), each of the first and second mounting-unit moving devices carries at least two mounting units mounted on respective Y-axis slides on the corresponding X-axis slide. In this mode, the two or more Y-axis slides on the X-axis slide located in the component-supplying device are moved in the Y-axis direction independently of each other to move the respective mounting units to the respective component-supplying positions which are arranged in the Y-axis direction (in the longitudinal direction of the X-axis slide). Accordingly, the two or more electric components can be held substantially simultaneously by the respective mounting heads of the mounting units. Further, the electric components held by the mounting heads of the mounting units on the X-axis slide located in the component-mounting area can be simultaneously mounted on the circuit substrate, if those mounting heads are arranged in the Y-axis direction or in the longitudinal direction of the X-axis slide. In addition, the mounting system according to the above mode (24) wherein each of the two X-axis slides carries two or more mounting units is advantageous in that the required number of reciprocation of each X-axis slide between the component-supplying and component-mounting areas can be reduced, so that the required component-mounting time can be accordingly required, resulting in an increased component-mounting efficiency owing to the provisions of the two or more mounting units on each X-axis slide. Although both of the first and second X-axis slides carry at least two mounting units in the above mode (24), it is possible that one of the two X-axis slides carries one mounting unit, while the other X-axis slide carries two or more mounting units.

(25) An electric-component mounting system according to the above mode (24), wherein the first X-axis-slide moving device is operable to incline the first X-axis slide in a plane parallel to the predetermined reference plane, with respect to a straight line perpendicular to the first X-axis direction, and the second X-axis-slide moving device is operable to incline the second X-axis slide in the plane parallel to the predetermined reference plane, with respect to a straight line perpendicular to the second X-axis direction.

Where the first and second X-axis slides are merely translated in the X-axis directions, the two or more mounting units carried by the Y-axis slides mounted on each X-axis slide movably in the longitudinal direction of the X-axis slide are arranged in the longitudinal direction of the X-axis slide. For the mounting heads on the two or more mounting units on the same X-axis slide to mount the respective electric components on the circuit substrate at the same time, the component-mounting spots on the circuit substrate at which the electric components are mounted simultaneously must be arranged in a straight line parallel to the longitudinal direction of the X-axis slide. Accordingly, the number of the component-mounting spots at which the electric components can be simultaneously mounted by the mounting units on each X-axis slide described above is limited. In the above mode (25), however, each X-axis slide is inclinable in a plane parallel to the component-mounting surface of the circuit substrate, with respect to a straight line perpendicular to the X-axis direction, as well as movable in the above-indicated plane, so that the number of the component-mounting spots at which the electric components can be mounted simultaneously by the mounting units on the same X-axis slide can be increased. Where each X-axis slide carries two mounting units, these mounting units can be moved to desired two positions, respectively, as long as those two positions are not located within an area in which the two mounting units interfere with each other. Accordingly, the two mounting units can be used to mount the plurality of electric components at the same time at the desired respective component-mounting spots on the circuit substrate, so that the component-mounting efficiency can be significantly improved in the mounting system according to the above mode (25). Although the two X-axis slides are both inclinable in the above mode (25), only one of the two X-axis may be inclinable. It is noted that the technical features of the following modes are available for the inclinable one of the two X-axis slides.

(26) An electric-component mounting system according to the above mode (25), wherein the first X-axis-slide moving device includes (a) two first X-axis guide rails extending in the first X-axis direction, (b) two first X-axis-slide pivotally supporting devices which respectively support the first X-axis slide at respective opposite end portions thereof such that the first X-axis slide is pivotable at its opposite end portions, the two first X-axis-slide pivotally supporting devices being movable on the two first X-axis guide rails, respectively, and (c) a first distance-change permitting device operable in response to a pivotal motion of the first X-axis slide, to permit a change of a distance between two positions at which the first X-axis slide is supported by the two first X-axis-slide pivotally supporting devices, and said second X-axis-slide moving device includes (i) two second X-axis guide rails extending in the second X-axis direction, (ii) two second X-axis-slide pivotally supporting devices which respectively support the second X-axis slide at respective opposite end portions thereof such that the second X-axis slide is pivotable at its opposite end portions, the two second X-axis-slide pivotally supporting devices being movable on the two second X-axis guide rails, respectively, and (iii) a second distance-change permitting device operable in response to a pivotal motion of the second X-axis slide, to permit a change of a distance between two positions at which the second X-axis slide is supported by the two second X-axis-slide pivotally supporting devices.

The above mode (26) relates to a specific mechanism which permits inclination of the first and second X-axis slides of the XY-slide-assembly type moving devices, each of which is supported at its opposite end portions. To permit inclination of each X-axis slide which is supported at its opposite end portions, these opposite end portions must be flexibly supported by suitable supporting devices. It is also noted that a distance between the two supporting devices in the longitudinal direction of the X-axis slide changes when the X-axis slide is inclined. In view of these facts, the X-axis-slide moving device includes two X-axis-slide pivotally supporting devices for pivotally supporting the X-axis slide at its opposite end portions, and a distance-change permitting device which permits a change of the distance between the two positions at which the X-axis slide is supported at the opposite end portions by the respective two pivotally supporting devices, more precisely, the distance between two pivot positions about which the X-axis slide is pivotable at its opposite end portions.

The distance-change permitting device for each of the two X-axis slides may be a X-axis-slide telescopic-movement permitting device, which permits a change in the length of an intermediate portion of the X-axis slide located between the two end portions at which the X-axis slide is pivotally supported by the two X-axis-slide pivotally supporting devices. A change in the length of the intermediate portion of the X-axis slide results in a change of the distance between the two positions at which the X-axis slide is pivotally supported by the pivotally supporting devices. Another form of the distance-change permitting device is an X-axis-slide relative-movement permitting device which permits a relative movement between one of the two X-axis-slide pivotally supporting devices and the X-axis slide, in the Y-axis direction in which the X-axis slide extends. For example, the X-axis-slide relative-movement permitting device is arranged to permit a relative sliding movement between the above-indicated one X-axis-slide pivotally supporting device and the X-axis slide, at the corresponding end portion of the X-axis slide, so that the pivot position about which the end portion of the X-axis side is pivoted is shifted in the longitudinal direction of the X-axis slide (Y-axis direction), to change the distance between the two positions at which the X-axis slide is pivotally supported. By using these forms of the distance-change permitting device, the X-axis slides are inclinable, that is, pivotable in the plane parallel to the reference plane, in the mounting system according to the above mode (26), so that the plurality of electric components can be mounted substantially simultaneously at the desired component-mounting spots on the circuit substrate, by using the plurality of mounting units provided on each X-axis slide, even where the X-axis slide is supported at its opposite end portions.

(27) An electric-component mounting system according to the above mode (25) or (26), further comprising an angular-component-position adjusting device operable to adjust an angular position of the electric component as held by each mounting head of each of the first and second mounting units, for compensation for an angle of inclination of the corresponding one of the first and second X-axis slides in said plane.

An inclination of the X-axis slide results in a change in the angular position of the mounting unit mounted on the X-axis slide, and a change in the angular position of the electric component as held by the mounting head of the mounting unit. The angular position is a position about an axis perpendicular to the plane of inclination of the X-axis slide. Accordingly, the inclination of the X-axis slide results in a change of the actual angular position of the electric component as mounted on the circuit substrate, with respect to the nominal angular position. Therefore, the electric-component mounting system according to the above mode (27) comprising the angular-component-position adjusting device permits simultaneous mounting of the two or more electric components at the nominal angular positions, even when the electric components are mounted with inclination of the X-axis slide. The present system is effective where the electric components must be mounted at the predetermined angular position.

(28) An electric-component mounting system according to the above mode (27), wherein the angular-component-position adjusting device includes a head rotating device operable to rotate the mounting head holding the electric component, to adjust the angular position of the electric component, when the above-indicated corresponding X-axis slide is inclined.

The angular-component-position adjusting device may be available in various forms, such as the head rotating device operable to rotate the mounting head by an angle corresponding to the angle of inclination of the X-axis slide, as in the above mode (28), and a component rotating device operable to rotate the electric component in the component-supplying area, before the electric component is held by the mounting head. The use of the head rotating device as the angular-component-position adjusting device is advantageous in that this head rotating device can be used to eliminate an angular positioning error of the electric component that may take place upon holding of the electric component by the mounting head, and a positioning error of the electric component due to compensation for a positioning error of the circuit substrate. In other words, a compensating device as described below with respect to the following mode (30), which is provided to eliminate such positioning errors, can be utilized as the head rotating device to adjust the angular position of the electric component for compensation for the inclination of the X-axis slide. Accordingly, the mounting system according to the above mode (28) can be simplified in construction.

(29) An electric-component mounting system according to any of the above modes (1)–(28), wherein each of at least one of the first and second mounting units has a plurality of mounting heads.

The number of the mounting heads provided on each mounting unit is not limited. Each mounting unit may be provided with only one mounting head, or a plurality of mounting heads as in the above mode (29). In the present mode (29), the mounting unit having the two or more mounting heads is capable of receiving a plurality of electric components, and mounting these electric components at one time or one after another, so that the component-mounting efficiency is improved.

The manner in which the plurality of mounting heads are provided on one mounting unit is not limited. For instance, the mounting head are disposed on the mounting unit, so as to extend in the direction perpendicular to the reference plane (component-mounting surface of the circuit substrate), such that the mounting heads are arranged in one straight line, or in two or more straight lines. In this case, the plurality of mounting heads on one mounting unit can receive the electric components from a component-supplying device in the component-supplying area, for example, where the component-supplying device has a plurality of component feeders whose component-supply portions are arranged along a straight line and are spaced apart from each other by a distance equal to a spacing pitch of the mounting heads of the mounting unit.

Alternatively, the plurality of mounting heads are disposed on the mounting unit, so as to extend in the direction perpendicular to the reference plane, such that the mounting heads are equiangularly arranged along a circle. In this case, the mounting unit is preferably a rotary mounting unit rotatable about its axis which lies on the center of the above-indicated circle. This arrangement is advantageous particularly where one X-axis slide has two mounting units. Namely, the provision of the two rotary mounting units each having a circular array of mounting heads has a comparatively small limitation regarding the component-mounting spots on the circuit substrate at which the electric components are mounted at one time, by the respective mounting heads, where the distances between the component-mounting spots are relatively small. Where the positions of the mounting heads of the two mounting units within the mounting unit are fixed, and where one of the mounting heads of one of the two mounting units and one of the mounting heads of the other mounting unit are used to mount the electric components at one time, the possible combinations of the two mounting heads of the two mounting units are limited in order to prevent an interference between the two mounting heads, that is, some combinations of the two mounting heads cause an interference if the distance between the corresponding two component-mounting spots is relatively short. Where the two rotary mounting units are used, however, any combination of the two mounting heads of the respective two mounting units is possible, since those to mounting heads can be moved toward each other by rotary motions of the two rotary mounting units, to respective two positions a distance between which is considerably small and at which there does not exist an interference of the two mounting units. Thus, the use of the two rotary mounting units on one X-axis slide permits a high degree of freedom in the component-mounting spots at which the electric components are mounted at one time by the two mounting units.

The rotary mounting unit on which the plurality of mounting heads are arranged equiangularly in the direction of rotation about its axis may be used as an indexing type mounting unit, which is operated at a predetermined position in the reference plane, such that the mounting heads are turned about the axis of rotation of the mounting unit, so as to be successively stopped at the component-receiving position to receive the electric components, and at the component-mounting position to mount the electric components. Other forms of the indexing type mounting unit include; a rotary mounting unit which is rotatable about an axis parallel to the reference plane and which carries the mounting heads such that the mounting heads are equiangularly arranged in the direction of rotation about its axis; and a conical type mounting unit having a conical surface on which the mounting heads are equiangularly arranged in its circumferential direction, and an axis of rotation which is inclined such that the axes of the mounting heads are sequentially made perpendicular to the reference plane one after another, at a predetermined position in the reference plane, as the mounting unit is rotated about its inclined axis. Where the mounting system uses the indexing type mounting unit which is operated at the predetermined position to receive and mount the electric components, the movement of this mounting unit in the reference plane can be relatively easily controlled. However, the position of the circuit substrate must be controlled.

(30) An electric-component mounting system according to any one of the above modes (1)–(29), further comprising;

a component-recognition device disposed between the component-supplying and component-mounting areas and operable to recognize the electric component;

a component-positioning-error obtaining device operable on the basis of an output of the component-recognition device, to obtain an amount of positioning error of the electric component as held by the mounting head; and a head-position compensating device operable on the basis of the amount of positioning error of the electric component obtained by the component-positioning-error obtaining device, to compensate the position of the mounting head.

When the mounting head receives the electric component in the component-supplying area, the electric component may suffer from center position errors with respect to the axis of the mounting head as viewed in the reference plane, and may also suffer from an angular positioning error about the axis of the mounting head. These center position errors and the angular positioning errors of the electric component as held by the mounting head cause a positioning error of the electric component as mounted on the circuit substrate, and are desirably eliminated before or when the electric component is mounted. The electric-component mounting system according to the above mode (30) assures accurate positioning of the electric component as mounted on the circuit substrate, with a reduced amount of deviation of the electric component from the nominal position.

The component-recognition device for recognizing the electric component as held by the mounting head may be an imaging device such as a CCD camera and a line scanner, or a position recognition device such as a ultrasonic sensor. The component-positioning-error obtaining device may include an image data processing device or a position-data processing device, which uses a computer. Where the component-recognition device is disposed between the component-supplying and component-mounting areas, the positioning error of the electric component can be detected during a movement of the mounting head from the component-supplying area to the component-mounting area. Where the center position errors of the electric component are eliminated by controlling the mounting-unit moving device, this mounting-unit moving device and a control device provided to control the mounting-unit moving device cooperate to function as the head-position compensating device. Where the angular positioning error of the electric component is eliminated by rotating the mounting head, the head-position compensating device is provided by a head rotating device provided on the mounting unit to rotate the mounting head, and a control device provided to control the head rotating device.

(31) A process of fabricating a printed-circuit board, comprising a component-mounting step of operating mounting heads to receive electric components supplied in a component-supplying area, and to mount the electric components onto a circuit substrate as held by a substrate-holding device in a component-mounting area, and a soldering step of effecting a soldering operation on the circuit substrate on which the electric components have been mounted, wherein the component-mounting step comprises moving a first mounting unit and a second mounting unit each of which has at least one mounting head, such that the first and second mounting units are moved past each other, between the component-supplying and component-mounting areas in opposite directions, along respective two paths, without an interference between the first and second mounting units.

In the printed-circuit-board fabricating process according to the above mode (31) of the present invention, the electric components are mounted on the circuit substrate by a plurality of mounting units each provided with at least one mounting head arranged to hold and mount the electric component. Described more specifically, the electric components are mounted on the circuit substrate by movements of the first and second mounting units between the component-supplying and component-mounting areas, without an interference between these first and second mounting units. The present process permits efficient fabrication of the printed-circuit boards, with reduced restrictions in the control of the movements of the mounting units. It will be understood that the technical features described above with respect the electric-component mounting systems according to the above modes (1)–(30) are available for the component-mounting step of the component fabricating process according to the above mode (31).

(32) An electric-component mounting system comprising:

a substrate-holding device operable to hold at least one circuit substrate on which electric components are to be mounted;

an XY slide assembly including (a) an X-axis slide disposed movably in a first direction parallel to a predetermined reference plane parallel to a component-mounting surface of each of the at least one circuit substrate, the X-axis slide extending in a second direction which is parallel to the reference plane and which intersects the first direction, (b) an X-axis-slide moving device operable to move the X-axis slide in the first direction, such that the X-axis slide is inclinable in a plane parallel to the predetermined reference plane, with respect to a straight line perpendicular to the first direction, (c) a plurality of Y-axis slides disposed movably on the X-axis slide in the second direction, and (d) a Y-axis-slide moving device operable to move the plurality of Y-axis slides independently of each other on the X-axis slide in the second direction; and a plurality of mounting units which are respectively provided on said plurality of Y-axis slides and each of which has at least one mounting head each operable to receive a selected one of the electric components while each mounting unit is located in a component-supplying area in which the electric components are supplied, each mounting head being further operable to mount the electric component onto the at least one circuit substrate held by the substrate-holding device in a component-mounting area.

Where the X-axis slide of the XY slide assembly is merely translated in the first direction, the two or more mounting units carried by the Y-axis slides mounted on the X-axis slide movably in the longitudinal direction of the X-axis slide are arranged in the longitudinal direction of the X-axis slide, that is, in the second direction. For the mounting heads on the two or more mounting units on the X-axis slide to mount the respective electric components on the circuit substrate at the same time, the component-mounting spots on the circuit substrate at which the electric components are mounted simultaneously must be arranged in a straight line parallel to the longitudinal direction of the X-axis slide. Accordingly, the number of the component-mounting spots at which the electric components can be simultaneously mounted by the mounting units on the X-axis slide described above is limited, since only a small number of the electric components lie on a straight line parallel to the X-axis slide, that is, parallel to the second direction. In the above mode (32), however, the X-axis slide is inclinable in a plane parallel to the component-mounting surface of the circuit substrate, with respect to a straight line perpendicular to the first direction, as well as movable in the above-indicated plane, so that the number of the component-mounting spots at which the electric components can be mounted simultaneously by the mounting units on the X-axis slide can be increased. Where the X-axis slide carries two mounting units, these mounting units can be moved to desired two positions, respectively, as long as those two positions are not located within an area in which the two mounting units interfere with each other. Accordingly, the two mounting units can be used to mount the plurality of electric components at the same time at the desired respective component-mounting spots on the circuit substrate, so that the component-mounting efficiency can be significantly improved in the mounting system according to the above mode (32).

The descriptions of the terms "printed-circuit board", "electric components", "substrate-holding device", "mounting head", "component-supplying area", and "component-mounting area", which have been provided with respect to the mode (1) of the present invention are applicable to the mode (32) described above.

(33) An electric-component mounting system according to the above mode (32), wherein the component-supplying area is provided on at least one of opposite sides of the component-mounting area.

(34) An electric-component mounting system according to the above mode (33), wherein the component-supplying area is provided on only one of opposite sides of the component-mounting area.

The electric-component mounting system according to the above two modes (33) and (34) employ different numbers of the component-supplying areas, and different relationships between the component-supplying and component-mounting areas. The number of the component-supplying areas that are provided in the present system is not limited. For instance, four component-supplying areas are provided on respective four sides of the component-mounting area. Usually, the present system constitutes a part of a production line. In this case, it is desirable not to provide two component-supplying areas on the respective opposite sides of the substrate-holding device as viewed in a direction of loading and unloading of the circuit substrates, which is perpendicular to the direction of movement of the X-axis slide (namely, the above-indicated first direction). In this respect, it is preferable to provide one component-supplying area or two component-supplying areas on one of opposite sides or respective opposite sides of the component-mounting area as viewed in the direction of movement of the X-axis slide by the X-axis-slide mounting device, as in the above mode (33) or (34).

Wherein the two component-supplying areas are provided on the respective opposite sides of the component-mounting area, as in the above mode (33), a comparatively large number of component-supplying devices may be disposed in the two component-supplying areas, so that a comparatively large number of different kinds of electric components may be supplied. Further, a component-supplying device of feeder type is disposed in one of the two component-supplying areas, while a component-supplying device of tray type is disposed in the other component-supplying area. The provision of these two component-supplying devices of different types improves the versatility of the electric-component mounting system. Further, the provision of the two component-supplying areas on the opposite sides of the component-mounting area is effective to improve the versatility in the component-mounting operation, particularly where the electric-component mounting system includes two XY slide assemblies which carry respective first and second mounting units as described below in detail, so that one of the first and second mounting units is assigned to receive the electric components primarily from the component-supplying device or devices in one of the two component-supplying areas, while the other mounting unit is assigned to receive the electric components primarily from the component-supplying device or devices in the other component-supplying area. In the electric-component mounting system according to the above mode (34) wherein only one component-supplying area is provided on one of the opposite sides of the component-mounting area, on the other hand, the required space for the system can be reduced. In this case, the component-supplying devices are desirably small-sized.

(35) An electric-component mounting system according to any one of the above mode (33) or (34), wherein the substrate-holding device is operable to hold at least two circuit substrates such that the at least two circuit substrates are arranged in a direction in which the component-supplying and component-mounting areas are spaced from each other.

In the electric-component mounting system according to the above mode (35), the substrate-holding device has at least two stations for holding the respective circuit substrates. Where the present system is a part of a printed-circuit-board fabricating line, for instance, one of the two circuit substrates, for example, is placed in a standby state while the component mounting operations are performed on the other circuit substrate, so that the non-productive time can be reduced. Where the electric-component mounting system includes two XY slide assemblies which carry respective first and second mounting units, as described below in detail, the circuit substrate in the standby state may be subjected to preparatory operations such as an operation to detect its positioning error. Alternatively, the component mounting operations may be performed concurrently on the two circuit substrates. In this case, the system may be readily operated such that the first and second mounting units are assigned to mount the electric components on the respective two circuit substrates. The present system which is operable in a selected one of different operating modes has high degrees of operating flexibility, versatility and efficiency.

(36) An electric-component mounting system according to any one of the above modes (33)–(35), wherein the first direction in which the X-axis slide is moved is substantially parallel to a direction in which the component-supplying and component-mounting areas are spaced from each other.

In the above mode (36), the X-axis slide is moved between the component-supplying and component-mounting areas, so that all of the mounting units provided on the X-axis slide can be located in the component-supplying area to receive the electric components, and can be located in the component-mounting area to mount the electric components on the at least one circuit substrate. This arrangement assures improved stability in simultaneous holding and mounting of the two or more electric components.

(37) An electric-component mounting system according to any one of the above modes (32)–(36), wherein the XY slide assembly includes;

two X-axis guide rails extending in the first direction;

two X-axis-slide pivotally supporting devices which respectively support the X-axis slide at respective opposite end portions thereof such that the X-axis slide is pivotable at its opposite end portions, the two X-axis-slide pivotally supporting devices being movable on the two X-axis guide rails, respectively; and a distance-change permitting device operable in response to a pivotal motion of the X-axis slide, to permit a change of a distance between two positions at which the X-axis slide is supported by the two X-axis-slide pivotally supporting devices, In the electric-component mounting system according to the above mode (32), the specific arrangement of the XY slide assembly is not particularly limited. For example, the X-axis slide may be supported at its one end portion by a single X-axis-slide supporting device, which is movable on a single X-axis guide rail, to move the X-axis slide. The XY slide assembly wherein the X-axis slide is supported at its one end portion is so-called "cantilever type". This XY slide assembly of cantilever type is relatively simple in construction, and requires a relatively small installation space. In the above mode (37), X-axis slide is supported at its opposite end portion by respective two X-axis-slide supporting devices, which are movable on the respective two X-axis guide rails, to move the X-axis slide. The XY-slide assembly according to the mode (37) assure a comparatively high degree of positioning accuracy of the mounting units, and accordingly permit a comparatively high degree of positioning accuracy of the electric components as mounted on the circuit substrate. The two different arrangements of the XY slide assembly wherein the X-axis slide is supported at its one end portion and at its opposite end portions, respectively, are selectively used depending upon the specifications of the electric-component mounting system.

The electric-component mounting system according to the above mode (37) wherein the X-axis slide is supported at its opposite end portions is provided with means for permitting the X-axis slide to be inclined in the plane parallel to the reference plane. To permit inclination of the X-axis slide which is supported at its opposite end portions, these opposite end portions must be flexibly supported by suitable supporting devices. It is also noted that a distance between the two supporting devices in the longitudinal direction of the X-axis slide changes when the X-axis slide is inclined. In view of these facts, each of the two X-axis-slide moving devices includes two X-axis-slide pivotally supporting devices for pivotally supporting the X-axis slide at its opposite end portions, and a distance-change permitting device which permits a change of the distance between the two positions at which the X-axis slide is supported at the opposite end portions by the respective two pivotally supporting devices, more precisely, the distance between two pivot positions about which the X-axis slide is pivotable at its opposite end portions. The provision of the X-axis-slide pivotally supporting devices and the distance-change permitting device permits the X-axis slide to be inclined, enabling the plurality of mounting units provided on the X-axis slide to mount the electric components at the desired component-mounting spots on the circuit substrate, although the X-axis slide is supported at its opposite end portions.

(38) An electric component mounting system according to the above mode (37), wherein the distance-change permitting device includes an X-axis-slide telescopic-movement permitting device which permits a change in a length of an intermediate portion of the X-axis slide located between the opposite end portions at which the X-axis slide is pivotally supported by said the X-axis-slide pivotally supporting devices.

(39) An electric-component mounting system according to the above mode (37), wherein the distance-change permitting device includes an X-axis-slide relative-movement permitting device which permits a relative movement between one of the two X-axis-slide pivotally supporting devices and the X-axis slide in the second direction in which the X-axis slide extends.

The above two modes (38) and (39) relate to two specific arrangements of the distance-change permitting device. The X-axis-slide telescopic-movement permitting device according to the above mode (38) permits a change in the length of the intermediate portion of the X-axis slide between the opposite end portions at which the x-axis slide is pivotally supported. A change in the length of the intermediate portion results in a change of the distance between the two positions at which the X-axis slide is pivotally supported by the two X-axis-slide pivotally supporting devices. The X-axis-slide relative-movement permitting device according to the above mode (39) may be arranged to permit a relative sliding movement between the above-indicated one X-axis-slide pivotally supporting device and the X-axis slide, at the corresponding end portion of the X-axis slide, so that the pivot position about which the end portion of the X-axis slide is pivoted is shifted in the longitudinal direction of the X-axis slide, to change the distance between the two positions at which the X-axis slide is pivotally supported.

(40) An electric-component mounting system according to any one of the above modes (32)–(39), further comprising an angular-component-position adjusting device operable to adjust an angular position of the electric component as held by each mounting head of each of the plurality of mounting units, for compensation for an angle of inclination of the XY slide assembly in the above-indicated plane parallel to the reference plane.

An inclination of the X-axis slide results in a change in the angular position of the mounting unit mounted on the X-axis slide, and a change in the angular position of the electric component as held by the mounting head of the mounting unit. The angular position is a position about an axis perpendicular to the plane of inclination of the X-axis slide. Accordingly, the inclination of the X-axis slide results in a change of the actual angular position of the electric component as mounted on the circuit substrate, with respect to the nominal angular position. Therefore, the electric-component mounting system according to the above mode (40) comprising the angular-component-position adjusting device permits simultaneous mounting of the two or more electric components at the nominal angular positions, even when the electric components are mounted with inclination of the X-axis slide. The present system is effective where the electric components must be mounted at the predetermined angular position.

(41) An electric-component mounting system according to the above mode (40), wherein the angular-component-position adjusting device includes a head rotating device operable to rotate the mounting head holding the electric component, to adjust the angular position of the electric component, when the X-axis slide is inclined.

The angular-component-position adjusting device may be available in various forms, such as the head rotating device operable to rotate the mounting head by an angle corresponding to the angle of inclination of the X-axis slide, as in the above mode (41), and a component rotating device operable to rotate the electric component in the component-supplying area, before the electric component is held by the mounting head. The use of the head rotating device as the angular-component-position adjusting device is advantageous in that this head rotating device can be used to eliminate an angular positioning error of the electric component that may take place upon holding of the electric component by the mounting head, and a positioning error of the electric component due to compensation for a positioning error of the circuit substrate. In other words, a compensating device which is provided to eliminate such positioning errors, can be utilized as the head rotating device to adjust the angular position of the electric component for compensation for the inclination of the X-axis slide. Accordingly, the mounting system according to the above mode (41) can be simplified in construction.

(42) An electric-component mounting system according to any one of the above modes (32)–(41), wherein each of the plurality of mounting units has a plurality of mounting heads.

The number of the mounting heads provided on each mounting unit is not limited. Each mounting unit may be provided with only one mounting head, or a plurality of mounting heads as in the above mode (42). In the present mode (42), the mounting unit having the two or more mounting heads is capable of receiving a plurality of electric components, and mounting these electric components at one time or one after another, so that the component-mounting efficiency is improved. In the electric-component mounting system according to the above mode (32), each of the mounting units need not have a plurality of mounting heads, but each of selected ones of the mounting units may have a plurality of mounting heads.

The manner in which the plurality of mounting heads are provided on one mounting unit is not limited. For instance, the mounting head are disposed on the mounting unit, so as to extend in the direction perpendicular to the reference plane (component-mounting surface of the circuit substrate), such that the mounting heads are arranged in one straight line, or in two or more straight lines. In this case, the plurality of mounting heads on one mounting unit can receive the electric components from a component-supplying device in the component-supplying area, for example, where the component-supplying device has a plurality of component feeders whose component-supply portions are arranged along a straight line and are spaced apart from each other by a distance equal to a spacing pitch of the mounting heads of the mounting unit.

Alternatively, the plurality of mounting heads are disposed on the mounting unit, so as to extend in the direction perpendicular to the reference plane, such that the mounting heads are equiangularly arranged along a circle. In this case, the mounting unit is preferably a rotary mounting unit rotatable about its axis which lies on the center of the above-indicated circle. This arrangement is advantageous particularly where one X-axis slide has two mounting units. Namely, the provision of the two rotary mounting units each having a circular array of mounting heads has a comparatively small limitation regarding the component-mounting spots on the circuit substrate at which the electric components are mounted at one time, by the respective mounting heads, where the distances between the component-mounting spots are relatively small. Where the positions of the mounting heads of the two mounting units within the mounting unit are fixed, and where one of the mounting heads of one of the two mounting units and one of the mounting heads of the other mounting unit are used to mount the electric components at one time, the possible combinations of the two mounting heads of the two mounting units are limited in order to prevent an interference between the two mounting heads, that is, some combinations of the two mounting heads cause an interference if the distance between the corresponding two component-mounting spots is relatively short. Where the two rotary mounting units are used, however, any combination of the two mounting heads of the respective two mounting units is possible, since those to mounting heads can be moved toward each other by rotary motions of the two rotary mounting units, to respective two positions a distance between which is considerably small and at which there does not exist an interference of the two mounting units. Thus, the use of the two rotary mounting units on one X-axis slide permits a high degree of freedom in the component-mounting spots at which the electric components are mounted at one time by the two mounting units.

The rotary mounting unit on which the plurality of mounting heads are arranged equiangularly in the direction of rotation about its axis may be used as an indexing type mounting unit, which is operated at a predetermined position in the reference plane, such that the mounting heads are turned about the axis of rotation of the mounting unit, so as to be successively stopped at the component-receiving position to receive the electric components, and at the component-mounting position to mount the electric components. Other forms of the indexing type mounting unit include; a rotary mounting unit which is rotatable about an axis parallel to the reference plane and which carries the mounting heads such that the mounting heads are equiangularly arranged in the direction of rotation about its axis; and a conical type mounting unit having a conical surface on which the mounting heads are equiangularly arranged in its circumferential direction, and an axis of rotation which is inclined such that the axes of the mounting heads are sequentially made perpendicular to the reference plane one after another, at a predetermined position in the reference plane, as the mounting unit is rotated about its inclined axis. Where the mounting system uses the indexing type mounting unit which is operated at the predetermined position to receive and mount the electric components, the movement of this mounting unit in the reference plane can be relatively easily controlled. However, the position of the circuit substrate must be controlled.

(43) An electric-component mounting system according to any one of the above modes (32)–(42), further comprising a simultaneous-component-mounting control device operable to control the XY slide assembly such that a selected one of the at least one mounting head of one of the plurality of mounting units and a selected one of the at least one mounting head of another of the plurality of mounting units are positioned to mount the respective two electric components substantially simultaneously at respective two predetermined component-mounting spots on one of the at least one circuit substrate.

In the electric-component mounting system according to the above mode (43) including the simultaneous-component-mounting control device, the selected two electric components can be simultaneously mounted at the respective two component-mounting spots, with high stability and efficiency. Where a control device incorporating a computer is used for the electric-component mounting system, this control device may function as the simultaneous-component-mounting control device for controlling the XY slide assembly. Even when the simultaneous-component-mounting control device is not operated to effect the simultaneous mounting of the electric components, the movements of the mounting units can be effected with relatively high efficiency owing to the arrangement of the XY slide assembly, leading to significant reduction of the non-productive time of the system.

(44) An electric-component mounting system according to any one of the above modes (32)–(43), comprising two XY slide assemblies each including the X-axis slide, the X-axis-slide moving device, the plurality of Y-axis slides and the Y-axis-slide moving device, which have been described with respect to the above mode (32), and wherein the two XY slide assemblies are disposed such that the plurality of mounting units disposed on the respective Y-axis slide of one of the two XY slide assemblies and the plurality of mounting units disposed on the Y-axis slide of the other of the two XY slide assemblies are movable past each other, between the component-supplying and the component-mounting areas in opposite directions, along respective two planes which are spaced from the reference plane by respective different distances, so as to prevent an interference between the mounting units of the above indicated one XY slide assembly and the mounting units of the other XY slide assembly.

In the electric-component mounting system according to the above mode (44), the two XY slide assemblies may be arranged such that these two XY slide assemblies are located at respective two positions in the direction perpendicular to the reference plane, while the two XY slide assemblies are moved between the component-supplying and component-mounting areas. Namely, the two XY slide assemblies are movable along the respective two planes which are spaced from the reference plane by the respective different distances, so as to prevent an interference between the mounting units of one of the two XY slide assemblies and the mounting units of the other XY slide assembly, during the movements of the XY slide assemblies between the component-supplying and component-mounting areas. The number of the mounting units that can be provided in the present electric-component mounting system is about two times that in an electric-component mounting system provided with only one XY slide assembly. Yet, the two XY slide assemblies can be moved without an interference therebetween, so that the component-mounting efficiency can be considerably increased. For example, the mounting units provided on one of the two XY slide assemblies are operated to receive the electric component in the component-supplying area, while the mounting units provided on the other XY slide assembly are operated to mount the electric components on the circuit substrate in the component-supplying area. Then, the mounting units on the above-indicated other XY slide assembly are moved to the component-supplying area to receive the electric components, while the mounting units on the above-indicated one XY slide assembly are moved to the component-mounting area to mount the electric components. These operations are repeatedly performed by the mounting units of the two XY slide assemblies. It is noted that the principle of the present invention according to the above mode (32) requires at least one of the two X-axis slides of the two XY slide assemblies to be inclinable in the plane parallel to the reference plane. Further, three or more XY slide assemblies may be provided in the mounting system according to the above mode (32), such that the mounting units of the three XY slide assemblies are movable along respective three planes which are spaced from the reference plane by respective three distances.

(45) An electric-component mounting system according to the above mode (44), wherein the X-axis slides of the two XY slide assemblies are moved in respective first and second X-axis directions which are substantially parallel to each other.

The above mode (45) relates to the direction in which the two X-axis slides of the two XY slide assemblies are moved. Namely, the two XY slide assemblies are disposed such that the respective X-axis slides are moved in substantially the same direction. This arrangement facilitates the overall control of the mounting system. Where the X-axis slides are moved in the direction in which the component-supplying and component-mounting areas are spaced from each other, it is possible that the mounting units on one of the two X-axis slides are operated to receive the electric components while the mounting units on the other X-axis slide are operated to mount the electric components, so that the component-receiving and component-mounting operations are alternately and repeatedly performed by the mounting units of the two XY slide assemblies.

(46) An electric-component mounting system according to the above mode (44) or (45), further comprising a distance-difference eliminating device operable to eliminate a difference between the distances of the mounting units of the two XY slide assemblies to the predetermined reference plane, in at least one of a component-receiving operation in which the mounting units receive the electric components in the component-supplying area, and a component-mounting operation in which the mounting units mount the electric components on the at least one circuit substrate in the component-mounting area.

Where the mounting units of the two XY slide assemblies are moved along the respective different planes which are spaced from the reference plane by the respective different distances, the distances from the mounting units of one of the two XY slide assemblies to the component-supplying device and the component-mounting surface of the circuit substrate are different from the distances from the mounting units of the other XY slide assembly to the component-supplying device and the component-mounting surface of the circuit substrate, when the electric components are received and mounted by the mounting units. Accordingly, the mounting units of the two XY slide assemblies are required to be moved to and from the component-supplying device and the circuit substrate by the different distances. In other words, each mounting head provided on one of the mounting units of one of the two XY slide assemblies is required to be moved by longer distances to and from the component-supplying device and the component-mounting surface of the circuit substrate, to receive and mount the electric component. This requires different types of mounting heads to be provided on the mounting units of the two XY slide assemblies, and these different types of mounting heads must be controlled in respective different manners. In this respect, the system tends to be complicated in construction and control. In view of this drawback, the distance-difference eliminating device is provided in the system according to the above mode (46), to eliminate the difference between the distances of the mounting units of the two XY slide assemblies to the reference plane, so that the system is simplified in construction and control. The distance-difference eliminating device is preferably arranged to eliminate the above-indicated difference of the distances in both of the component-receiving and component-mounting operations in the component-supplying and component-mounting areas. This arrangement permits the first and second mounting units to have the same construction, and further improves the construction of the system as a whole.

(47) An electric-component mounting system according to the above mode (46), wherein the distance-difference eliminating device includes a distance-difference elimination moving device which is disposed between the mounting units of each of at least one of the two XY slide assemblies and the corresponding X-axis slide, and which is operable to move the mounting units of each of said at least one of the two XY slide assemblies, for eliminating the above-indicated difference between the distances of the mounting units of the two XY slide assemblies.

The specific arrangement of the distance-difference eliminating device is not particularly limited. The distance-difference-elimination moving device according to the above mode (47) is one of relatively simple arrangements of the distance-difference eliminating device. The distance-difference-elimination moving device need not be arranged to move the mounting units provided on both of the two XY slide assemblies, but may be arranged to move the mounting units provided on only one of the two XY slide assemblies. In the latter case, the mounting system can be accordingly simplified.

When the electric components are mounted on the circuit substrate, the above-indicated difference of the distances can be eliminated by moving the circuit substrate in the direction perpendicular to the reference plane, rather than by moving the mounting units. Namely, the distance-difference eliminating device may be a substrate moving device operable to move the circuit substrate in the direction substantially perpendicular to the reference plane, when the mounting units of at least one of the two XY slide assemblies are operated to mount the electric components. Where the circuit substrate is held by the substrate-holding device with its component-mounting surface facing upwards, the substrate moving device may be incorporated within the substrate-holding device, or may be arranged to move the substrate-holding device in the direction perpendicular to the reference plane.

(48) An electric-component mounting system according to the above mode (47), wherein the distance-difference-elimination moving device includes a mounting-unit translating device operable to translate the mounting units of each of at least one of the two XY slide assemblies in a direction substantially perpendicular to the predetermined reference plane.

(49) An electric-component mounting system according to the above mode (47), wherein the distance-difference-elimination moving device includes a mounting-unit pivotally moving device operable to pivot the mounting units of each of at least one of the two XY slide assemblies each about a pivot axis substantially parallel to the predetermined reference plane.

The distance-difference-elimination moving devices provided according to the above two modes (48) and (49) are typical examples according to the mode (47). Where the circuit substrate is held with its component-mounting surface facing upwards, the distance-difference-elimination moving device provided according to the above mode (48) may be operated such that the mounting units of one of the two XY slide assemblies located at a higher position than those of the other XY slide assembly are lowered to receive or mount the electric component. The mounting-unit pivotally moving device provided according to the above mode (49) may be operated such that the mounting units located at the higher position are held at an upper position during the movements of the two XY slide assemblies, so as to prevent an interference between the mounting units of the two XY slide assemblies, and such that when the mounting units are operated to receive and mount the electric component, the mounting units are pivoted to a lower position in which the mounting heads extend in the vertical direction (in the direction perpendicular to the reference plane). The distance-difference-elimination moving device may include both of the mounting-unit translating device according to the above mode (48) and the mounting-unit pivotally moving device according to the above mode (49).

(50) A process of fabricating a printed-circuit board, comprising a component-mounting step of mounting electric components on a circuit substrate, and a soldering step of effecting a soldering operation on the circuit substrate on which the electric components have been mounted, wherein an improvement comprises:

the component-mounting step comprising a simultaneous-component-mounting step of mounting a plurality of electric components substantially simultaneously, at respective selected component-mounting spots on the circuit substrate.

In the component-mounting step of the process according to the above mode (50) of this invention, the plurality of electric components can be substantially simultaneously mounted at the respective component-mounting spots on the circuit substrate, which spots are selected as desired. Accordingly, the present process assures a high degree of component-mounting efficiency and an accordingly high degree of printed-circuit-board fabricating efficiency. The present process may be practiced by the electric-component mounting system constructed according to the above mode (32). It is to be understood that the technical features of the above modes (32)–(49) are applicable to the present process of fabricating the printed-circuit board.

(51) A process according to the above mode (50), wherein the simultaneous-component-mounting step comprises:

mounting a first and a second electric component substantially simultaneously, at respective selected first and second component-mounting spots on the circuit substrates, which lie on a first straight line; and mounting a third and a fourth electric components substantially simultaneously, at respective selected third and fourth component-mounting spots on the circuit substrate, which lie on a second straight line which is not parallel to the first straight line.

The above mode (51) relates to one specific manner of mounting the electric components at the respective selected component-mounting spots on the circuit substrate. That is, the present process can be practiced by the electric-component mounting system according to the above mode (32) wherein the two mounting units, for example, are provided on the X-axis slide of the XY slide assembly, which X-axis slide is inclinable in the plane parallel to the reference plane parallel to the component-mounting surface of the circuit substrate. The two electric components held by the two mounting heads of the two mounting units can be mounted on the respective two desired component-mounting spots lying on a straight line, by moving the mounting units independently of each other on the X-axis slide which is inclined to be parallel to the straight line. By changing the angle of inclination of the X-axis slide, the angle of inclination of the straight line on which the two component-mounting spots lie can be changed as needed. Thus, the two electric components can be mounted simultaneously at any desired two component-mounting spots, by inclining the X-axis slide by a suitable angle. Accordingly, the present process permits fabrication of the printed-circuit board with improved efficiency.

BRIEF DESCRIPTION OF THE DRAWINGS

The above and other objects, features, advantages and technical and industrial significance of the present invention will be better understood by reading the following detailed description of preferred embodiments of the invention, when considered in connection with the accompanying drawings, in which.

DETAILED DESCRIPTION OF THE PREFERRED EMBODIMENTS

There will be described some preferred embodiments of the present invention, for illustrative purpose only, by reference to the accompanying drawings. It is to be understood that the present invention is by no means limited to the details of the following embodiments, but may be embodied with various changes, modifications and improvements, such as those described in the SUMMARY OF THE INVENTION, which may occur to those skilled in the art.

First Embodiment

Figure 1:
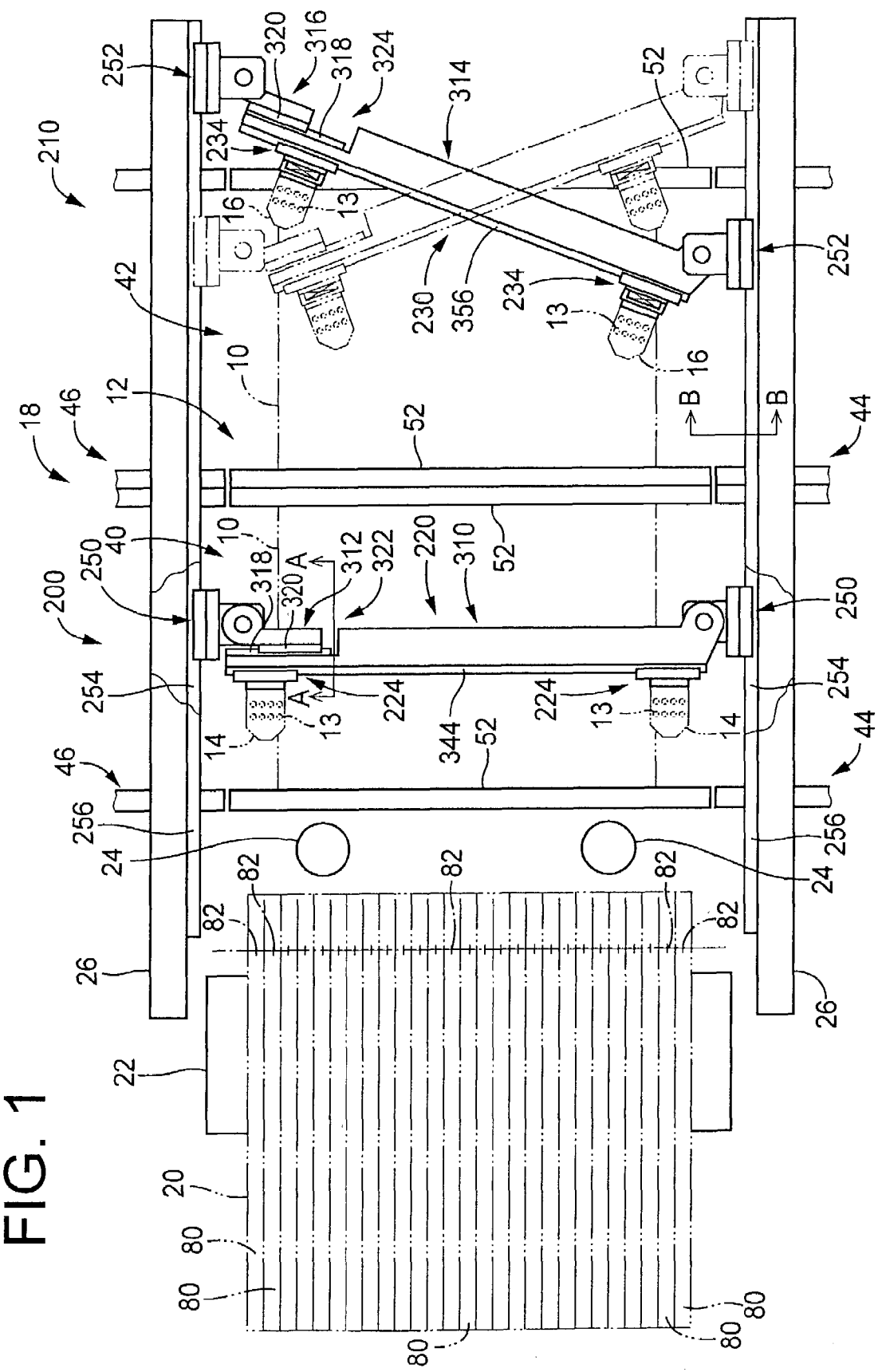
FIG. 1 is a schematic plan view showing a major part of an electric-component mounting system constructed according to a first embodiment of this invention.
Figure 2:
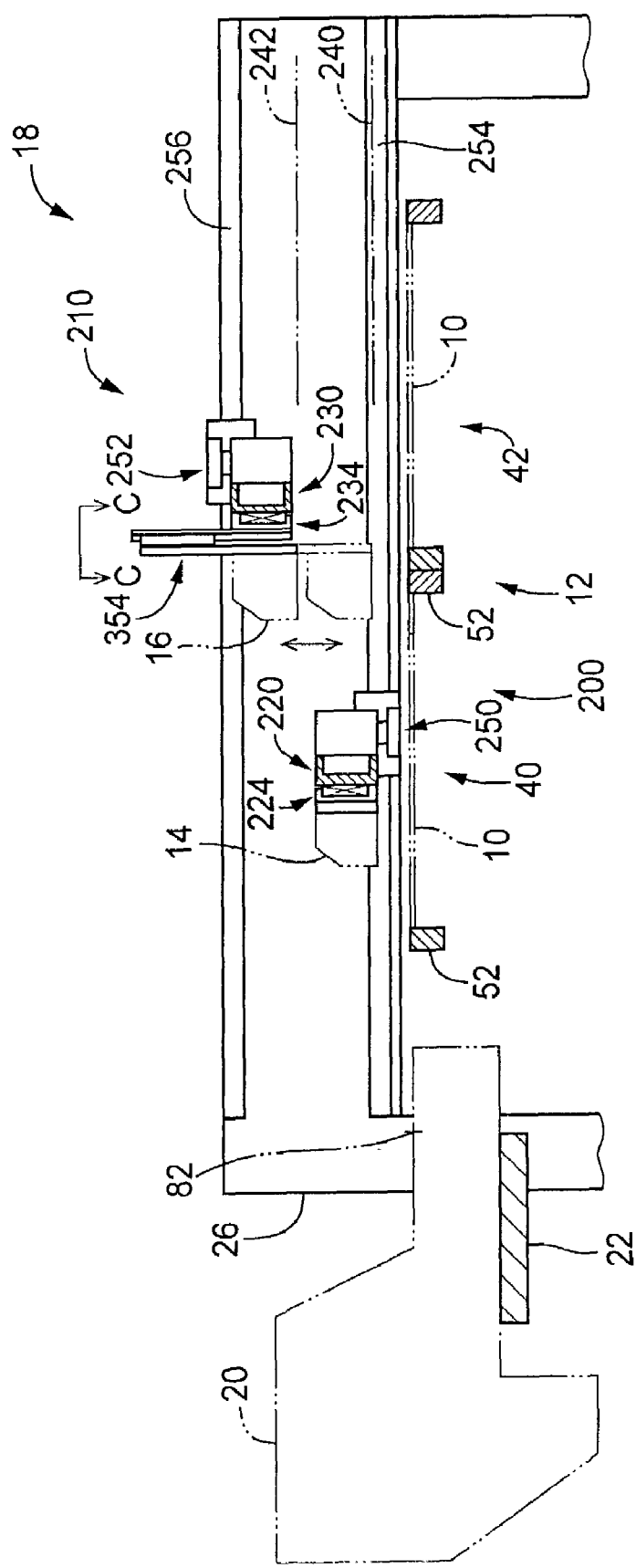
FIG. 2 is a front elevational view in cross section showing the major part of the electric-component mounting system of FIG. 1.
Figure 3:
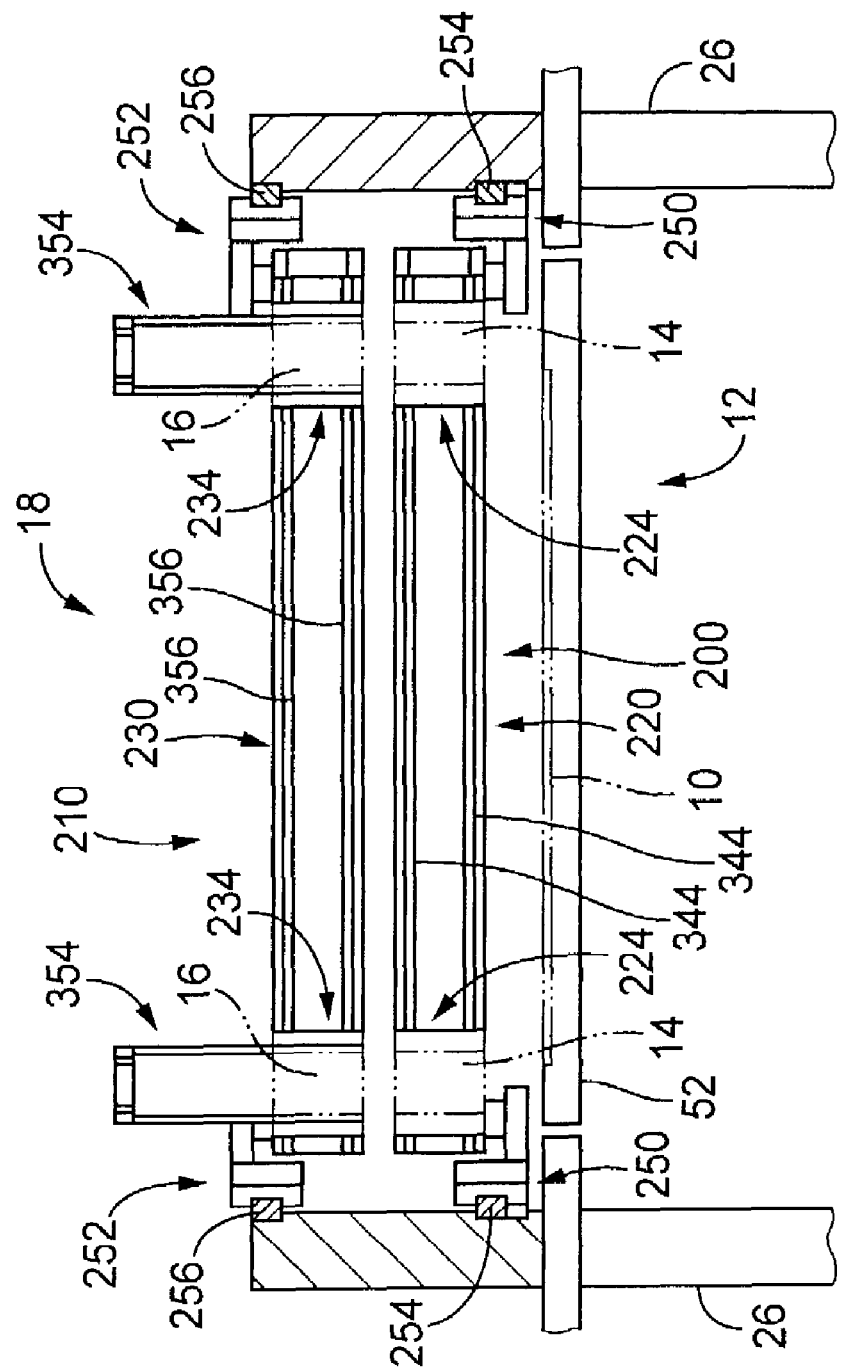
FIG. 3 is a left-hand side elevational view in cross section showing the major part of the electric-component mounting system of FIG. 1.

Referring first to the plan view of FIG. 1, the front elevational view in cross section of FIG. 2 and the left-side elevational view in cross section of FIG. 3, there is shown a major part of an electric-component mounting system constructed according to a first embodiment of this invention. The present electric-component mounting system includes, as major components thereof, a substrate-holding device 12 arranged to hold circuit substrates 10 on which electric components are to be mounted, two first mounting units 14, two second mounting units 16, and a mounting-unit moving device 18 including two XY slide assemblies. The two first mounting units 14 and the two second mounting units 16 are different from each other in construction. Each of the four mounting units 14, 16 is provided with mounting heads 13 each operable to receive the electric component and mount it on the circuit substrate 10. The electric-component mounting system further includes: a support table 22 serving to position and support a component-supplying device 20 which is operable to supply the electric components; a component-recognition device in the form of two component imaging devices 24 including CCD cameras arranged to recognize or detect the electric component as held by the mounting head 13, more specifically, to detect the hold-position or attitude of the electric component; a control device operable to control various operations of the present system; a frame 26 (only a portion of which is shown in the drawings) which serves as a machine base on which various devices are disposed; and various operator's control panels (not shown). Those components of the present system will be described one after another. In the following description, a plane parallel to the component-mounting surface of the circuit substrate 10 as held by the substrate-holding device 12 is referred to as a "reference plane", which is an XY plane defined by an X-axis direction parallel to the horizontal direction (right and left direction) as seen in FIG. 1, and a Y-axis direction which is perpendicular to the X-axis direction and parallel to the vertical direction as seen in FIG. 1. The direction perpendicular to the XY plane or the reference plane, that is, the direction perpendicular to the plane of FIG. 1 is referred to as a "Z-axis direction".

The substrate-holding device 12 is capable of holding a plurality of circuit substrates 10, for example, two circuit substrates 10 at one time, such that the circuit substrates 10 are arranged in the X-axis direction. The substrate-holding device 12 has two holding portions, namely, a first holding portion 40 for holding one of the two circuit substrates 10 which is located on the side of the component-supplying device 20, and a second holding portion 42 for holding the other circuit substrate 10 which is remote from the component-supplying device 20. The two holding portions 40, 42 are substantially identical in construction with each other, and each of these two holding portions 40, 42 is arranged to be connected to a substrate-loading device in the form of a loading conveyor 44 provided to load the circuit substrate 10 onto the present component-mounting system, and a substrate-unloading device in the form of an unloading conveyor 46 provided to unload the circuit substrate 10 from the system. Each of the first and second holding portions 40, 42 holds or supports the circuit substrate 10 such that the circuit substrate 10 is held parallel to the reference plane (XY plane or horizontal plane) while the component-mounting surface of the circuit substrate 10 faces upwards.

Figure 4:
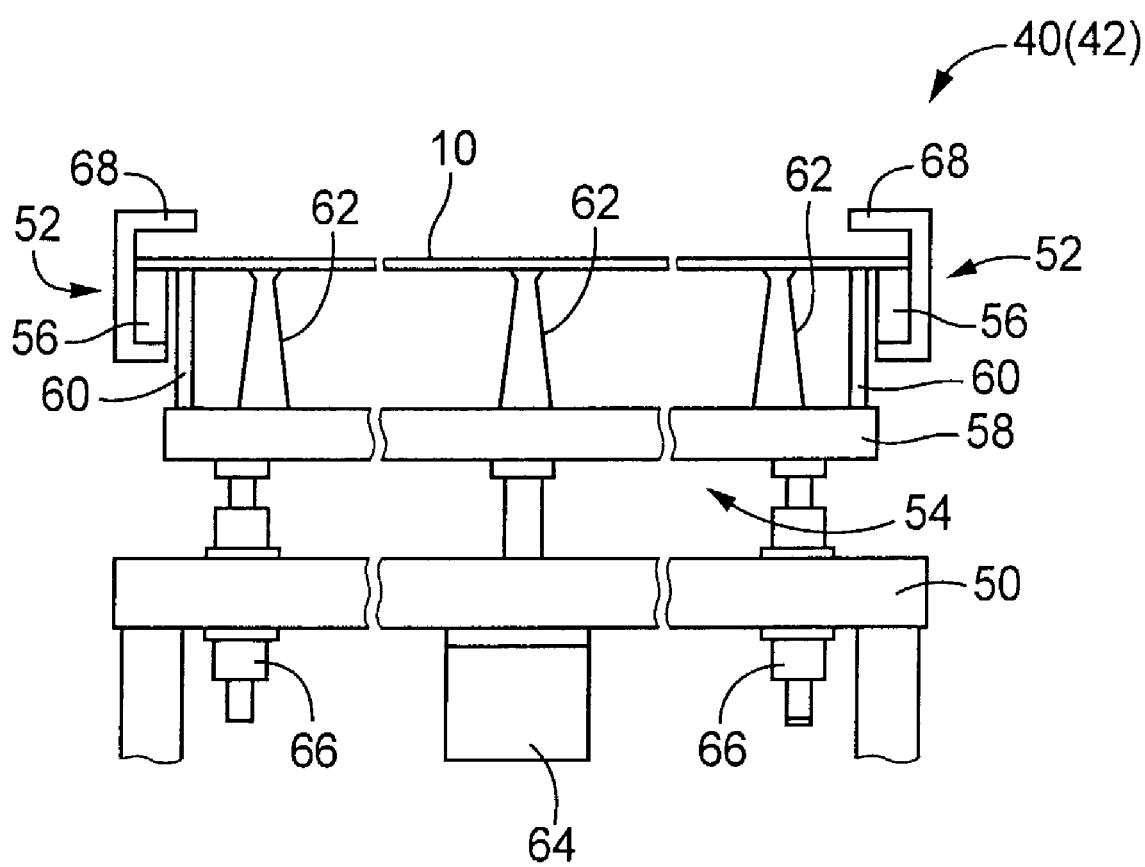
FIG. 4 is a front elevational view showing one of two holding portions of a substrate-holding device of the electric-component mounting system of FIG. 1.

The construction of each holding portion 40, 42 of the substrate-holding device 12 is shown in FIG. 4. The holding portion 40 (42) includes, as major components thereof, a base 50 fixed to the frame 26, a pair of substrate guide rails 52, and a vertically movable supporting device 54 which is arranged to be vertically movable and to hold the circuit substrate 10 at its lower surface. The substrate guide rails 52 are provided with respective endless conveyor belts 56, which are rotated by a belt drive device including a substrate feed drive motor as a drive source, so that the circuit substrate 10 is fed in a direction from the loading conveyor 44 toward the unloading conveyor 46. The vertically movable supporting device 54 includes: an elevator base 58; two retainer members 60 disposed at the opposite ends of the upper surface of the elevator base 58, so as to extend in the vertical direction; a pair of support members 62 disposed on the upper surface of the elevator base 58 and located between the two retainer members 60, for supporting the circuit substrate 10 at the corresponding positions on its lower surface opposite to the component-mounting surface; a fluid-operated actuator in the form of an air cylinder 64 fixed to the base 50 of the holding portion 40 (42) and operable to elevate and lower the elevator base 58; and vertical guides 66 for guiding the elevator base 58 in the vertical direction. The circuit substrate 10 fed by the conveyor belts 56 to the component-mounting position is supported by the vertically movable supporting device 54, at the support members 62, such that the circuit substrate 10 is held in its horizontal attitude. The circuit substrate 10 is elevated by the supporting device 54 so that the circuit substrate 10 is gripped at its opposite ends between the retainer members 60 and substrate retainer portions 68 that are upper portions of the substrate guide rails 52. Thus, the circuit substrate 10 is supported and positioned by each of the first and second holding portions 40, 42 of the substrate-holding device 12. A distance between the two substrate guide rails 52 is adjustable by a mechanism (not shown), according to the width of the circuit substrate 10. Further, a distance between the two retainer members 60 is also adjustable, and the positions of the support members 62 disposed on the elevator base 58 can be changed as needed.

The component-supplying device 20 used for the present electric-component mounting system is of tape feeder type, having a multiplicity of tape feeders 80 arranged in parallel with each other, as shown in FIG. 1. The tape feeders 80 accommodate respective successions of electric components of respective different kinds. Each tape feeder 80 includes a carrier tape which accommodates the electric components spaced apart from each other in its longitudinal direction and which is wound on a reel. The carrier tape of the tape feeder 80 is intermittently fed from a roll on the reel, to a predetermined component-supply position, for successively supplying the electric components one after another. A representative arrangement of the component-supplying device 20 of the tape feeder tape is disclosed in JP-A-10-112598. No further description of this component-supplying device 20 is deemed necessary to understand the principle of this invention. The support table 22 supporting the component-supplying device 20 is fixed on the frame 26, and is arranged such that the tape feeders 80 are removably mounted on the support table 22, at selected positions. In the present electric-component mounting system, the tape feeders 80 of the component-supplying device 20 are mounted on the support table 22 such that component-supply potions 82 of the tape feeders 80 are arranged along a straight line parallel to the Y-axis direction, as indicated in FIG. 1.

Each of the two first mounting units 14 and the two second mounting units 16 is provided with a plurality of mounting heads 13, which are operable to receive the electric components from the component-supplying device 20 and mount them on the circuit substrate 10. In the present electric-component mounting system, each mounting unit 14, 16 is provided with eight mounting heads 13 mounted thereon so as to extend in the Z-axis direction perpendicular to the reference plane or XY plane, and such that the four mounting heads 13 are arranged along a first straight line while the other four mounting heads 13 are arranged along a second straight line parallel to the first straight line, as indicated in FIG. 1. That is, the two arrays of mounting heads 13 are disposed in respective two straight rows. Since the first mounting units 14 and the second mounting units 16 have substantially the same construction, the construction of the first mounting units 14 will be described by way of example.

Figure 5:
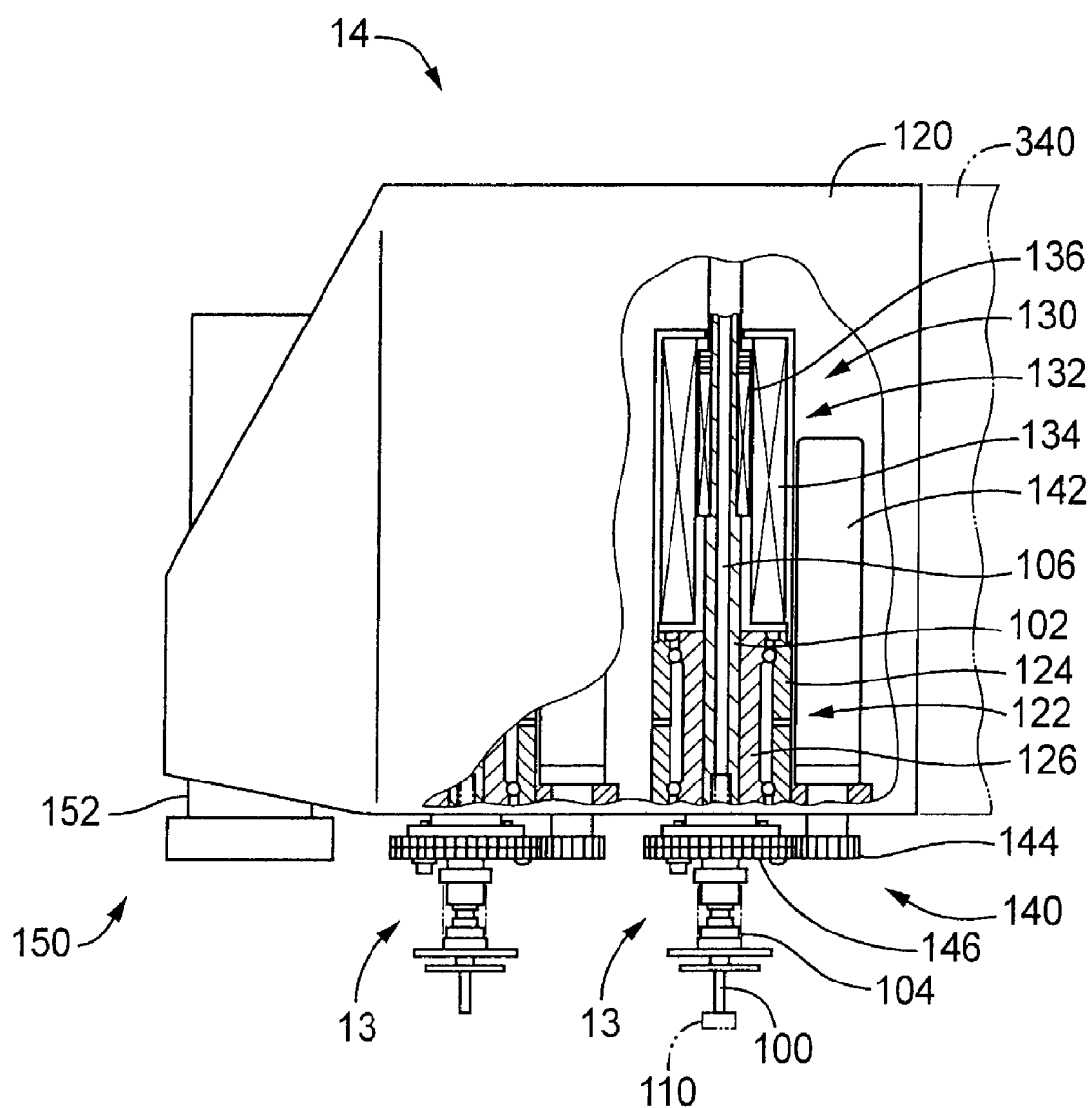
FIG. 5 is a front elevational view partly in cross section of a first mounting unit of the electric-component mounting system of FIG. 1.

Referring to the front elevational view partly in cross section of FIG. 5, each of the eight mounting heads 13 of each first mounting unit 14 includes a suction nozzle 100 serving as a component-holding portion adapted to hold the electric component (indicated at 110 in FIG. 5), and a head shaft 102 which is a shaft portion for supporting the suction nozzle 100. The head shaft 102 is provided at its lower end with an adapter 104 to which the suction nozzle 100 is removably attached. The suction nozzle 100 is arranged to hold the electric component 110 by suction under a negative pressure. The head shaft 102 is a hollow cylindrical member having a passage 106 formed therethrough in the Z-axis direction, in communication at its lower end with the suction nozzle 100, so that the negative pressure is applied to the suction nozzle through the passage 106. The head shaft 102 is further provided at its upper end with a joint (not shown) through which the passage 106 is connected to a negative pressure source (not shown) via suitable pipes and/or hoses and a solenoid-operated directional control valve 108 (indicated in the block diagram of FIG. 9). The application and removal of the negative pressure to and from the suction nozzle 100 are achieved by controlling the directional control valve 108. The negative pressure is applied to the suction nozzle 100 when the suction nozzle 100 receives the electric component 110 supplied from the component-supplying device 20. The suction nozzle 100 holds the electric component 110 as long as the negative pressure is kept applied thereto. When the negative pressure is removed from the suction nozzle 100 or when a positive pressure is applied to the suction nozzle 100, the suction nozzle 100 releases the electric component 110, so that the electric component 110 is transferred onto the component-mounting surface of the circuit substrate 10.

Each first mounting unit 14 has a main body 120 by which each mounting head 13 is supported at the head shaft 102 via a bearing device 122, such that the mounting head 13 is axially movable in the Z-axis direction and rotatable about its axis relative to the main body 120. Described in detail, the bearing device 122 includes an outer race 124 fixed to the main body 120, and an inner race 126 rotatable but axially immovable relative to the outer race 124. The head shaft 102 and the inner race 126 are held in engagement with each other through a ball-spline mechanism (not shown) such that the head shaft 102 is not rotatable and is axially movable relative to the inner race 126, so that the mounting head 13 is axially movable in the Z-axis direction and rotatable about its axis, relative to the main body 120.

Each first mounting unit 14 is provided with an axial head drive device 130, which includes an axial head drive motor 132 for each mounting head 13. In the present system, the axial head drive motor 132 is a linear motor including a cylindrical stator 134 having a coil, and a movable member 136 having a permanent magnet fixed to the head shaft 102 such that the movable member 136 is moved with the head shaft 102. Thus, each mounting head 13 is movable by the axial head drive motor 132 in the Z-axis direction relative to the main body 120 of the mounting unit 14. The Z-axis position of the mounting head 13 is detected by a Z-axis position detector in the form of a linear encoder (not shown). When the selected electric component 110 supplied by the component-supplying device 20 is held by the suction nozzle 100 or when the electric component 110 held by the suction nozzle 100 is mounted on the circuit substrate 10, the mounting head 13 is lowered by the axial head drive device 130 by suitable distances. After the electric component 110 is received or mounted by the suction nozzle 100, the mounting head 13 is elevated by suitable distances. The distances of the vertical movements of the mounting head 13 are determined or calculated by a control device 400 (which will be described), on the basis of stored data indicative of a Z-axis distance between the suction nozzle 100 and the component-supply portions 82 of the tape feeders 80, a Z-axis distance between the suction nozzle 100 and the component-mounting surface of the circuit substrate 10, and a specific thickness or Z-axis direction of the specific electric component 110.

Each first mounting unit 14 is further provided with a head rotating device 140, which includes, as major components thereof, a rotary head drive motor 142, a pinion 144 attached to a drive shaft of the drive motor 142, and a gear 146 which is fixed to the lower end portion of the inner race 126 of the bearing device 122 and which is held in meshing engagement with the pinion 144. A rotary motion of the rotary head drive motor 142 is transmitted to the inner race 126 through the pinion 144 and gear 146, so that the head shaft 102 is rotated with the inner race 126, whereby the mounting head 13 is rotated. An angular position of the mounting head 13 is detected by a angular position detector in the form of a rotary encoder (not shown). The mounting head 13 is rotated by the head rotating device 140, for the purpose of eliminating an angular positioning error of the electric component 110 as held by the suction nozzle 100, that is, an error of positioning of the electric component 110 in the rotating direction of the suction nozzle 100.

Each first mounting unit 14 is further provided with a fiducial-mark recognition device in the form of a fiducial-mark imaging device 150 operable to take images of fiducial marks which are provided on the component-mounting surface of the circuit substrate 10, to detect a positioning error of the circuit substrate 10 as held by the substrate-holding device 12. In the present electric-component mounting system, the fiducial-mark imaging device 150 includes a CCD camera 152 and a light source, for taking the images. When the circuit substrate 10 is held by the substrate-holding device 12, the first mounting unit 14 is moved to a position above the fiducial marks, and the images of the fiducial marks are taken by the fiducial-mark imaging device 150. The control device 400 processes image data representative of the images, to detect the positioning error of the circuit substrate 10, so that the first and second mounting units 14, 16 are moved to predetermined component-mounting spots of the electric components 110 as adjusted to compensate for the positioning error of the circuit substrate 10. It is to be understood that the foregoing descriptions of each first mounting unit 14 are applicable to each second mounting unit 16, which is substantially identical in construction with the first mounting unit 14, as described above.

As shown in FIG. 2, the mounting-unit moving device 18 includes, as major components thereof, a first mounting-unit moving device 200 operable to move the two first mounting units 14 between the component-supplying area and the component-mounting area, and a second mounting-unit moving device 210 operable to move the two second mounting units 16 between the component-supplying and component-mounting areas. Each of the first and second mounting-unit moving devices 200, 210 is of XY slide assembly type (XY robot type). The first mounting-unit moving device 200 (first XY slide assembly) includes: a first X-axis slide 220; a first X-axis-slide moving device operable to move the first X-axis slide 220; two first Y-axis slides 224 on which the two first mounting units 14 are mounted; and a first Y-axis-slide moving device operable to move the two first Y-axis slides 224 on the first X-axis slide 220. Similarly, the second mounting-unit moving device 210 includes: a second X-axis slide 230; a second X-axis-slide moving device operable to move the second X-axis slide 230; two second Y-axis slides 234 on which the two second mounting units 16 are mounted; and a second Y-axis-slide moving device operable to move the two second Y-axis slides 234 on the second X-axis slide 230.

The first mounting-unit moving device 200 and the second mounting-unit moving device 210 (second XY slide assembly) are arranged to move the first mounting units 14 and the second mounting units 16 in respective first and second planes 240, 242 parallel to the reference plane, as indicated in FIG. 2. These first and second planes 240, 242 are spaced apart from the component-mounting surface of the circuit substrate 10, and are spaced apart from each other by a distance sufficient to avoid an interference between the first and second mounting units 14, 16 when these two sets of mounting units 14, 16 are moved in the respective first and second planes 240, 242 between the component-supplying and component-mounting areas. Thus, the mounting-unit moving device 18 is arranged to permit the first and second mounting units 14, 16 to be moved past each other, between the component-supplying and component-mounting areas, as needed, without a risk of mutual interference during their movements along the respective planes 240, 242 for receiving and mounting the electric components 110.

In the present electric-component mounting system, the first and second X-axis slides 220, 230 are moved by the respective first and second mounting-unit moving devices 200, 210, in the X-axis direction in which the component-supplying device 20 and the substrate-holding device 12 are spaced apart from each other, that is, the component-supplying and component-mounting areas are spaced apart from each other, and in which the two circuit substrates 10 held on the substrate-holding device 12 are positioned relative to each other.

In each of the first and second mounting-unit moving devices 200, 210 of XY slide assembly type, the first or second X-axis slide 220, 230 is supported at its opposite ends, and is pivotable in the above-indicated plane 240, 242 parallel to the reference plane (XY plane), relative to the Y-axis direction. Namely, each X-axis slide 220, 230 is arranged such that its longitudinal direction is inclinable in the XY plane with respect to the Y-axis. To this end, the first X-axis slide 220 is supported at its opposite end portions by respective two first X-axis supporting devices in the form of two first X-axis-slide pivotally supporting devices 250, such that the first X-axis slide 220 is pivotable in the XY plane, while the second X-axis slide 230 is supported at its opposite end portions by respective two second X-axis supporting devices in the form of two second X-axis pivotally supporting devices 252, such that the second X-axis slide 230 is pivotable in the XY plane. The first and second mounting-unit moving devices 200, 210 have two first X-axis guide rails 254, and two second X-axis guide rails 256, respectively. These guide rails 254, 256 are fixedly disposed on the frame 26, so as to extend in the X-axis direction in which the X-axis slides 220, 230 are movable. The two guide rails 254, 256 of each mounting-unit moving device 200, 210 are spaced apart from each other in the Y-axis direction, such that the component-supplying device 20 (component-supplying area) and the substrate-holding device 12 (component-mounting area) are located between the two guide rails 254, 256. The two first X-axis-slide pivotally supporting devices 250 are slidably movable on the respective two guide rails 254, while the two second X-axis-slide pivotally supporting devices 256 are slidably movable on the respective two guide rails 252.

Figure 6:
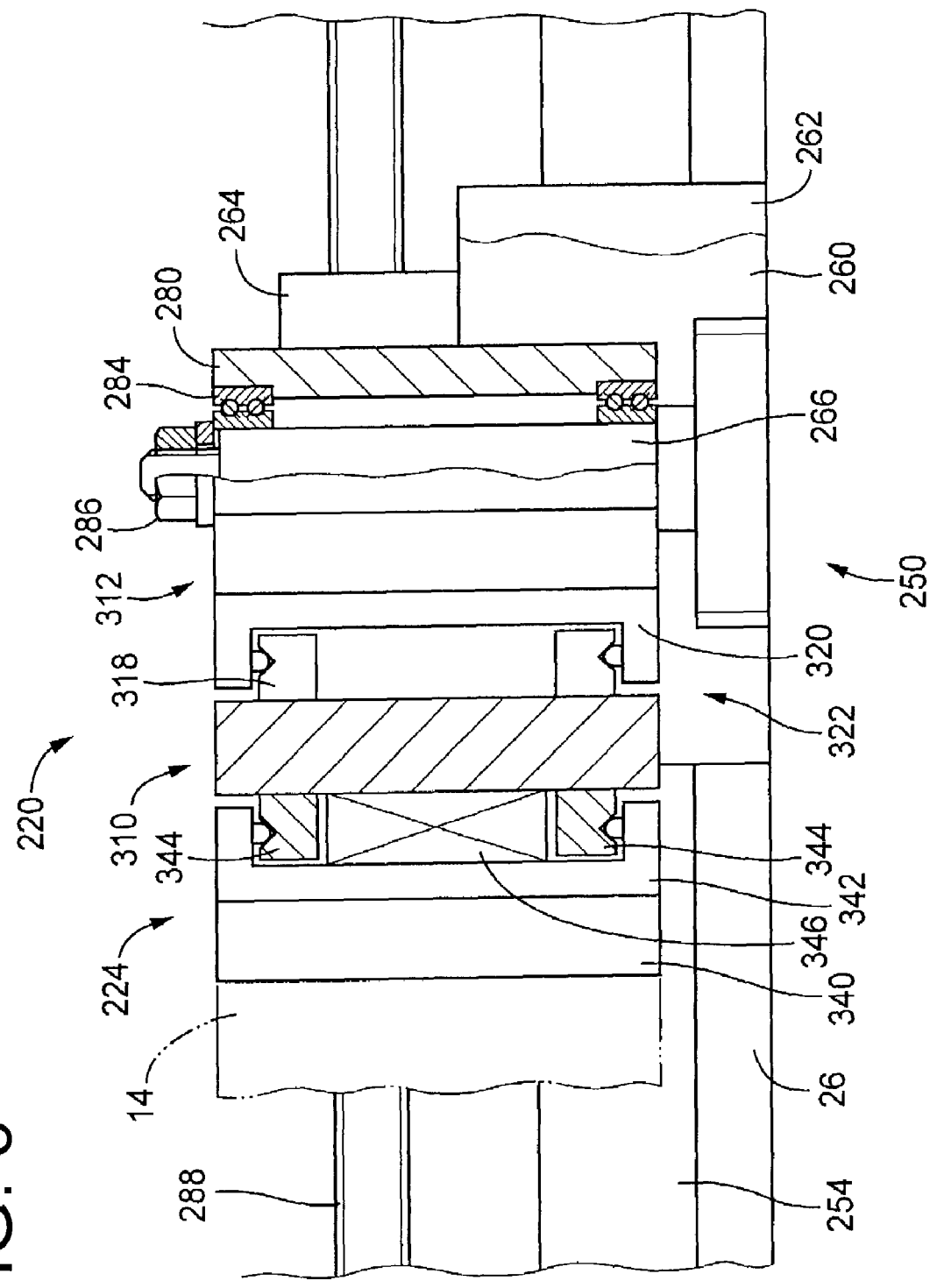
FIG. 6 is an enlarged view partly in cross section taken in a direction of arrows A indicated in FIG. 1, showing a first X-axis-slide pivotally supporting device and its vicinity, a first X-axis-slide telescoping device, a first Y-axis slide, and a first Y-axis-slide moving device in the electric-component mounting system of FIG. 1.
Figure 7:
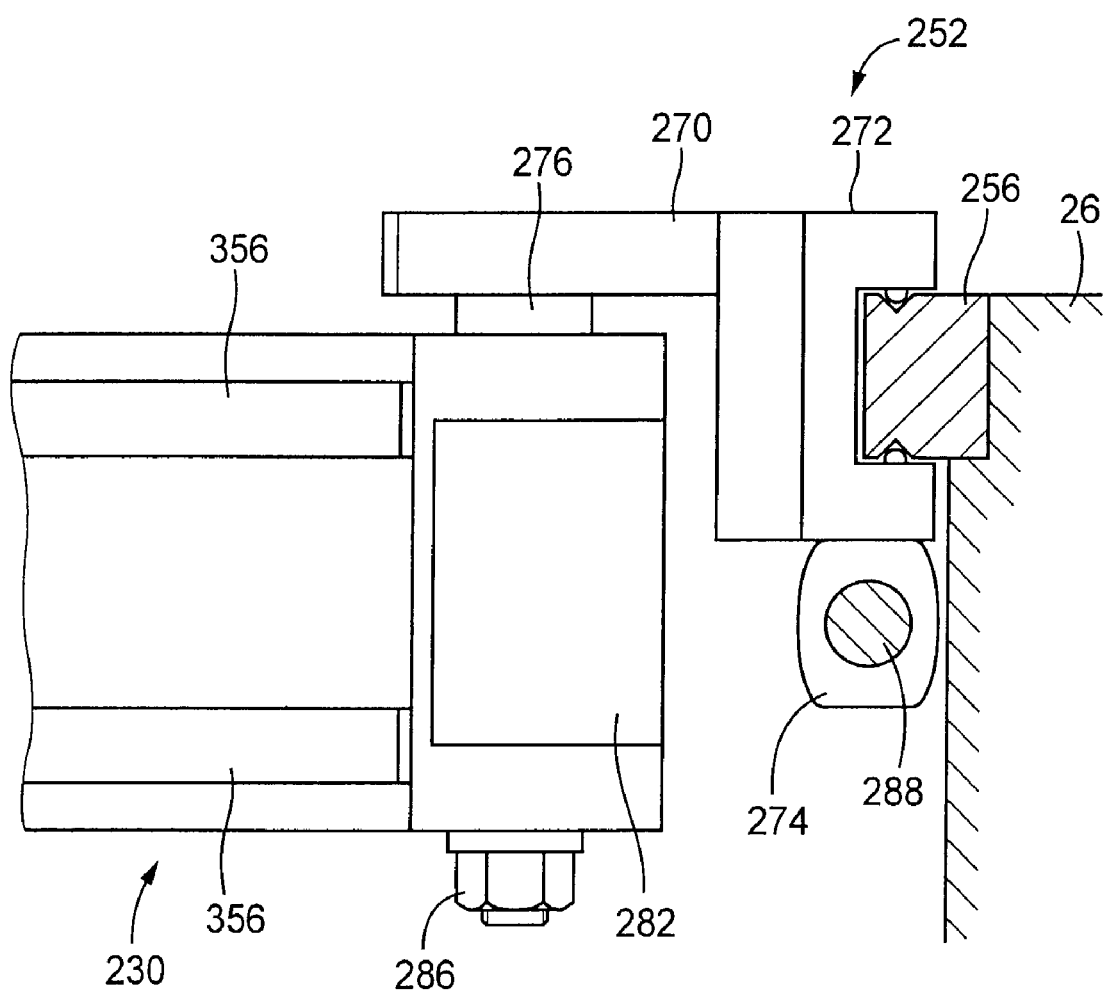
FIG. 7 is an enlarged view partly in cross section taken in a direction of arrows B indicated in FIG. 1, showing a second X-axis-slide pivotally supporting device and its vicinity in the electric-component mounting system of FIG. 1.

Referring to FIGS. 6 and 7, there are respectively shown in enlargement the first X-axis-slide pivotally supporting device 250 and its vicinity, and the second X-axis-slide pivotally supporting device 252 and its vicinity. FIG. 6 is a view partly in cross section taken in a direction of arrows A in FIG. 1, while FIG. 7 is a view partly in cross section taken in a direction of arrows B in FIG. 1. The first X-axis-slide pivotally supporting device 250 includes a supporting member 260 which is L-shaped in cross section, a slide member 262 attached to a flange surface of the supporting member 260, a nut member 264 attached to an upper portion of the slide member 262, and a pivot shaft member 266 extending upwards from the supporting member 260. Similarly, the second X-axis-slide pivotally supporting device 252 includes a supporting member 270 which is L-shaped in cross section, a slide member 272 attached to a flange surface of the supporting member 270, a nut member 274 attached to a lower portion of the slide member 272, and a pivot shaft member 276 extending downwards from the supporting member 270. The first X-axis slide 220 is mounted on the underlying first X-axis-slide pivotally supporting device 250, while on the other hand the second X-axis slide 230 is suspended from the overlying second X-axis-slide pivotally supporting device 252. The pivot shaft member 266 of the first X-axis-slide pivotally supporting device 250 is inserted through a substantially cylindrical hollow portion 280 provided at the corresponding end portion of the first X-axis slide 220, while the pivot shaft member 276 of the second X-axis-slide pivotally supporting device 252 is inserted through a substantially cylindrical hollow portion 280 provided at the corresponding end portion of the second X-axis slide 230. As shown in FIG. 6, two angular bearings 284 are interposed between the outer circumferential surface of the pivot shaft member 266 and the inner circumferential surface of the hollow portion 280, and are tightened by a nut 286, as shown in FIG. 6. Similarly, two angular bearings are interposed between the pivot shaft member 276 and the hollow portion 282, and are tightened by the nut 286. Thus, the first and second X-axis slides 220, 230 are supported by the pivotally supporting devices 250, 252 such that the X-axis slides 220, 230 are pivotable about the pivot shaft members 266, 276 and are not movable in the axial direction of the pivot shaft members 266, 276. The slide members 262, 272 are slidably mounted on the respective first and second X-axis guide rails 254, 256 via suitable bearing devices. The nut members 264, 274 are held in engagement with respective feedscrews 288 disposed in parallel with the guide rails 254, 256. Each of the nut members 264, 274 cooperates with the feedscrew 288 to constitute a ballscrew mechanism. The feedscrews 288 are rotated by respective first and second X-axis-slide drive motors 290, 292 (indicated in FIG. 9), to move the respective first and second X-axis-slide pivotally supporting devices 250, 252 along the respective X-axis guide rails 254, 256, so that the corresponding end portions of the first and second X-axis slides 220, 230 are moved in the X-axis direction. The positions of the four pivotally supporting devices 250, 252 in the X-axis direction are detected by respective X-axis-slide position detectors in the form of linear encoders (not shown).

The first X-axis slide moving device for moving the first X-axis slide 220 includes a pair of moving devices each including the first X-axis guide rail 254, feedscrew 288, first X-axis-slide drive motor 290, and first X-axis-slide pivotally supporting device 250. Similarly, the second X-axis slide moving device for moving the second X-axis slide 230 includes a pair of moving devices each including the second X-axis guide rail 256, feedscrew 288, second X-axis-slide drive motor 292, and second X-axis-slide pivotally supporting device 252.

Each of the first and second X-axis slides 220, 230 includes two body portions. Described more specifically, the first X-axis slide 220 includes a first body portion 310 having a length substantially equal to a distance between the two pivotally supporting devices 250, and a second body portion 312 having a length smaller than that of the first body portion 310. The first and second body portions 310, 312 are supported at the mutually opposite end portions thereof by the respective two pivotally supporting devices 250, and are held in mutually slidable engagement with each other at the other mutually opposite end portions thereof. Similarly, the second X-axis slide 230 includes a first body portion 314 having a length substantially equal to a distance between the two pivotally supporting devices 252, and a second body portion 316 having a length smaller than that of the first body portion 314. The first and second body portions 314, 316 are supported at the mutually opposite end portions thereof by the respective two pivotally supporting devices 252, and are held in mutually slidable engagement with each other at the other mutually opposite end portions thereof. As shown in FIG. 6, the above-indicated other end portion of the first body portion 310 of the first X-axis slide 220 includes two sliding members 318 attached thereto, while the above-indicated other end portion of the second body portion 312 includes one sliding member 320 attached thereto such that the sliding members 318 and the sliding member 320 are slidable on each other in a telescopic fashion in the longitudinal direction of the first X-axis slide 220, whereby the length of the first X-axis slide 220 can be telescopically changed by relative movement of the two body portions 310, 312. The above-indicated other end portions of the first and second body portions 314, 316 of the second X-axis slide 230 have the same arrangement as those of the two body portions 310, 312, so that the length of the second X-axis slide 230 can be telescopically changed by relative movement of the two body portions 314, 316.

In the present electric-component mounting system, the two X-axis-slide pivotally supporting devices 250, 252 of each X-axis slide 220, 230 are movable on the respective guide rails 254, 256 independently of each other, in the X-axis direction, so that the X-axis slide 220, 230 can be pivoted or inclined in the XY plane, with respect to a straight line parallel to the Y-axis direction. However, an inclination or pivotal motion of the X-axis slide 220, 230 requires a change in the distance between the opposite longitudinal ends of the X-axis slide 220, 230, that is, a change in the distance between the two X-axis-slide pivotally supporting devices 250, 252 (more precisely, the distance between the axes of the pivot shaft members 266, 276). This change in the distance between the axes of the pivot shaft members 266, 276 is permitted by a telescopic structure constituted by the sliding members 318, 320 which are held in mutually slidable engagement with each other. The telescopic structure permits a change of the length of the X-axis slide 220, 230, and a pivotal motion of the X-axis slide 220, 230 in the XY plane. Thus, the present electric-component mounting system includes a first X-axis-slide telescopic-movement permitting device 322 operable to permit a telescopic movement of the first X-axis slide 220 at its longitudinally intermediate portion distant from its opposite ends at which the X-axis side 220 is supported by the respective pivotally supporting devices 250. The system also includes a second X-axis-slide telescopic-movement permitting device 324 operable to permit a telescopic movement of the second X-axis slide 230 at its longitudinally intermediate portion distant from its opposite ends at which the X-axis slide 230 is supported by the respective pivotally supporting devices 252. These telescopic-movement permitting devices 322, 324 function as distance-change permitting devices operable to permit a change between the positions at which the X-axis slide 220, 230 are pivotally supported. The first X-axis-slide telescopic-movement permitting device 322 includes the first and second body portions 310 and 312 and the sliding members 318, 320 which are attached to the respective body portions 310, 312 and which cooperate to constitute the telescopic structure, while the second X-axis-slide telescopic-movement permitting device 324 includes the first and second body portions 314, 316 and the sliding members 318, 320 which are attached to the respective body portions 314, 316 and which cooperate to constitute the telescopic structure.

The present electric-component mounting system includes the two first mounting units 14 and the two second mounting units 16, and the first mounting-unit moving device 200 has the two first Y-axis slides 224, while the second mounting-unit moving device 210 has the two second Y-axis slides 234. The two first mounting units 14 are mounted on the respective two first Y-axis slides 224, while the two second mounting units 16 are mounted on the respective two second Y-axis slides 234. The two first Y-axis slides 224 are moved independently of each other by respective first Y-axis-slide moving devices, while the two second Y-axis slides 234 are moved independently of each other by respective second Y-axis-slide moving devices.

One of the two first Y-axis slides 224 and the corresponding first Y-axis-slide moving device to move this Y-axis slide 224 on the first X-axis slide 220 are shown in enlargement in FIG. 6. The first Y-axis slide 224 includes a mounting-unit mounting member 340 on which the first mounting unit 14 is mounted, and a slide member 342. The first X-axis slide 220 is provided with two first Y-axis guide rails 344 extending in its longitudinal direction. The slide member 342 is held in engagement with the first Y-axis guide rails 344 through a bearing device, so that the first Y-axis slide 224 is slidably movable on the first X-axis slide 220. Two drive sources in the form of two first Y-axis-slide drive motors 346 are provided between the slide members 342 of the two Y-axis slides 224 and the first X-axis slide 220, for moving the respective Y-axis slides 224 relative to the first X-axis slide 220. Each of the first Y-axis-slide drive motors 346 is a linear motor including a stator (commonly used for the two drive motors 346) having a permanent magnet, and a movable member having a coil. The stator is attached to the first X-axis slide 220, while the movable member is attached to the slide member 342 (Y-axis slide 224). The Y-axis positions of the two first Y-axis slides 224 are detected by Y-axis position detectors in the form of linear encoders (not shown). Each first Y-axis-slide moving device includes the first Y-axis guide rails 344, slide member 342 and first Y-axis-slide drive motor 346.

Figure 8:
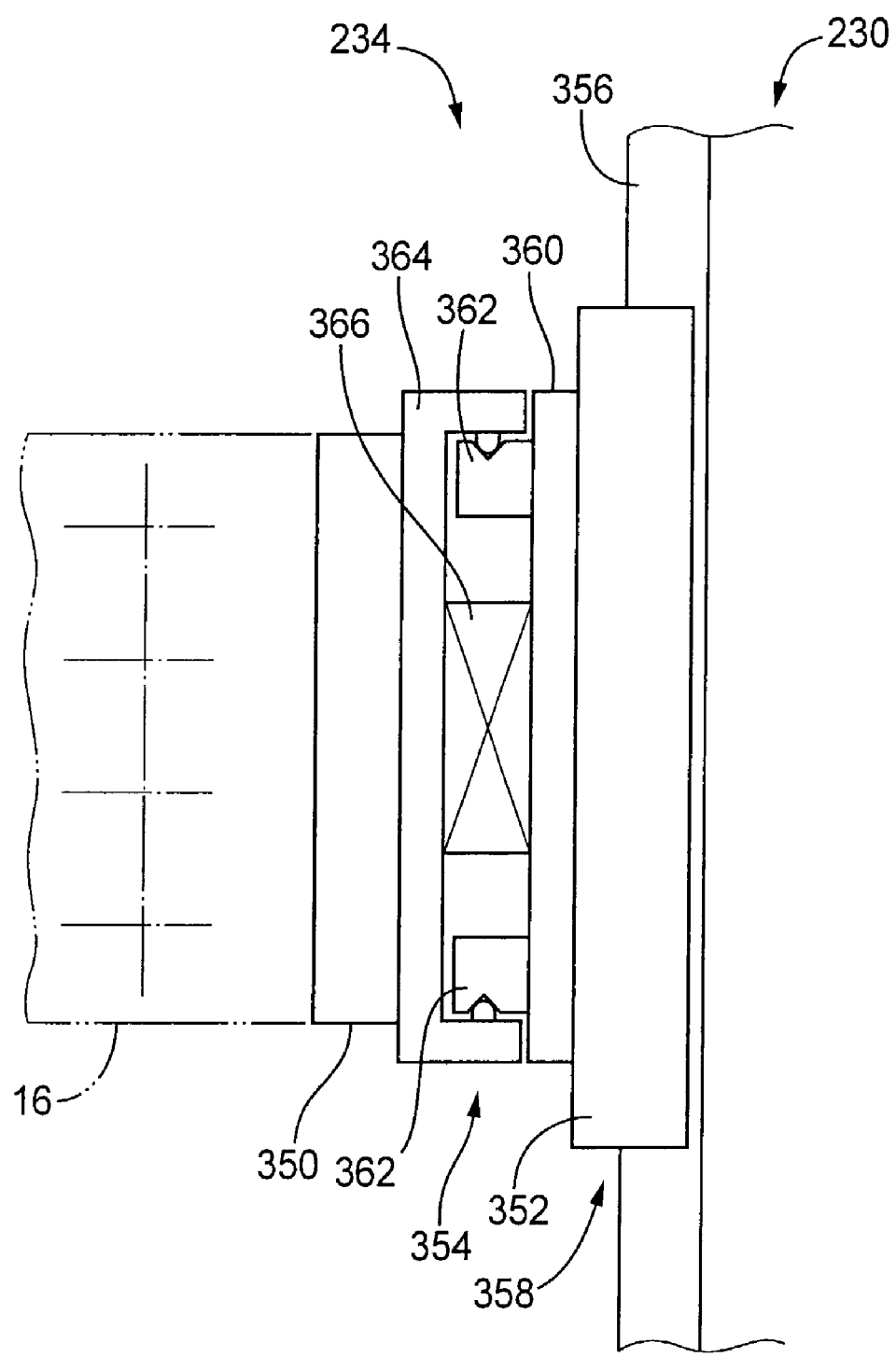
FIG. 8 is an enlarged view taken in a direction of arrows C in FIG. 2, showing a second Y-axis slide and its vicinity in the electric-component mounting system of FIG. 1.

One of the two second Y-axis slides 234 and its vicinity are shown in enlargement in FIG. 8, which is a view taken in a direction of arrows C indicated in FIG. 2. The second Y-axis slide 234 includes a mounting-unit mounting member 350 on which the second mounting unit 16 is mounted, a slide member 352, and a mounting-unit Z-axis drive device 354 disposed between the mounting-unit mounting member 350 and the slide member 352. The mounting-unit Z-axis drive device 354, which is not provided for the first Y-axis slides 224, will be described below in detail. In the other aspects, each second Y-axis slide 234 is similar to the first Y-axis slide 224. Namely, the second X-axis slide 230 is provided with two second Y-axis guide rails 356 extending in its longitudinal direction. The slide member 352 is held in engagement with the second Y-axis guide rails 356 through a bearing device, so that the second Y-axis slide 234 is slidably movable on the second X-axis slide 230. Two drive sources in the form of two second Y-axis-slide drive motors 358 (not shown in FIG. 8) are provided between the slide members 352 of the two Y-axis slides 234 and the second X-axis slide 230, for moving the respective Y-axis slides 234 relative to the second X-axis slide 230. Each of the second Y-axis-slide drive motors 358 is a linear motor similar to that of the first Y-axis-slide drive motors 346. The Y-axis positions of the two second Y-axis slides 234 are detected by Y-axis position detectors in the form of linear encoders (not shown). Each second Y-axis-slide moving device includes the second Y-axis guide rails 356, slide member 352 and second Y-axis-slide drive motor 358.

The mounting-unit Z-axis drive device 354 disposed between the mounting-unit mounting member 350 and the slide member 362 is arranged to elevate and lower the second mounting unit 16 (mounting-head mounting member 350) in the Z-axis direction, that is, translate the second mounting unit 16 in the Z-axis direction. The Z-axis drive device 354 includes a base member 360 attached to the slide member 352, two vertical guide rails 362 provided on the base member 360, a Z-axis slide member 364 which is held in slidable engagement with the vertical guide rails 362 through a bearing device, and a Z-axis drive motor 366 disposed between the base member 360 and the Z-axis slide member 364. The Z-axis drive motor 366 is also a liner motor including a stator having a permanent magnet, and a movable member having a coil. The stator is attached to the base member 360, while the movable member is attached to the Z-axis slide member 364. The uppermost and lowermost positions of the second mounting unit 16 which is moved by the Z-axis drive device 354 are determined by respective stop members. The second mounting unit 16 is movable in the above-indicated second plane 242 when the second mounting unit 16 is located at its uppermost position, and is movable in the above-indicated first plane 240 when the second mounting unit 16 is located at its lowermost position. It will be understood that the mounting-unit Z-axis drive device 354 functions as one form of a distance-difference eliminating device operable to eliminate a difference between a distance between the first mounting units 14 and a predetermined reference plane set at a predetermined position in the Z-axis direction, and a distance between the second mounting units 16 and the predetermined reference plane, when the first and second mounting units 14, 16 are located in at least one of the component-supplying and component-mounting areas. More specifically, the mounting-unit Z-axis drive device 354 serving as the distance-difference eliminating device is arranged to serve as a distance-difference-elimination moving device operable to move the second mounting units 16 in the Z-axis direction, so as to eliminate the above-indicated difference between the distances of the first and second mounting units 14, 16 to the predetermined reference plane, in both of the component-supplying and component-mounting areas, so that the first and second mounting units 14, 16 are operable at the same Z-axis position, to receive the electric component 110 in the component-supplying position, and mount the electric component 110 on the circuit substrate 10 in the component-mounting area.

As described above, the present electric-component mounting system is arranged such that the two first mounting units 14 and the two second mounting units 16 are mounted on the respective two first Y-axis slides 224 and the respective two second Y-axis slides 234, and such that the two first Y-axis slides 224 are movable independently of each other in the Y-axis direction while the two second Y-axis slides 234 are movable independently of each other in the Y-axis direction. Further, the first X-axis slide 220 and the second X-axis slide 230 are pivotable by desired angles in the XY plane, so that the two first mounting units 14 can be aligned in the XY plane with respective two desired component-mounting positions on the circuit substrate 10, and the two second mounting units 16 can be aligned in the XY plane with respective two desired component-mounting positions on the circuit substrate 10, whereby the two electric components 110 can be mounted on one circuit substrate 10 substantially simultaneously, by the respective two mounting heads 13 one provided on one of the two first mounting units 14 and the other provided on the other first mounting unit 14, and the two electric components 110 can be mounted on the other circuit substrate 10 substantially simultaneously, by the respective two mounting heads 13 one provided on one of the two second mounting units 16 and the other provided on the other second mounting unit 16. Since the electric component held by each mounting head 13 provided on each mounting head 14, 16 is pivoted about the axis of rotation of the suction nozzle 100 when the X-axis slide 220, 230 is pivoted in the XY plane, the head rotating device 140 is operated to rotate the suction nozzle 100 under the control of the control device 400, when the electric component is mounted on the circuit substrate 10, so that the electric component can be mounted in its predetermined nominal angular position. It will be understood that the head rotating device 140 and the control device 400 cooperate to constitute an angular-component-position adjusting device operable to rotate the mounting head 13 for adjusting the angular position of the electric component 110 as held by the suction nozzle 100, depending upon the angle of the pivoting motion of the X-axis slide 220, 230.

Figure 9:
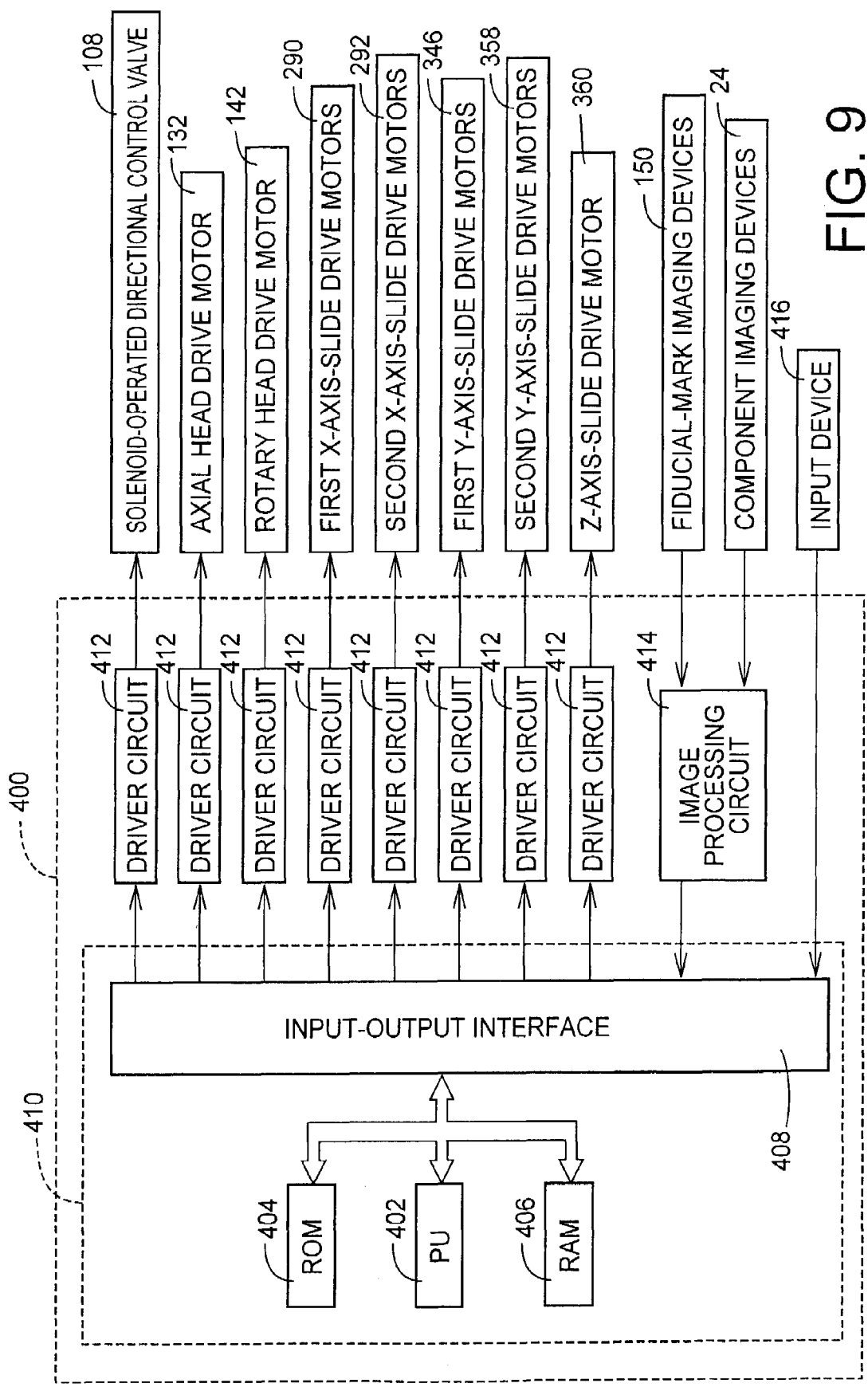
FIG. 9 is a block diagram illustrating a control device of the electric-component mounting system of FIG. 1.

Then, the control device 400 of the present electric-component mounting system will be described by reference to the block diagram of FIG. 9, which shows elements closely relating to the present invention. The control device 400 is principally constituted by a computer 410 incorporating a processing unit (PU) 402, a read-only memory (ROM) 404, a random-access memory (RAM) 406, an input-output interface 408, and a bus interconnecting those elements. To the input-output interface 408, there are connected driver circuits 412 for driving various actuators, and an image processing circuit 414 for processing image data received from the fiducial-mark imaging devices 150 and the component imaging devices 24. The control device 400 is constituted by the computer 410, driver circuits 412 and image processing circuit 414. The input-output interface 408 of the computer 410 is also connected to an input device 416, and a display device such as monitors. The input device 416 has ten keys, alphabetic keys, and function keys, for permitting the user of the system to enter various kinds of data and commands. The input-output interface 408 is arranged to also receive output signals of the various position detectors such as the encoders described above. The various actuators are controlled on the basis of the output signals of the position detectors. The actuators connected to the driver circuits 412 include: the solenoid-operated directional control valve 108; the axial head drive motor 132; the rotary head drive motor 142; the first X-axis-slide drive motors 290; the second X-axis-slide drive motors 292; the first Y-axis-slide drive motors 346; the second Y-axis-slide drive motors 358; and the Z-axis drive motor 366.

There will be described a printed-circuit-board fabricating operation of the present electric-component mounting system. The circuit substrate 10 on which the electric components are to be mounted next is loaded by the loading conveyor 44 onto one of the first or second holding portion 40, 42 of the substrate-holding device 12, on which the component-mounting operation has not been performed. The vertically movable supporting device 54 of that holding portion 40 or 42 (hereinafter referred to as the "present holding portion") is operated to hold the loaded circuit substrate 10 at the predetermined position. The circuit substrate 10 is held in this state until the component-mounting operation on the preceding circuit substrate 10 on the other holding portion 40 or 42 has been completed. Upon completion of the component-mounting operation on the preceding circuit substrate 10, the component-mounting operation on the newly loaded circuit substrate 10 is initiated. Initially, the positioning errors of the circuit substrate 10 as held by the present holding portion 40, 42 are detected by processing image data representative of the images of the fiducial marks provided on the circuit substrate 10, which images are taken by the fiducial-mark imaging devices 150. Described in detail, the two first or second mounting units 14, 16 corresponding to the selected holding portion 40, 42 are moved to respective positions at which the fiducial-mark imaging devices 150 provided on the respective two mounting units 14, 16 are located right above the respective two fiducial marks, which are located at respective two positions on the rectangular component-mounting surface of the circuit substrate 10, which lie on a diagonal line of the rectangle of the component-mounting surface. The images of the two fiducial marks can be taken substantially simultaneously by the two fiducial-mark imaging devices 150 provided on the two mounting units 14 or 16. Image data representative of the taken images of the fiducial marks are processed by the image processing circuit 414, to obtain horizontal positioning errors of the circuit substrate 10 in the X-axis and Y-axis direction, and an angular positioning error of the circuit substrate 10 in the XY plane, namely, to obtain X-axis, Y-axis and θ-axis positioning errors of the circuit substrate 10.

When the positioning errors of the circuit substrate 10 are detected by the fiducial-mark imaging devices 150 provided on the first mounting units 14, for instance, the first mounting units 14 are moved into the component-supplying area by the first mounting-unit moving device 200. Before the movement of the first mounting units 14 toward the component-supplying area is initiated, the second mounting units 16 have already held the electric components. As the two first mounting units 14 are moved by the first mounting-unit moving device 200 toward the component-supplying area, the two second mounting units 16 are moved by the second mounting-unit moving device 210 from the component-supplying area toward the component-mounting areas while the two second mounting units 16 are held at their uppermost positions by the mounting-unit Z-axis drive devices 354, in order to prevent interferences between the first and second mounting units 14, 16 between their movements toward the component-supplying and component-mounting areas in the opposite directions. That is, the first mounting units 14 are moved in the first plane 240 toward the component-supplying area, while the second mounting units 16 are moved in the second plane 242 toward the component-mounting area, so that the movements of the first and second mounting units 14, 16 in the opposite directions do not cause interference therebetween.

The first mounting units 14 which have reached the component-supplying area are operated to receive the electric components from the component-supplying device 20. At this time, the first X-axis slide 220 on which the first mounting units 14 are mounted is positioned so as to extend in the Y-axis direction, so that the first mounting units 14 are movable along the straight line along which the component-supply portions 82 of the tape feeders 80 are arranged. Each of the two first mounting units 14, which has the eight mounting heads 13, is capable of receiving up to eight electric components. Each first mounting unit 14 is moved for each of the selected mounting heads 13 to be located right above the component-supply portion 82 of the appropriate tape feeder 80. Each of the selected mounting heads 13 is lowered by the axial head drive device 130, and the solenoid-operated directional control valve 108 is switched to apply a negative pressure to the suction nozzle 100, for thereby permitting the suction nozzle 100 to hold the electric component. Then, the mounting head 13 is elevated by the axial head drive device 130. Thus, all of the selected mounting heads 13 are operated to hold the respective electric components. In some condition, the two or more electric components may be held by the suction nozzles 100 of the respective two or more mounting heads 13, at the same time. The two first mounting units 14 can be moved on the first X-axis slide 220 in the Y-axis direction, independently of each other, so that the mounting heads 13 of the two mounting units 14 are operable substantially simultaneously, to hold the electric components. A relationship between the mounting heads 13 of each first mounting unit 14 and the electric components to be held by the mounting heads 13 is represented by a component mounting program for the appropriate circuit substrate, and the control device 400 controls the first mounting units 14 according to the component mounting program.

Then, each first mounting unit 14 holding the electric components is moved to a position right above the component imaging device 24, to detect the position of the electric component as held by each mounting head 13. Described more specifically, image data obtained by the component imaging device 24 are processed by the image processing circuit 414, to obtain center position errors of the electric component with respect to the axis of rotation of the mounting head 13 in the X-axis and Y-axis direction, and an angular positioning error of the electric component about the axis of rotation (in the θ-axis direction). It will be understood that the image processing circuit 414 and the computer 410 cooperate to constitute a component-positioning-error obtaining device operable to obtain the positioning errors of the electric component as held by each mounting head 13. It is noted that the present system is provided with the two component imaging devices 24 assigned to detect or recognize the positioning errors of the electric components held by the respective two first mounting units 14 (and the respective two second mounting units 16).

While the first mounting units 14 are operated to detect the positioning error of the circuit substrate 10, receive the electric components and detect the positioning errors of the electric components as held by the mounting heads 13, the second mounting units 16 are in operation to mount the electric components on the circuit substrate 10 in the component-mounting area. Namely, the two second mounting units 16 which have reached the component-mounting area are lowered by the mounting-unit Z-axis drive devices 354 to the lowermost position, so that the second mounting units 16 are movable in the first plane 240 in the following component-mounting operations. In the component mounting operations, the operation of one of the mounting heads 13 of one of the two second mounting units 16 to mount the corresponding electric component onto the circuit substrate 10 is effected substantially simultaneously with the operation of one of the mounting heads 13 of the other second mounting unit 16. Namely, the second mounting-unit moving device 210 is operated such that the two second X-axis-slide pivotally supporting devices 252 which support the second X-axis slide 230 at its respective opposite ends are moved in the X-axis direction independently of each other, while the two second Y-axis slides 234 on which the respective two second mounting units 16 are mounted are moved on the second X-axis slide 230 in the Y-axis direction independently of each other. Those movements of the pivotally supporting devices 252 and the Y-axis slides 234 are controlled by the control device 400, so that the selected two mounting heads 13 of the respective two second mounting units 16 are aligned with the respective two component-mounting spots on the circuit substrate 10.

Figure 10:
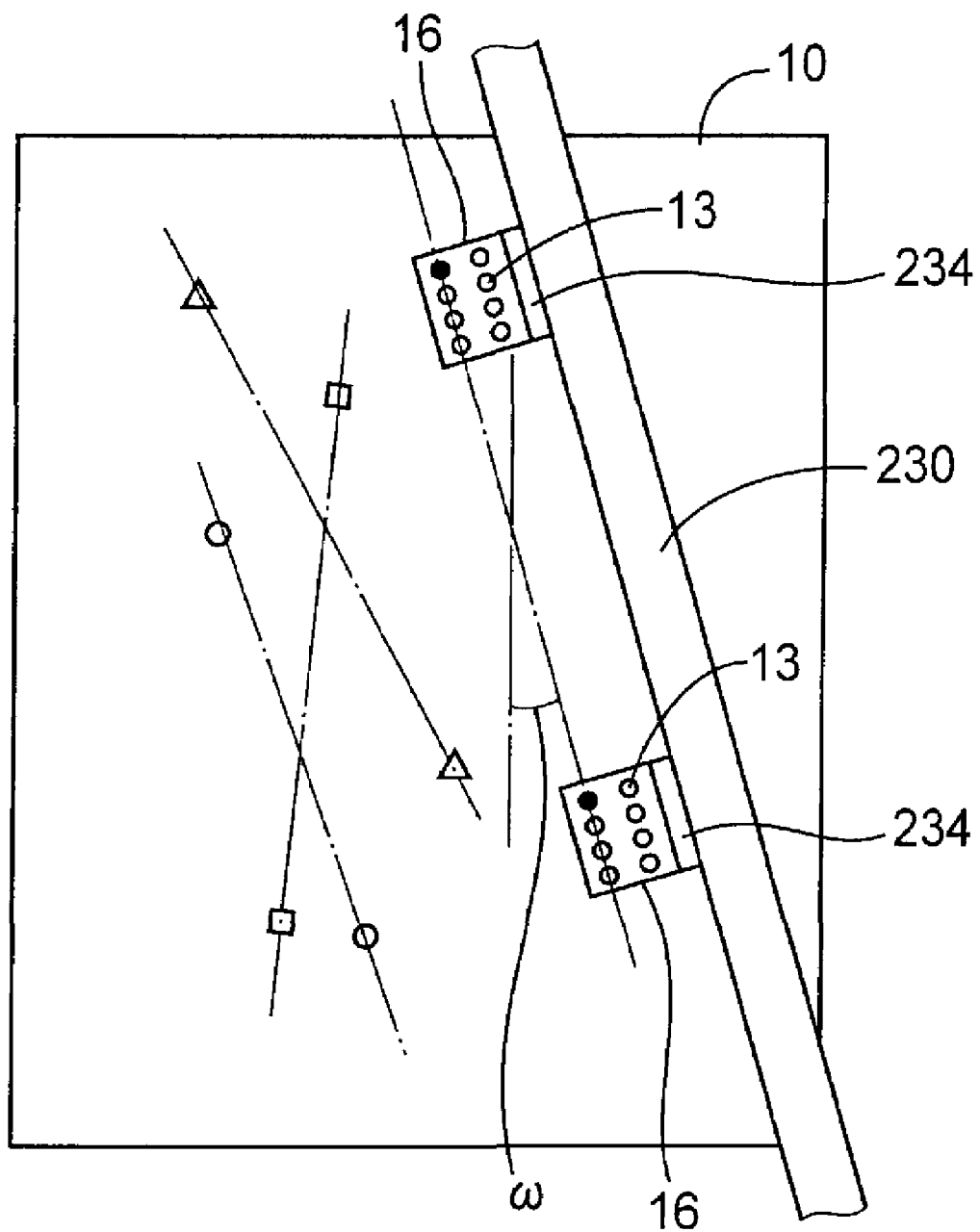
FIG. 10 is a schematic view illustrating a manner in which two electric components are mounted at the same time by two mounting units, in the electric-component mounting system of FIG. 1.

Referring to FIG. 10, there are schematically shown the operations of the two second mounting units 16 which are substantially simultaneously performed to mount the respective two electric components on the circuit substrate 10. In the example of FIG. 10, the selected two mounting heads 13 of the two mounting units 16 are first aligned with the respective two component-mounting spots indicated by marks "●", so that the electric components are transferred from those two mounting heads 13 onto the corresponding component-mounting spots. Then, the two mounting units 16 are moved so that the other two mounting heads 13 of the two mounting units 16 are aligned with the respective two component-mounting spots indicated by marks "Δ", so that the electric components are transferred from those two mounting heads 13 onto the corresponding component-mounting spots. Similarly, the electric components are then mounted at the respective two component-mounting spots indicated by marks "□", and then at the component-mounting spots indicated by marks "○". The two mounting units 16 are further moved to transfer the four other electric components from the respective four other mounting heads 13 onto the respective component-mounting spots, whereby a total of 16 electric components are mounted on the circuit substrate 10 by the two second mounting units 16. In this series of component-mounting operations, the operations to mount the two electric components substantially simultaneously at the respective two component-mounting spots lying on a given straight line are repeatedly performed. The straight lines corresponding to the respective pairs of component-mounting spots need not be parallel to each other. Thus, the printed-circuit board fabricating operation includes a step of substantially simultaneously mounting a plurality of electric components at respective component-mounting spots on the circuit substrate 10. This step of component-mounting operation includes a step of substantially simultaneously mounting the two electric components at respective two component-mounting spots lying on one straight line, and a step of substantially simultaneously mounting the two electric components at respective two component-mountings spots lying on another straight line which is not parallel to the above-indicated one straight line. Further, the series of component-mounting operations of the present electric-component mounting system are controlled such that each of the mounting heads 13 of one of the two second mounting units 16 is operated to mount the corresponding electric component, substantially simultaneously with the electric component to be mounted by the corresponding mounting head 13 of the other second mounting units 16. Thus, the control device 400 serves as a simultaneous-component-mounting device operable to control the two second mounting units 16 for substantially simultaneous operations to mount the two electric components at the respective component-mounting spots on the circuit substrate 10.

Where the two electric components are mounted at the two component-mounting spots indicated by the marks "●" as indicated in FIG. 10, the straight line on which the two component-mounting spots lie is inclined by an angle c with respect the Y-axis direction, which is equal or almost equal to the angle of inclination of the second X-axis slide 230. As a result, the electric component as held by the corresponding mounting head 13 is rotated by the angle ω. This angle ω is determined by the X-axis positions of the two second X-axis-slide pivotally supporting devices 252, the Y-axis positions of the two second Y-axis slides 234 and the positions of the appropriate two mounting heads 13 of the two second mounting units 16. The control device 400 is provided with position data representative of those positions for each pair of component-mounting spots, to calculate the angle ω of inclination of the straight line for each pair of component-mounting spots. On the basis of the calculated inclination angle ω, the control device 400 commands the head rotating device 140 to rotate the corresponding two mounting heads 13, for rotating the two electric components to their nominal angular position. Accordingly, the two electric components can be mounted by the respective two mounting heads 13, substantially simultaneously, at the respective two component-mounting spots which are spaced in a direction inclined with respect to the Y-axis. It will be understood that the head rotating device 140 and the control device 400 cooperate to constitute an angular-head-position adjusting device operable to adjust the angular position of each mounting head 13 for rotating the electric component to its nominal angular position.

The positioning errors of the circuit substrate 10 and the electric components, which have been obtained as described above with respect to the first mounting units 14, are eliminated when the electric components are mounted on the circuit substrate, as described below with respect to the second mounting units 16. Described more specifically, the control device 400 commands the second X-axis-slide drive motors 292 and the second Y-axis-slide drive motors 358 of the second mounting-unit moving device 210 to move the mounting heads 13 to the X-axis and Y-axis positions determined so as to eliminate the X-axis and Y-axis positioning errors of the circuit substrate 10 and the electric components, and commands the head rotating device 140 to rotate the electric components to the angular positions which are determined so as to eliminate the angular positioning errors of the electric components. As a result, the electric components are mounted at the nominal positions in the XY plane, with the nominal angular positions about the θ axis. It will be understood that the first and second mounting-unit moving devices 200, 210 and the control device 400 cooperate to constitute a head-position compensating device operable to compensate the horizontal angular positions of each mounting head 13, so as to eliminate the horizontal and angular positioning errors of the circuit substrate 10 and the electric components.

When all of the electric components have been transferred from the mounting heads 13 of the second mounting units 16 onto the circuit substrate 10, the mounting units 16 are elevated to the second plane 242 by the mounting-unit Z-axis drive devices 354. While the second mounting units 16 are in operation to mount the electric components on the circuit substrate 10, the first mounting units 14 are in operation to receive the electric components from the component-supply device 20, as described above. When the operations of the first and second mounting units 14, 16 have been both terminated, the first mounting units 14 are moved into the component-mounting area while the second mounting unit 16 are moved into the component-supplying area. At this time, the first mounting units 14 are moved in the first plane 240 while the second mounting units 16 are moved in the second plane 242, so that there arise no interference between the first and second mounting units 14, 16 during their movements in the opposite directions in the XY plane. Then, the second mounting units 16 perform the series of operations to receive the electric components and detect the positioning errors of the electric components, while at the same time the first mounting units 14 perform the series of operations to mount the electric components on the circuit substrate 10. For example, all of the necessary electric components are mounted by the first mounting units 14 on the circuit substrate 10 held in the first holding portion 40 of the substrate-holding device 12, by repeating their operations in the component-supplying and component-mounting areas and the movements between these two areas.

Figure 11:
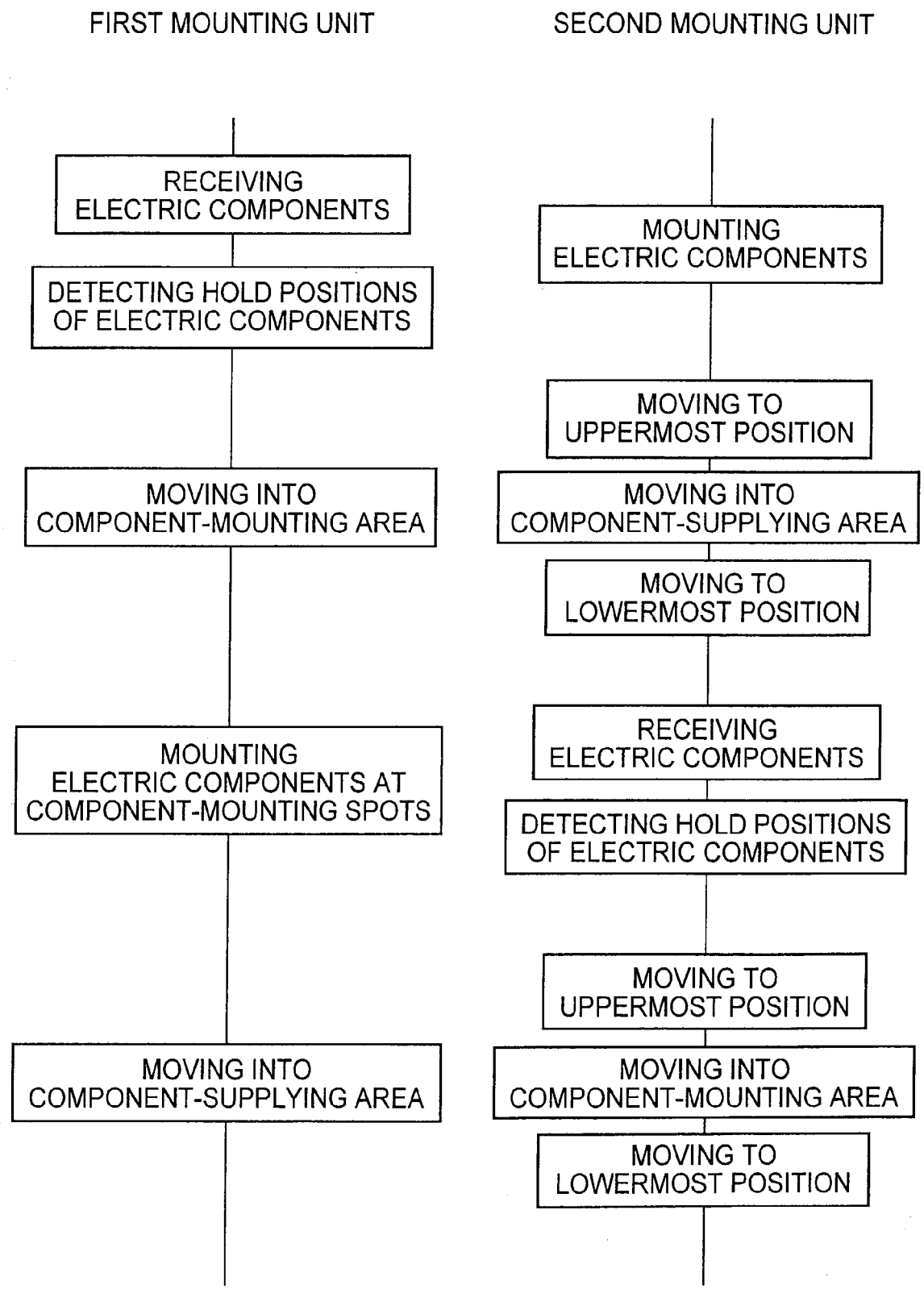
FIG. 11 is a flow chart illustrating operations of the first and second mounting units in a printed-circuit board assembling process in the electric-component mounting system of FIG. 1.

Referring to the flow chart of FIG. 11, there are illustrated the operations of the first and second mounting units 14, 16. In the present electric-component mounting system wherein the first and second mounting units 14, 16 are movable between the component-supplying and component-mounting areas, without an interference therebetween, one of the two sets of mounting units 14, 16 is located in the component-mounting area while the other set of mounting units 14, 16 is located in the component-supplying area, for the mounting heads 13 to receive the corresponding electric components, so that the efficiency of the overall component-mounting operation of the present system can be significantly improved. It will be understood that the control device 400 operable to control the mounting-unit moving device 18 (including the first and second mounting-unit moving devices 200, 210) so as to control the first and second mounting units 14, 16 as described above functions as a mounting-unit-position control device operable to control the positions of the two sets of mounting units 14, 16 such that one of the two sets is located in the component-supplying area while the other set is located in the component-mounting area.

In the present electric-component mounting system, the circuit substrate 10 on which the electric components have been mounted is unloaded by the unloading conveyor 46, onto the next working system, which may be another electric-component mounting system arranged to mount other necessary electric components on the circuit substrate 10, so that the component-mounting process is terminated in the next electric-component mounting system. However, the component-mounting process may be terminated in the present electric-component mounting system. In this case, the next working system may be a soldering system in which the mounted electric components are soldered to the circuit substrate 10.

Modifications of First Embodiment

Figure 12:
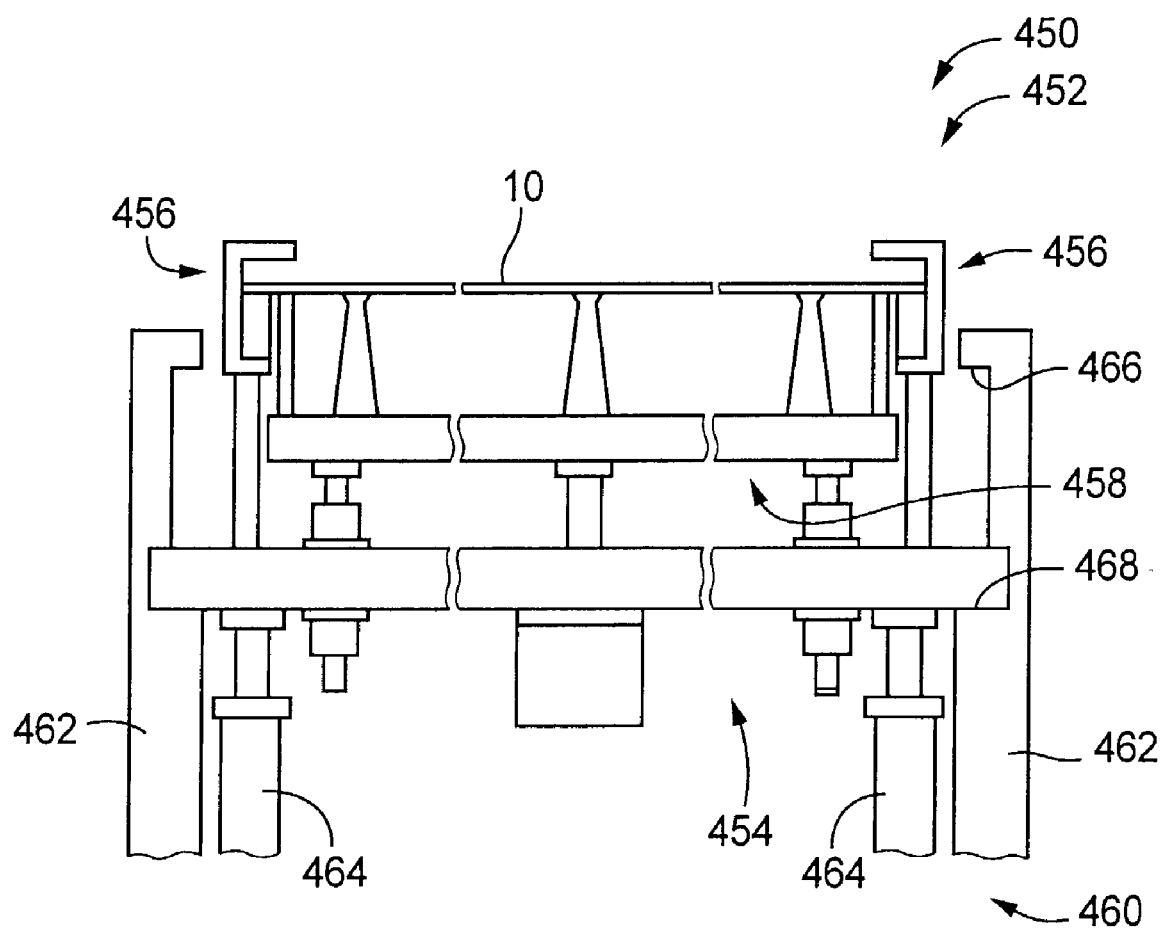
FIG. 12 is a front elevational view showing the construction of one of two holding portions in a modified arrangement of the substrate-holding device, which can be used in the electric-component mounting system of FIG. 1.

Some possible modified arrangements of the first embodiment of the electric-component mounting system of this invention will be described. Referring to FIG. 12, there is shown one of two holding portions 452 of a substrate-holding device 450, which is used in place of the substrate-holding device 12 provided in the first embodiment. In the substrate-holding device 12, the vertically movable supporting device 54 is vertically movable, but the guide rails 52 for guiding the conveyor belts 56 are stationary. In the substrate-holding device 450 of FIG. 12 according to the present modification, the holding portions 452 per se are vertically movable, that is, two guide rails 456 for guiding conveyor belts are arranged to be vertically movable. Each holding portion 452 includes, as major components, a base 454, the above-indicated two guide rails 456 fixed to the base 454, a vertically movable supporting device 458 for supporting the circuit substrate 10 on its lower surface, and a substrate Z-axis drive device 460 fixed to the frame 26 (not shown) and operable to vertically move the base 454. The base 454, substrate guide rails 456 and vertically movable supporting device 458 are identical in construction and function with the base 50, substrate guide rails 52 and vertically movable supporting device 54 of the substrate-holding device 12. The substrate Z-axis drive device 460 includes two vertical guides 462 which are disposed on respective opposite sides of the base 454, for guiding the base 454 in the vertical direction perpendicular to the reference plane (parallel to the circuit substrate 10). The substrate Z-axis drive device 460 further includes fluid-operated actuators in the form of elevating and lowering air cylinders 464 each having a cylinder housing fixed to the frame and a piston rod whose upper end is fixed to the base 454. Each of the vertical guides 462 has an upper end stopper 466 and a lower end stopper 468, so that the upper and lower stroke ends of the base 454 are determined by abutting contact thereof with the respective upper and lower end stoppers 466, 468. A distance between the upper and lower stroke ends of the base 454 is made equal to a distance between the first and second planes 240, 242 described above with respect to the first embodiment. When the substrate Z-axis drive device 460 is operated while the circuit substrate 10 is held by the holding portion 452, the circuit substrate 10 is moved in the vertical or Z-axis direction by a predetermined elevating and lowering stroke of the substrate Z-axis drive device 460, which is equal to the above-indicated distance. The substrate Z-axis drive device 460 is controlled such that the circuit substrate 10 is held at the lowermost position when the first mounting units 14 are used to mount the electric components on the circuit substrate 10, and is held at the uppermost position when the second mounting units 16 are used to mount the electric components on the circuit substrate 10. Thus, the substrate Z-axis drive device 460 serves as a distance-difference eliminating device operable to eliminate the distance between the first and second mounting units 14, 16 in the Z-axis direction, when the mounting units 14, 16 are located in the component-mounting area. More precisely described, the substrate Z-axis drive device 460 serves as a vertical substrate moving device operable to move the substrate 10 in the Z-axis or vertical direction, so as to eliminate the above-indicated distance.

Figure 13:
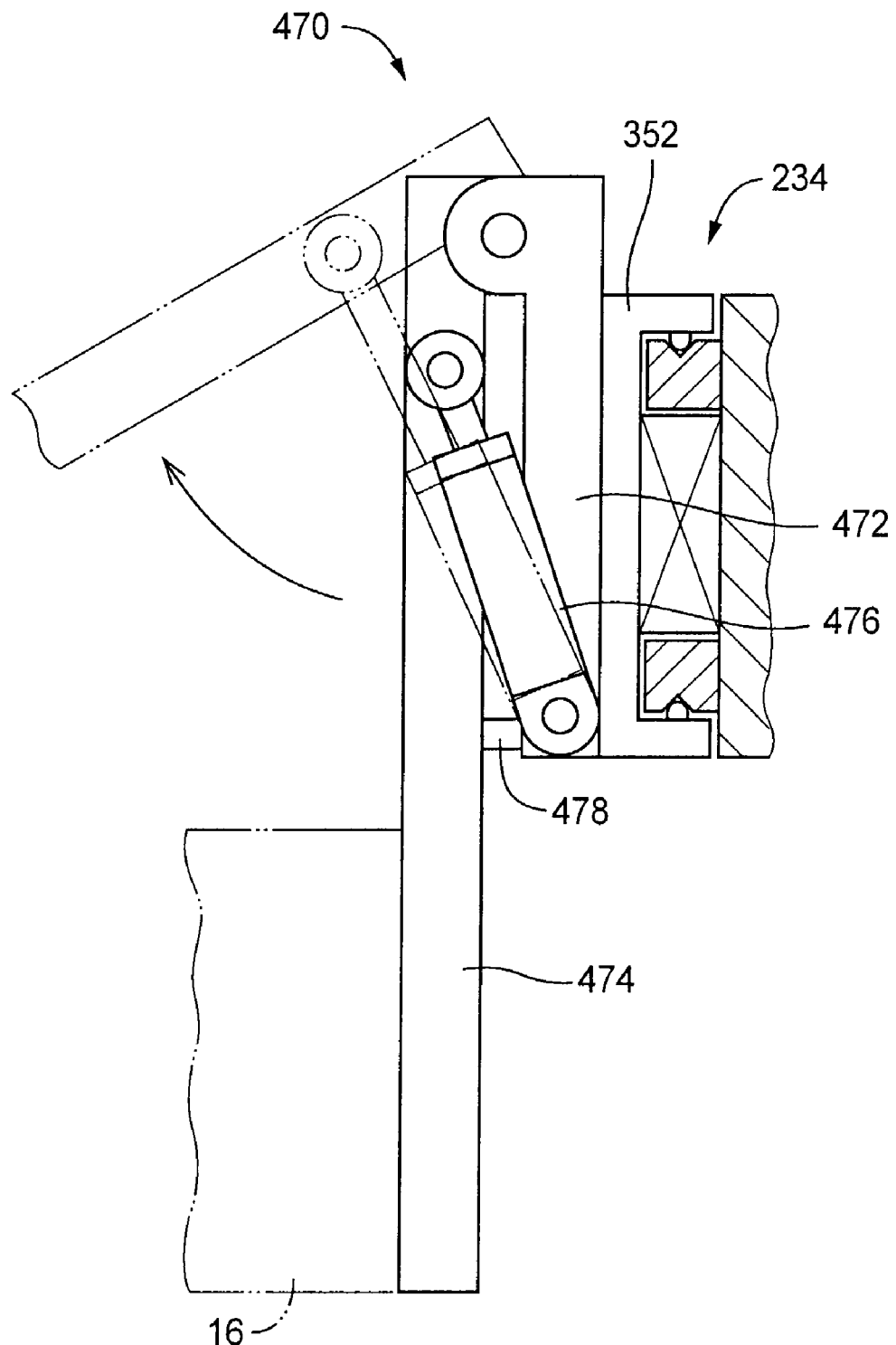
FIG. 13 is a front elevational view of a mounting-unit pivotally moving device which is arranged to move the second mounting units between two vertical positions by a pivotal motion and which is a modified arrangement of a distance-difference eliminating device that can be used in the electric-component mounting system of FIG. 1.

In the first embodiment, the mounting-unit Z-axis drive devices 354 are provided, as indicated in FIGS. 2 and 8, as the distance-difference eliminating device operable to move the second mounting units 16 in the Z-axis direction perpendicular to the reference plane (XY plane). The mounting-unit Z-axis drive devices 354 may be replaced by a mounting-unit pivotally moving device 470 provided for pivoting each second mounting unit 16 about an axis substantially parallel to the reference plane. As shown in FIG. 13, the mounting-unit pivotally moving device 470 includes a pivot base 472 attached to the slide member 352 of each second Y-axis slide 234, a mounting-unit mounting member 474 pivotally attached to the pivot base 472, and a fluid-operated actuator in the form of a pivoting air cylinder 476 pivotally attached to the pivot base 472 and the mounting-unit mounting member 474. The mounting-unit mounting member 474 has an upper portion at which the mounting member 474 is pivotally supported by the pivot base 472, and a lower portion on which the second mounting unit 16 is mounted. The pivoting air cylinder 476 has proximal and distal end portions at which the air cylinder 476 is pivotally connected to the pivot base 472 and the mounting-unit mounting member 474, respectively. The upper portions of the pivot base 472 and the mounting member 474 constitute a hinge mechanism which permits the pivot base 472 and mounting member 474 to be pivotable about their upper end portions. The mounting member 474 is pivoted relative to the pivot base 472, between two angular positions when the pivoting air cylinder 476 is operated. The pivot base 472 has a stopper member 478 at its lower end, for abutting contact with the mounting member 474, to establish one of the angular positions of the mounting member 474. In this angular position, the mounting member 474 extends in the Z-axis direction perpendicular to the reference plane (XY plane), and the second mounting units 16 mounted at the lower end of the mounting member 474 are located in the above-indicated first plane 240. In the other angular position of the mounting member 474 indicated by two-dot chain line in FIG. 13, the mounting units 16 are spaced apart from the first plane 240 in the upward direction. The pivoting air cylinder 476 is controlled to hold the second mounting units 16 in the first plane 240 while mounting units 16 are located in the component-supplying and component-mounting areas, and hold the second mounting units 16 above the first plane 240, during the movements of the first and second mounting units 14, 16 in the XY plane in the opposite directions between the component-supplying and component-mounting areas. Thus, the mounting-unit pivotally moving devices 470 permit the movements of the first and second mounting units 14, 16 between the component-supplying and component-mounting areas, while avoiding the interference therebetween.

Figure 14:
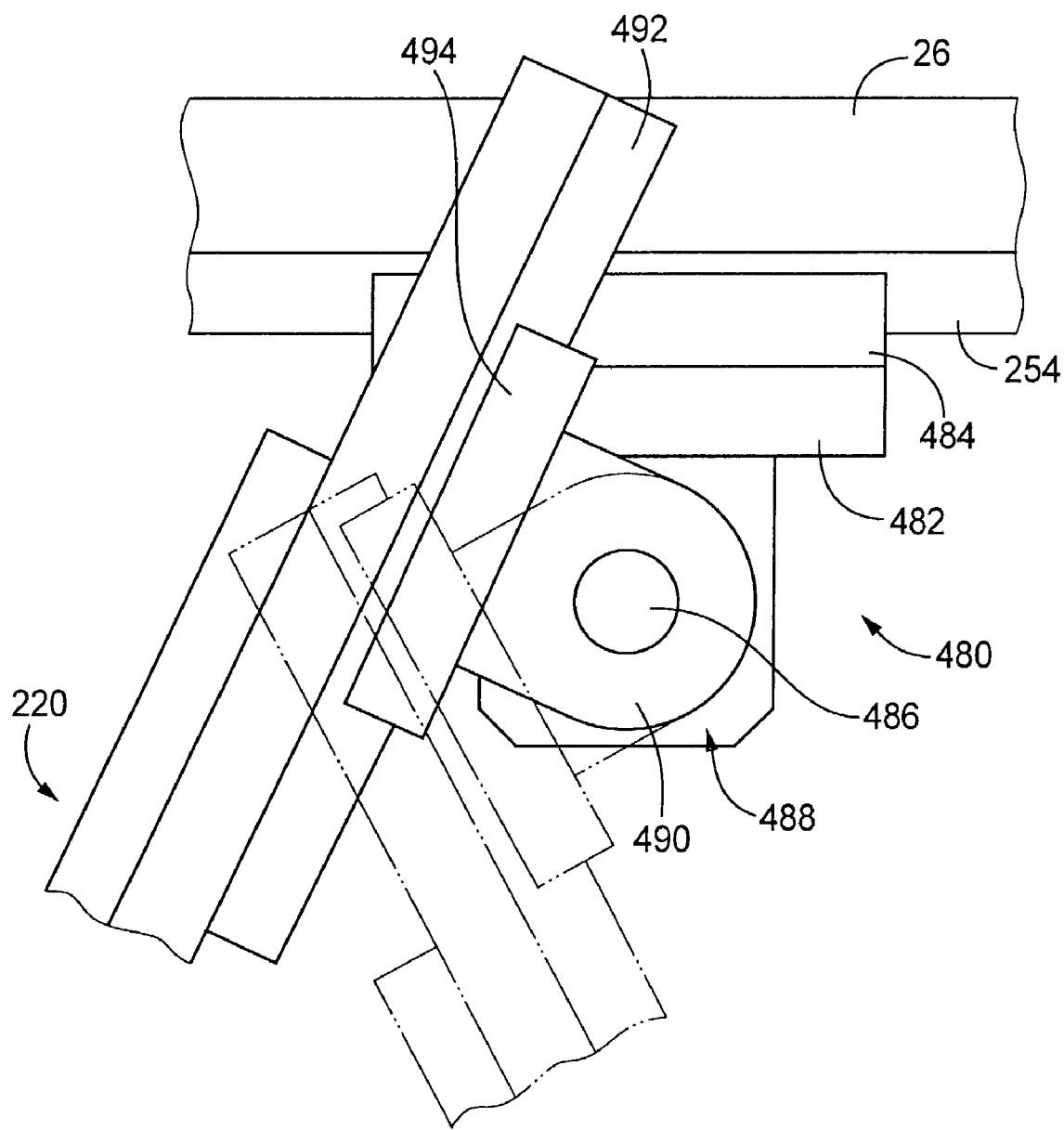
FIG. 14 is an enlarged plan view showing a first X-axis-slide pivotally supporting device, which is a modified arrangement of an X-axis-slide relative-movement permitting device, which can be used in the electric-component mounting system of FIG. 1.

In the electronic-component mounting system, the first and second X-axis-slide telescopic-movement permitting devices 322, 324 (FIG. 1) are provided as the distance-change permitting devices which permit a change in the distance between the positions at which each of the first and second X-axis slides 220, 230 is pivotally supported by the first or second X-axis-slide pivotally supporting devices 250, 252. The telescopic-movement permitting device 322, 324 may be eliminated if the X-axis slides 220, 230 and one of the two X-axis-slide pivotally supporting devices 250, 252 are modified so as to provide an X-axis-slide relative-movement permitting device which permits a relative movement between the above-indicated one pivotally supporting device 250, 252 and the X-axis slide 220, 230 in the longitudinal direction of the X-axis slides 220, 230. Referring to FIG. 14, there are schematically illustrated one example of such an X-axis-slide relative-movement permitting device in the form of a first X-axis-slide pivotally and slidably supporting device 480, and its vicinity. This first X-axis-slide pivotally and slidably supporting device 480 includes: a support member 482; a slide member 484 attached to a flange surface of the support member 482 such that the slide member 484 is slidable on the first X-axis guide rail 254; and a pivoting member 488 pivotable about a pivot shaft member 486 which extends from the support member 482. The pivoting member 488 includes a pivoting portion 490 rotatably supported by the pivot shaft member 486, and a slide holder portion 494 attached to the pivoting portion 490 such that the slide holder portion 494 slidably engages a sliding portion 492 of the first X-axis slide 220. The first X-axis-slide pivotally and slidably supporting device 480 is moved on the first X-axis guide rail 254 in the X-axis direction by a first X-axis-slide moving device (not shown). The first X-axis slide 220 is supported at the other longitudinal end portion by the first X-axis-slide pivotally supporting device 250 which has been described above with respect to the first embodiment. The pivotally supporting device 250 is not movable relative to the first X-axis slide 220 in the longitudinal direction of the slide 220. As the first X-axis slide 220 is inclined with a movement of the first X-axis-slide pivotally and slidably supporting device 480 in the X-axis direction, the first X-axis slide 220 is moved relative to the slide support portion 494 through the sliding portion 492, so that the position at which the first X-axis slide 220 is supported by the pivotally and slidably supporting device 480 is changed, whereby the first X-axis slide 220 is permitted to be inclined with respect to the Y-axis direction. That is, the first X-axis-slide pivotally and slidably supporting device 480 permits a change in the distance between the two positions at which the first X-axis slide 220 is pivotally supported at its opposite longitudinal ends.

In the first embodiment wherein the first and second X-axis-slide telescopic-movement permitting devices 322, 324 are provided as the distance-change permitting devices, the first and second body portions 310, 312, 314, 316 of the first and second X-axis slides 220, 230 are telescopically connected to each other at a longitudinally intermediate portion of each X-axis slide 220, 230. Accordingly, the intermediate portion of the X-axis slide 220, 230 tends to have a comparatively low mechanical strength. The modified arrangement of FIG. 14 wherein the X-axis-slide pivotally and slidably supporting device 480 is provided to pivotally and slidably support the X-axis slide 220 at one longitudinal end portion thereof is advantageous in that the X-axis slide 220 does not have a telescopic connection and has a comparatively high mechanical strength, with the sliding portion 492 held in slidable engagement with the pivotable slide support portion 494. On the other hand, the X-axis-slide pivotally and slidably supporting device 480 has a disadvantage that the longitudinal end portion of the X-axis slide 220 (its sliding portion 492) projects beyond the supporting device 480 when the angle of inclination of the X-axis slide 220 is relatively small, that is, when the distance between the supporting devices 250, 480 is relatively small. This projection of the X-axis slide 220 increases the required width of the installation space for the electric-component mounting system in the Y-axis direction. In this respect, the pivotally and slidably supporting device 480 or the pivotally supporting device 250 is selectively used at one end of the X-axis slide 220, in the light of the above-indicated advantage and disadvantage of the pivotally and slidably supporting device 480. The pivotally and slidably supporting device 480 is equally applicable to the second X-axis slide 230.

There will next be described a possible modification of the mounting units. In the first embodiment described above, each of the mounting units 14, 16 has eight mounting heads 13, which are disposed such that two arrays of four heads 13 are arranged in two parallel straight rows. However, each mounting head 13 is stationary, that is, is not movable within the mounting unit 14, 16 in the XY plane. FIG. 15A schematically shows a manner in which the two electric components are mounted at the same time by the respective two mounting heads 13 provided on one and the other of the two first mounting units 14, which are mounted on the respective two first Y-axis slides 224 slidably mounted on the first X-axis slide 220. Since an interference between the two first mounting units 14 must be avoided, there exists a shortest distance between the two first mounting units 14. Where the two mounting heads 13 indicated at "A" in FIG. 15A are used for simultaneous mounting of the two electric components, these electric components can be mounted at respective two spots which are considerably close to each other. Where the two mounting heads 13 indicated at "B" are used, however, the shortest distance between the two spots at which the electric components can be mounted by those two mounting heads 13 is considerable large. In other words, the mounting heads 13 indicated at "B" cannot be used for simultaneous mounting of the two electric components where the spots at which these electric components are to be mounted are considerably close to each other. Thus, the first mounting units 14 have a limitation in the selection of the two mounting heads 13 for simultaneous mounting of two electric components.

Figure 15B:
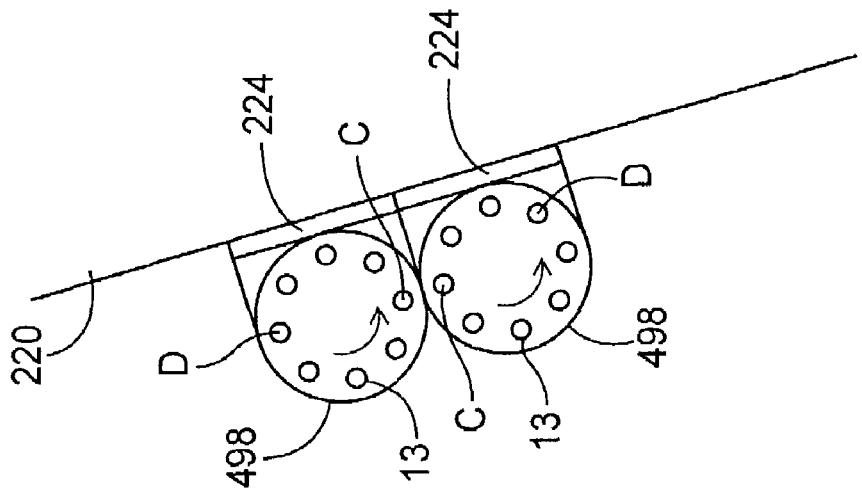
FIGS. 15A and 15B are plan views schematically showing a manner in which the two electric components are mounted at the same time by the two mounting units in the electric-component mounting system of FIG. 1, and a manner in which the electric components are mounted by modified mounting units.
Figure 15A:
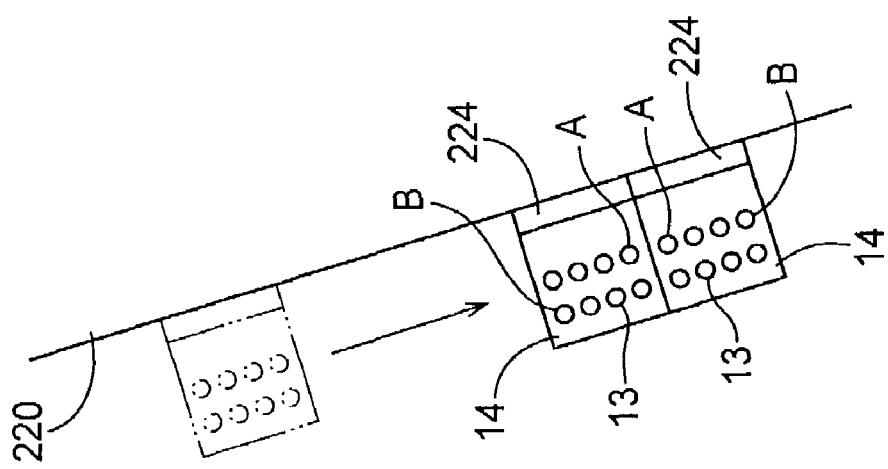

One possible modification of the mounting units 14 is schematically shown in FIG. 15B. Namely, two rotary mounting units 498 may be used for simultaneous mounting of two electric components. These two rotary mounting units 498 are mounted on the respective two first Y-axis slides 224. Each rotary mounting unit 498 has eight mounting heads 13 mounted thereon such that the axis of rotation is perpendicular to the reference plane (XY plane) and such that the mounting heads 13 are equiangularly spaced apart from each other in the circumferential direction of a cylindrical body of the mounting unit 498. The rotary mounting unit 498 is rotatable about its axis by a rotary drive device (not shown) so that the mounting heads 13 can be intermittently turned about the axis of rotation of the mounting unit 498, and can be sequentially moved to different positions arranged in the circumferential direction of the mounting head 498. Where the two mounting heads 13 now located at the positions indicated at "D" in FIG. 15B are used for simultaneous mounting of respective two electric components, these two mounting heads 13 can be moved to the positions indicated "C", by rotary motions of the two rotary mounting units 498, so that the electric components can be mounted at respective two spots which are considerably close to each other. While the angular positions of the electric components as held by the mounting heads 13 are changed as the rotary mounting units 498 are rotated, the mounting heads 13 are rotated by a head rotating device similar to the device 140 shown in FIG. 5, under the control of the control device 400, to compensate for a change in the angular positions of the electric components, so that the electric components can be mounted at the nominal angular positions. The rotary mounting units 498 described above are equally applicable to the second X-axis slide 230.

Second Embodiment

Figure 16:
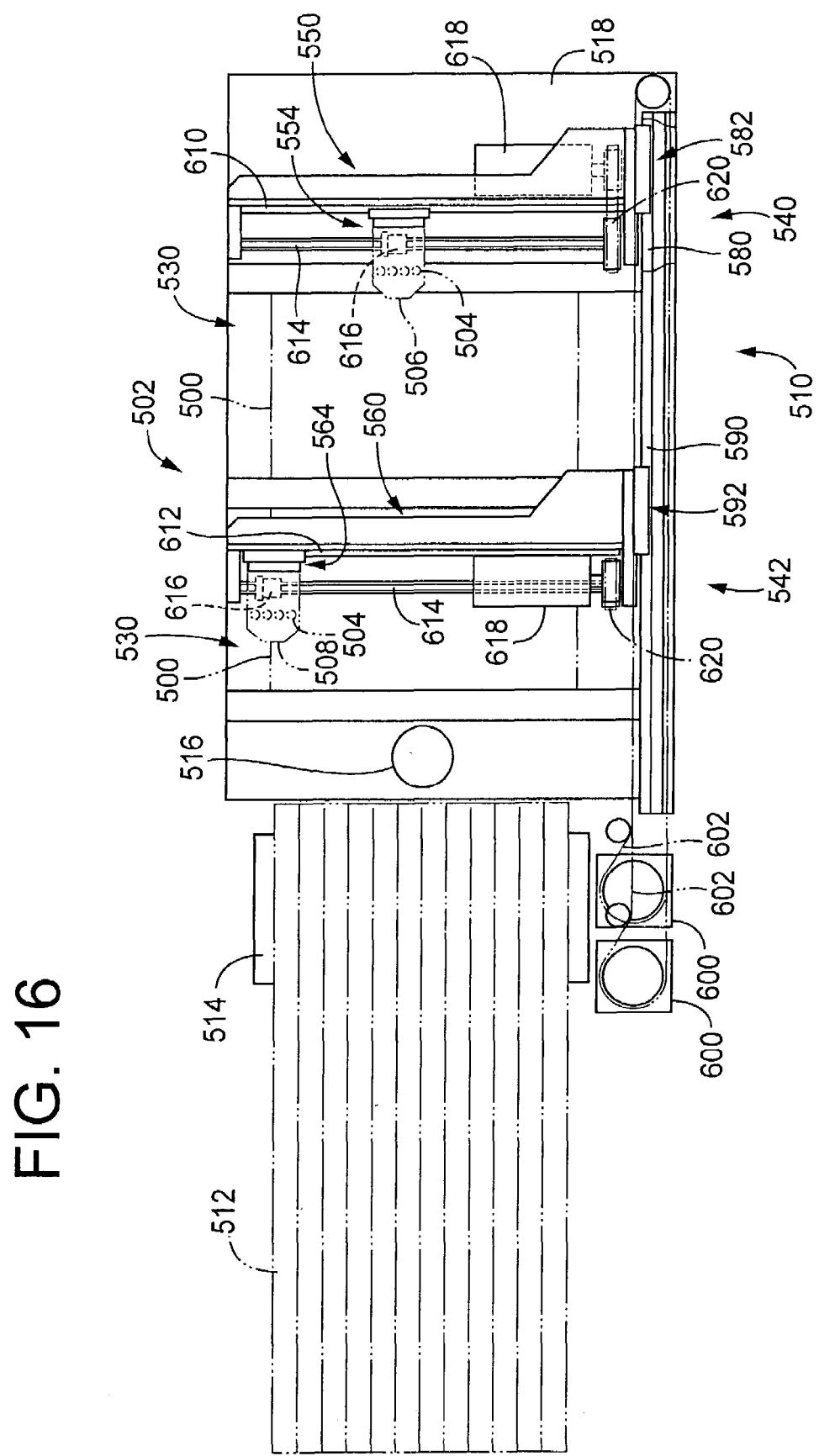
FIG. 16 is a plane view of an electric-component mounting system constructed according to a second embodiment of this invention.
Figure 17:
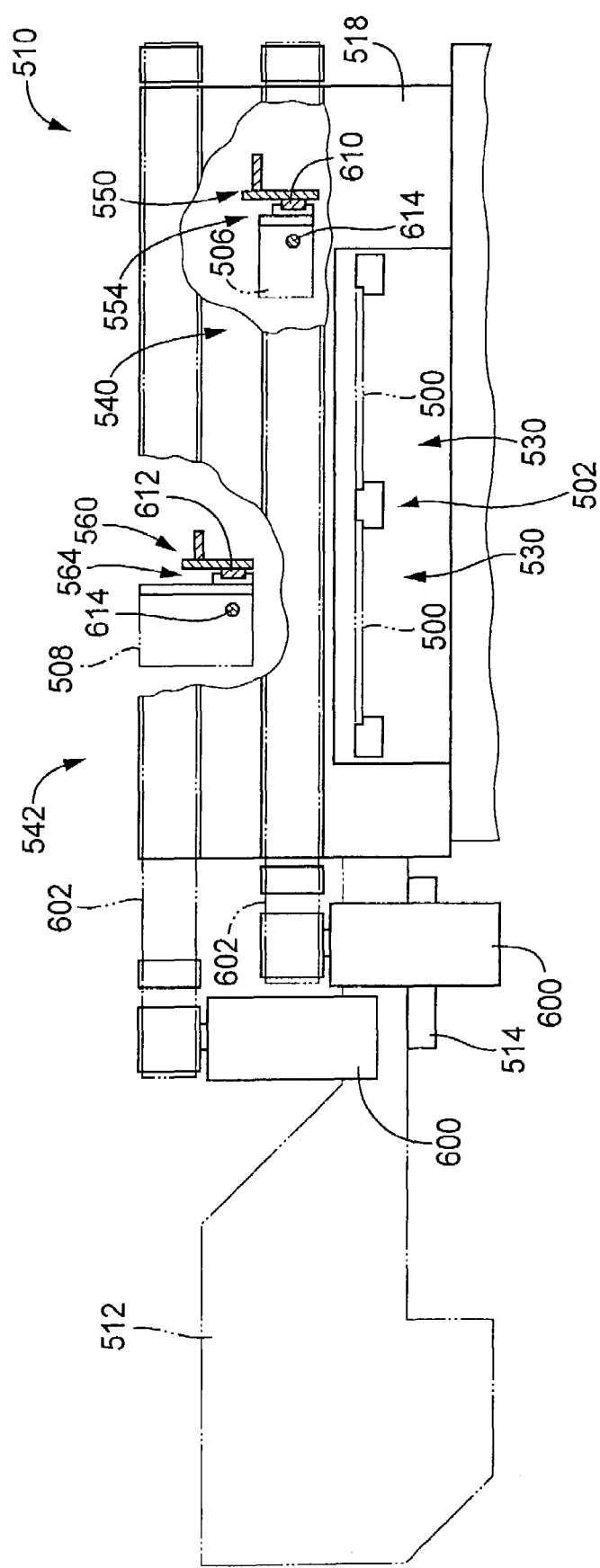
FIG. 17 is a front elevational view in cross section showing a major part of the electric-component mounting system of FIG. 16.
Figure 18:
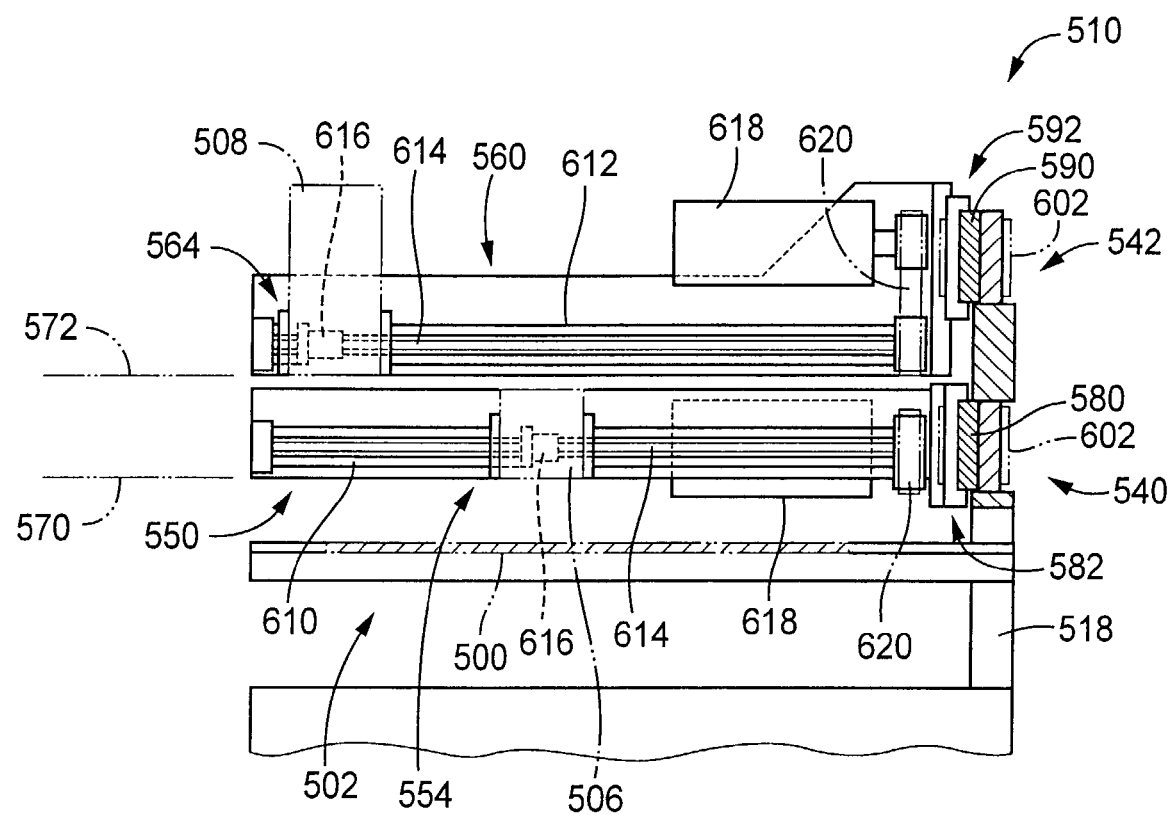
FIG. 18 is a left-hand side elevational view showing the major part of the electric-component mounting system of FIG. 16.

Referring next to the plan view of FIG. 16, the front elevational view in cross section of FIG. 17 and the left-hand side elevational view of FIG. 18, there will be described an electric-component mounting system constructed according to a second embodiment of this invention. The present system includes, as major components thereof, a substrate-holding device 502 for holding a circuit substrate 500, a first mounting unit 506, a second mounting unit 508, and a mounting-unit moving device 510 including two XY slide assemblies. Each of the first and second mounting units 506, 508 has a plurality of mounting heads 504 for holding and mounting the electric components. The electric-component mounting system further includes: a support table 514 serving to position and support a component-supplying device 512 which is operable to supply the electric components; a component imaging device 516 including a CCD camera arranged to recognize or detect the electric component as held by the mounting head 504, more specifically, to detect the hold-position or attitude of the electric component; a control device operable to control various operations of the present system; a frame 518 (only a portion of which is shown in FIGS. 16–18) which serves as a machine base on which various devices are disposed; and various operator's control panels (not shown). Those components of the present system will be described one after another. As in the first embodiment of FIG. 1, a plane parallel to the component-mounting surface of the circuit substrate 500 as held by the substrate-holding device 502 is referred to as the "reference plane", which is the XY plane defined by the X-axis direction parallel to the horizontal direction (right and left direction) as seen in FIG. 16, and the Y-axis direction which is perpendicular to the X-axis direction and parallel to the vertical direction as seen in FIG. 16. The direction perpendicular to the XY plane or the reference plane, that is, the direction perpendicular to the plane of FIG. 16 is referred to as a "Z-axis direction".

The substrate-holding device 502 is capable of holding a plurality of circuit substrates 500, for example, two circuit substrates 500 at one time, such that the circuit substrates 500 are arranged in the X-axis direction. The substrate-holding device 502 has two holding portions 530 for holding the two circuit substrates 500. The two holding portions 530 are substantially identical in construction with each other, and each of these two holding portions 530 is arranged to be connected to a substrate-loading device in the form of a loading conveyor and a substrate-unloading device in the form of an unloading conveyor. Each of the first and second holding portions 530 holds or supports the circuit substrate 500 such that the circuit substrate 500 is held parallel to the reference plane (XY plane or horizontal plane) while the component-mounting surface of the circuit substrate 500 faces upwards. The construction and function of each holding portion 500 of the substrate-holding device 502 are the same as the holding portions 40, 42 of the substrate-holding device 12 provided in the first embodiment. The component-supplying device 512 used for the present electric-component mounting system is of tape feeder type, having a multiplicity of tape feeders arranged in parallel with each other, as shown in FIG. 16. The construction and function of the component-supplying device 512 are the same as those of the component-supplying device 20 provided in the first embodiment. The support table 514 supporting the component-supplying device 512 is fixed on the frame 518, and is arranged such that the tape feeders are removably mounted on the support table 514, at selected positions. In the present electric-component mounting system, the tape feeders of the component-supplying device 512 are mounted on the support table 514 such that component-supply potions of the tape feeders are arranged along a straight line parallel to the Y-axis direction.

Each of the first and second mounting units 506, 508 is provided with four mounting heads 504 for holding and mounting the electric components. The four mounting heads 504 are mounted on each mounting unit 506, 508 such that each mounting head 504 extends in the Z-axis direction perpendicular to the reference plane (XY plane) and such that the four mounting heads 504 are arranged in a straight row parallel to the Y-axis direction. Each mounting head 504 has a lower component-holding portion provided with a suction nozzle. The electric component is held by the suction nozzle by suction under a negative pressure, and is released from the suction nozzle when the negative pressure is removed from the suction nozzle or when a positive pressure is applied to the suction nozzle. The mounting head 504 is a generally shaft-like member disposed on the mounting unit 506, 508 such that the mounting head 504 is axially movable in the Z-axis direction and rotatable about its axis. Each of the first and second mounting units 506, 508 is provided with an axial head drive device operable to elevate and lower each mounting head 504, when the mounting head 504 receives the electric component from the component-supplying device 512 and mounts the electric component on the circuit substrate 500. Each mounting unit 506, 508 is further provided with a head rotating device operable to rotate each mounting head 504 about its axis, for adjusting the angular position of the electric component as mounted on the circuit substrate 500. Each mounting unit 506, 508 is further provided with a fiducial-mark recognition device or fiducial-mark imaging device operable to take images of fiducial marks provided on the component-mounting surface of the circuit substrate 500, for the purpose of detecting the positioning error of the circuit substrate 500 as held by the substrate-holding device 502. The construction and function of the first and second mounting units 506, 508 and the mounting heads 504 are identical with those of the mounting units 14, 16 and the mounting heads 13 provided in the first embodiment. However, the present electric-component mounting is not provided with a distance-difference eliminating device (354, 460) as provided in the first embodiment. In the present second embodiment wherein the mounting heads 504 of the second mounting unit 508 are located above the mounting heads 504 of the first mounting unit 506, each mounting head 504 of the second mounting unit 508 has a larger axial dimension and has a larger vertical stroke, namely, a larger operating stroke in the Z-axis direction. The operating stroke of the mounting heads 504 of the second mounting unit 508 is larger than that of the mounting heads 504 of the first mounting unit 506 by an amount equal to a difference between the distances of the first and second mounting units 506, 508 to the component-mounting surface of the circuit substrate 500 (to the component-supply portions of the tape feeders of the component-supply device 512).

The mounting-unit moving device 510 includes, as major components thereof, a first mounting-unit moving device 540 operable to move the first mounting unit 506 between the component-supplying and component-mounting areas, and a second mounting-unit moving device 542 operable to move the second mounting unit 508 between the component-supplying and component-mounting areas. Each of the first and second mounting-unit moving devices 540, 542 is of XY slide assembly type. The first mounting-unit moving device 540 includes: a first X-axis slide 550; a first X-axis-slide moving device operable to move the first X-axis slide 550; a first Y-axis slide 554 on which the first mounting unit 506 is mounted; and a first Y-axis-slide moving device operable to move the first Y-axis slide 554 on the first X-axis slide 550. Similarly, the second mounting-unit moving device 542 includes: a second X-axis slide 560; a second X-axis-slide moving device operable to move the second X-axis slide 560; a second Y-axis slide 564 on which the second mounting unit 508 is mounted; and a second Y-axis-slide moving device operable to move the second Y-axis slide 564 on the second X-axis slide 560.

The first mounting-unit moving device 540 and the second mounting-unit moving device 542 are arranged to move the first mounting unit 506 and the second mounting unit 508 in respective first and second planes 570, 572 parallel to the reference plane, as indicated in FIG. 18. These first and second planes 570, 572 are spaced apart from the component-mounting surface of the circuit substrate 500, and are spaced apart from each other by a distance sufficient to avoid an interference between the first and second mounting units 506, 508 when these two mounting units 506, 508 are moved in the respective first and second planes 570, 572 between the component-supplying and component-mounting areas. Thus, the mounting-unit moving device 510 is arranged to permit the first and second mounting units 506, 508 to be moved past each other, between the component-supplying and component-mounting areas, as needed, without a risk of mutual interference during their movements along the respective planes 570, 572 for receiving and mounting the electric components.

In the present electric-component mounting system, the first and second X-axis slides 550, 560 are moved by the respective first and second mounting-unit moving devices 540, 542, in the X-axis direction in which the component-supplying device 512 and the substrate-holding device 502 are spaced apart from each other, that is, the component-supplying and component-mounting areas are spaced apart from each other, and in which the two circuit substrates 500 held on the substrate-holding device 502 are positioned relative to each other.

In each of the first and second mounting-unit moving devices 540, 542 of XY slide assembly type, the first or second X-axis slide 550, 560 is supported at one of its opposite ends. The first X-axis-slide moving device in the first mounting-unit moving device 540 includes one first X-axis-slide guide rail 580 extending the X-axis direction, and a first X-axis-slide supporting device 582 which supports the first X-axis slide 550 at its one end and which is movable on the first X-axis-slide guide rail 580. The second X-axis-slide moving device in the second mounting-unit moving device 542 includes one second X-axis-slide guide rail 590 extending in the X-axis direction, and a second X-axis-slide supporting device 592 which supports the second X-axis slide 560 and which is movable on the second X-axis-slide guide rail 590. The first and second X-axis-slide guide rails 580, 590 are provided on the frame 518, on the same side of the component-supplying and component-mounting areas, that is, on the same side of the component-supplying device 512 and substrate-holding device 502. With the movements of the first and second X-axis-slide supporting devices 582, 592 on the respective first and second X-axis-slide guide rails 580, 590, the first and second X-axis slides 550, 560 are moved in the X-axis direction. The two X-axis-slide supporting devices 582, 592 are held in engagement with the respective X-axis-slide guide rails 580, 592 through bearing devices, and are moved by respective X-axis drive motors 600 through respective timing belts 602. The positions of the X-axis-slide supporting devices 580, 590 in the X-axis direction are detected by position detectors in the form of encoders. It will be understood that the first X-axis-slide moving device includes the first X-axis-slide guide rail 580, first X-axis-slide supporting device 582, X-axis slide drive motor 600 and timing belt 602, while the second X-axis-slide moving device includes the second X-axis-slide guide rail 590, second X-axis-slide supporting device 592, X-axis slide drive motor 600 and timing belt 602.

The first and second Y-axis slides 554, 564 are movable on the respective first and second X-axis slides 550, 560. The first and second X-axis slides 550, 560 are provided with a first Y-axis-slide guide rail 610 and a second Y-axis-slide guide rail 612, respectively, and the first and second Y-axis slides 554, 564 are held in engagement with the first and second Y-axis-slide guide rails 610, 612 through bearing devices. Each of the X-axis slides 550, 560 is provided with a feedscrew 614 extending parallel to the Y-axis-slide guide rail 610, 612, while each of the Y-axis slides 554, 564 is provided with a nut 616 held in meshing engagement with the feedscrew 614. The feedscrew 614 and nut 616 cooperate to constitute a ballscrew-ballnut mechanism. Each of the X-axis slides 550, 560 is provided with a Y-axis slide drive motor 618. A rotary motion of this Y-axis slide drive motor 618 is transmitted to the feedscrew 614 through a timing belt 620, so that the Y-axis slide 554, 564 is moved on the X-axis slide 550, 560 in the Y-axis direction. The positions of the Y-axis slides 554, 564 in the Y-axis direction are detected by position detectors in the form of encoders. It will be understood that the first Y-axis-slide moving device includes the first Y-axis-slide guide rail 610, feedscrew 614, nut 616, Y-axis slide drive motor 618 and timing belt 620, while the second Y-axis-slide moving device includes the first Y-axis-slide guide rail 612, feedscrew 614, nut 616, Y-axis slide drive motor 618 and timing belt 620.

The electric-component mounting system of the present second embodiment of FIGS. 16–18 is different from that of the first embodiment of FIGS. 1–15 in that only one first mounting unit 506 and only one second mounting unit 508 are provided, in that the X-axis slides 550, 560 are not inclinable or pivotable in the XY plane, in that each of the X-axis slide 550, 560 is supported at only one of its opposite ends, and in that the system is provided with the second mounting unit 508 which is not provided with a distance-difference eliminating device. Accordingly, the present mounting system is simpler in construction. In this mounting system, too, the first and second mounting units 506, 508 can be moved in the opposite directions between the component-supplying and component-mounting areas, without an interference between the mounting units 506, 508, and is capable of performing the component-mounting operations with high efficiency, with a comparatively small installation space required for the system. The present system uses a control device similar to the control device 400 used in the first embodiment, and perform the component-mounting operations in substantially the same manner as in the first embodiment.

Third Embodiment

Figure 19:
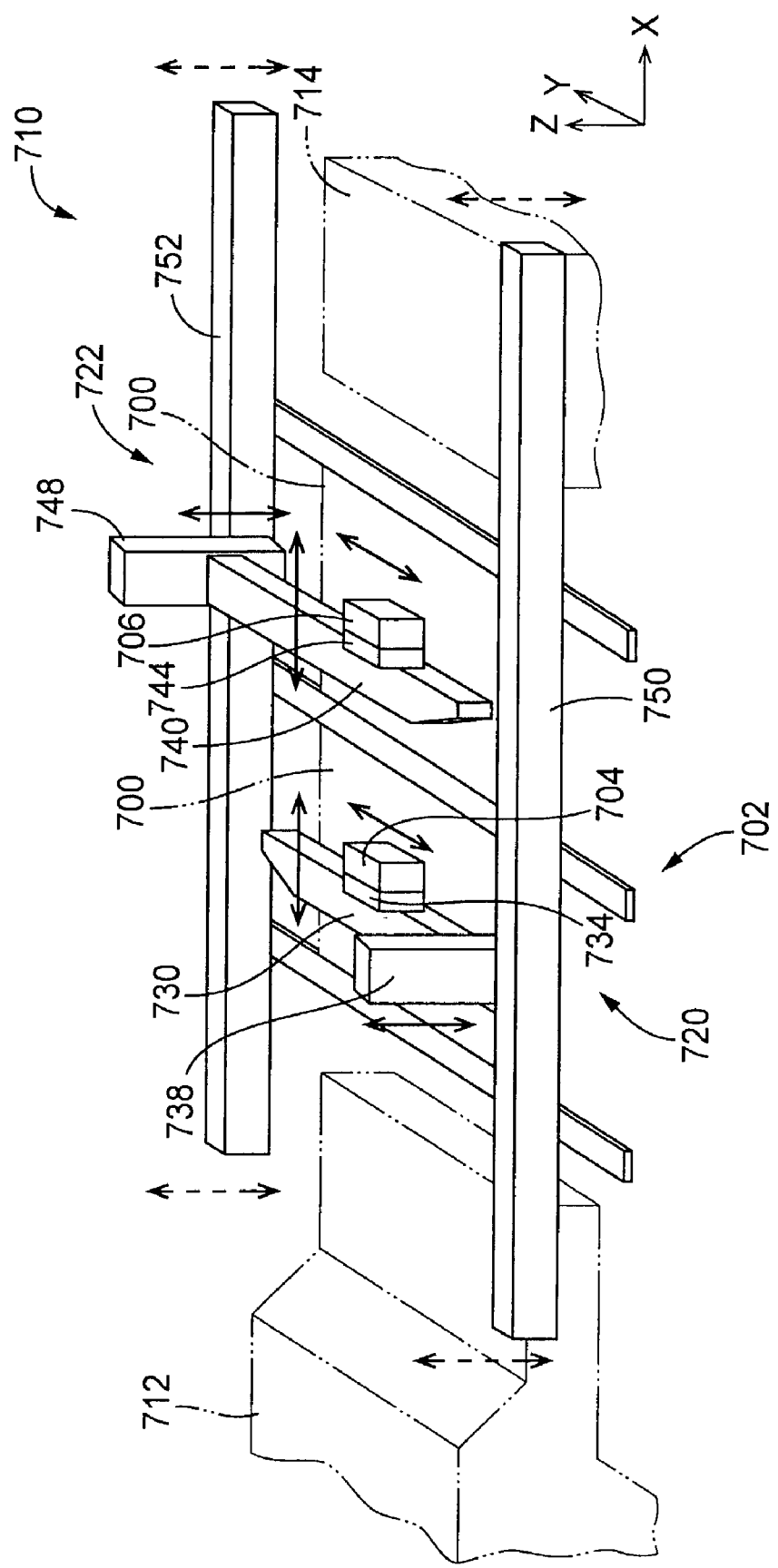
FIG. 19 is a perspective view schematically showing an arrangement of various devices in a further embodiment of this invention.

Referring next to the schematic view of FIG. 19, there will be described an electric-component mounting system constructed according to a third embodiment of this invention. The present system includes, as major components thereof, a substrate-holding device 702 for holding a circuit substrate 700, a first mounting unit 704, a second mounting unit 706, and a mounting-unit moving device 710 including two XY slide assemblies. Each of the first and second mounting units 704, 706 has a plurality of mounting heads for holding and mounting the electric components. In the present mounting system, two component-supplying devices 712, 714 are disposed on respective opposite sides of the substrate-holding device 702, more precisely, such that the component-supplying devices 712, 714 are spaced apart from each other in the X-axis direction. Accordingly, two component-supplying areas are located on the opposite sides of the component-mounting area. The component-supplying device 712 is of tape feeder type, while the component-supplying device 714 is of tray type.

The mounting-unit moving device 710 includes a first mounting-unit moving device 720 operable to move the first mounting unit 704 between the component-mounting area and the two component-supplying areas, and a second mounting-unit moving device 722 operable to move the second mounting unit 706 between the component-mounting area and the two component-supplying areas. Each of the first and second mounting-unit moving devices 720, 722 is of XY slide assembly type. The first mounting-unit moving device 720 includes: a first X-axis slide 730; a first X-axis-slide moving device operable to move the first X-axis slide 730; a first Y-axis slide 734 on which the first mounting unit 704 is mounted; a first Y-axis-slide moving device operable to move the first Y-axis slides 734 on the first X-axis slide 730; and a first X-axis-slide Z-axis drive device 738 operable to elevate and lower the first X-axis slide 730 in the Z-axis direction. Similarly, the second mounting-unit moving device 722 includes: a second X-axis slide 740; a second X-axis-slide moving device operable to move the second X-axis slide 740; a second Y-axis slide 744 on which the second mounting unit 706 is mounted; a second Y-axis-slide moving device operable to move the second Y-axis slide 744 on the second X-axis slide 740; and a second X-axis-slide Z-axis drive device 748 operable to elevate and lower the second X-axis slide 740 in the Z-axis direction.

In the present electric-component mounting system, the first and second X-axis slides 730, 740 are moved by the respective first and second mounting-unit moving devices 720, 722, in the X-axis direction in which the component-supplying devices 712, 714 and the substrate-holding device 702 are spaced apart from each other, that is, the component-supplying areas and the component-mounting area are spaced apart from each other, and in which two circuit substrates 700 held on the substrate-holding device 702 are positioned relative to each other. In each of the first and second mounting-unit moving devices 720, 722 of XY slide assembly type, the first or second X-axis slide 730, 740 is supported at one of its opposite ends. The first and second X-axis-slide moving devices 720, 722 respectively include one first X-axis-slide guide rail 750 and one second X-axis-slide guide rail 752 which are disposed so as to extend in the X-axis direction, on respective opposite sides of the substrate-holding device 702 such that the two guide rails 750, 752 are spaced apart from each other in the Y-axis direction. The two guide rails 750, 752 have the same height or Z-axis position, that is, spaced the same distance from the component-mounting surfaces of the circuit substrates 700 as held by the substrate-holding device 702, or from a predetermined reference plane which is parallel to the component-mounting surfaces and which is set at a predetermined position in the Z-axis direction.

When the first and second mounting units 704, 706 are moved past each other, between one or the other of the component-supplying areas and the component-mounting area, these two mounting units 704, 706 are moved in the same XY plane. When the two mounting units 704, 706 are moved past each other, one of the first and second X-axis-slide Z-axis drive devices 738, 748 is operated to elevate one of the first and second X-axis slides 730, 740, for thereby preventing an interference between the two mounting units 704, 706. The X-axis-slide Z-axis drive devices 738, 748 may be replaced by first and second mounting-unit Z-axis drive devices in the form of two guide-rail Z-axis drive devices operable to move the respective first and second X-axis guide rails 750, 752 in the Z-axis direction, as indicated by arrow-headed broken lines in FIG. 19. The interference between the two mounting units 704, 706 during their movements past each other in the opposite X-axis directions can be prevented by operating one of the two guide-rail Z-axis drive devices. It will be understood that the mounting-unit Z-axis drive devices in the form of the X-axis-slide Z-axis drive devices 738, 748 or the guide-rail Z-axis drive devices are considered to be a distance-difference generating device for generating a difference between the distances of the first and second mounting units 704, 706 to the predetermined reference plane. This difference can be eliminated by the mounting-unit Z-axis drive devices such as the drive devices 738, 748. In this respect, these Z-axis drive devices may also be considered to be a distance-difference eliminating device. The mounting units 704, 706 and the mounting heads disposed thereon and the various devices of the mounting-unit moving device 710 may be constructed as described above with respect to the corresponding devices of the first and second embodiments. Further, the description of the control device 400 of the first embodiment is applicable to the present electric-component mounting system of FIG. 19.

In the present electric-component mounting system, the first and second mounting units 704, 706 may be moved past each other, between one of the two component-supplying areas and the component-mounting area, in the opposite directions, as in the preceding embodiments. Further, the present mounting system provided with the two component-supplying devices 712, 714 may be operated such that one of the two mounting units 704, 706 receives electric components from one of the component-supplying devices 712, 714, while the other mounting unit receives the electric components from the other component-supplying device. In this case, the freedom or flexibility of the component-mounting operations is improved. Further, the component-mounting operations by the two mounting units 704, 706 using the two component-supplying devices 712, 714 may be performed simultaneously on the two circuit substrates 700. The versatility of the component-mounting operations can be improved by effective utilization of the X-axis-slide Z-axis drive devices 738, 748 to elevate and lower the mounting units 704, 706 at suitable times for various purposes.

What is claimed is:

1. An electric-component mounting system comprising:
a substrate-holding device operable to hold at least one circuit substrate each having a component mounting surface on which electric components are to be mounted;
at least one first mounting unit and at least one second mounting unit, each of which has at least one mounting head each operable to receive a selected one of the electric components while said each mounting unit is located in a component-supplying area in which the electric components are supplied, said each mounting head being further operable to mount the electric component onto said component-mounting surface of said at least one circuit substrate held by said substrate-holding device located in a component-mounting area; and
a mounting-unit moving device operable to move said at least one first mounting unit and said at least one second mounting unit past each other, between said component-supplying and component-mounting areas in opposite directions, along respective two paths, without an interference between said at least one first mounting unit and said at least one second mounting unit, such that at least portions of said two paths in which said first and second mounting units are moved past each other in the opposite directions are spaced respective different distances from a predetermined reference plane which is parallel to said component-mounting surface of said at least one circuit substrate and which is set at a predetermined position in a direction perpendicular to said component-mounting surface.

2. An electric-component mounting system according to claim 1, wherein two component-supplying areas are provided on respective opposite sides of said component-mounting area.

3. An electric-component mounting system according to claim 1, wherein one component-supplying area is provided on one of opposite sides of said component-mounting area.

4. An electric-component mounting system according to claim 3, further comprising a mounting-unit position control device operable to control said mounting-unit moving device such that when one of said at least one first mounting unit and said at least one second mounting unit is located in said component-mounting area, the other of said at least one first mounting unit and said at least one second mounting unit is located in said component-supplying area, to enable the at least one mounting head thereof to receive the electric component.

5. An electric-component mounting system according to claim 1, wherein said substrate-holding device is operable to hold at least two circuit substrates such that said at least two circuit substrates are arranged in a direction in which said component-supplying and component-mounting areas are spaced from each other.

6. An electric-component mounting system according to claim 1, wherein said mounting-unit moving device comprises:
a first mounting-unit moving device operable to move said at least one first mounting unit between said component-supplying and component-mounting areas, along a first plane parallel to said predetermined reference plane; and
a second mounting-unit moving device operable to move said at least one second mounting unit between said component-supplying and component-mounting areas, along a second plane which is parallel to said predetermined reference plane, said first and second planes being spaced respective different distances from said predetermined reference plane.

7. An electric-component mounting system according to claim 6, further comprising a distance-difference eliminating device operable to eliminate a difference between the distances of the first and second mounting units to said predetermined reference plane, in at least one of a component-receiving operation in which said first and second mounting units receive the electric components in said component-supplying area, and a component-mounting operation in which said first and second mounting units mount the electric components on said at least one circuit substrate in said component-mounting area.

8. An electric-component mounting system according to claim 7, wherein said distance-difference eliminating device includes a distance-difference elimination moving device operable to move at least one of said first and second mounting units.

9. An electric-component mounting system according to claim 8, wherein said distance-difference-elimination moving device includes a mounting-unit translating device operable to translate at least one of said first and second mounting units in a direction substantially perpendicular to said predetermined reference plane.

10. An electric-component mounting system according to claim 8, wherein said distance-difference-elimination moving device includes a mounting-unit pivotally moving device operable to pivot at least one of said first and second mounting units each about a pivot axis substantially parallel to said predetermined reference plane.

11. An electric-component mounting system according to claim 7, wherein said distance-difference eliminating device is operable to eliminate said difference between the distances of the first and second mounting units to said predetermined reference plane in at least said component-mounting operation, and includes a substrate moving device operable to move said at least one circuit substrate in a direction substantially perpendicular to said predetermined reference plane, to eliminate said difference, in at least one of a first component-mounting operation in which the electric components are mounted by said at least one first mounting unit, and a second component-mounting operation in which the electric components are mounted by said at least one second mounting unit.

12. An electric-component mounting system according to claim 6, wherein each of at least one of said first and second mounting-unit moving devices comprises:
an X-axis slide disposed movably in a first direction parallel to said predetermined reference plane and extending in a second direction which is parallel to said reference plane and which intersects said first direction;
an X-axis-slide moving device operable to move said X-axis slide in said first direction;
a Y-axis slide which is disposed movably in said second direction on said X-axis slide and which carries one of said first and second mounting units which is moved by said each of at least one of said first and second mounting-unit moving devices; and
a Y-axis-slide moving device operable to move said Y-axis slide in said second direction on said X-axis slide.

13. An electric-component mounting system according to claim 12, wherein said first mounting-unit moving device comprises (a) a first X-axis slide disposed movably in a first X-axis direction parallel to said reference plane and extending in a first Y-axis direction which is parallel to said reference plane and which intersects said first X-axis direction, (b) a first X-axis-slide moving device operable to move said first X-axis slide in said first X-axis direction, (c) a first Y-axis slide which is disposed movably in said first Y-axis direction on said first X-axis slide and which carries said at least one first mounting unit moved by said first mounting-unit moving device, and (d) a first Y-axis-slide moving device operable to move said first Y-axis slide in said first Y-axis direction on said first X-axis slide, and wherein said second mounting-unit moving device comprises (i) a second X-axis slide disposed movably in a second X-axis direction parallel to said reference plane and extending in a second Y-axis direction which is parallel to said reference plane and which intersects said second X-axis direction, (ii) a second X-axis-slide moving device operable to move said second X-axis slide in said second X-axis direction, (iii) a second Y-axis slide which is disposed movably in said second Y-axis direction on said second X-axis slide and which carries said at least one second mounting unit moved by said second mounting-unit moving device, and (iv) a second Y-axis-slide moving device operable to move said second Y-axis slide in said second Y-axis direction on said second X-axis slide.

14. An electric-component mounting system according to claim 13, wherein said first and second X-axis directions in which said first and second X-axis slides are moved, respectively, are substantially parallel to each other.

15. An electric-component mounting system according to claim 14, wherein two component-supplying areas are provided on respective opposite sides of said component-mounting area, such that said two component-supplying areas and said component-mounting area are spaced from each other in a direction substantially parallel to said first and second X-axis directions.

16. An electric-component mounting system according to claim 14, wherein said component-supplying area is provided on one of opposite sides of said component-mounting area, such that said component-supplying and component-mounting areas spaced from each other in a direction substantially parallel to said first and second X-axis directions.

17. An electric-component mounting system according to claim 13, wherein said substrate-holding device is operable to hold at least two circuit substrates such that said at least two circuit substrates are arranged in a direction in which said component-supplying and component-mounting areas are spaced from each other.

18. An electric-component mounting system according to claim 13, wherein each of at least one of said first and second Y-axis slides which has said at least one first mounting unit and said at least one second mounting unit, respectively, is provided with a distance-difference eliminating device operable to move at least one of said first and second mounting units, for eliminating a difference between the distances of the first and second mounting units to said predetermined reference plane, in at least one of a component-receiving operation in which said first and second mounting units receive the electric components in said component-supplying area, and a component-mounting operation in which said first and second mounting units mount the electric components on said at least one circuit substrate in said component-mounting area.

19. An electric-component mounting system according to claim 18, wherein said distance-difference eliminating device includes a mounting-unit translating device operable to translate said each of at least one of said first and second mounting units in a direction substantially perpendicular to said predetermined reference plane.

20. An electric component mounting system according to claim 18, wherein said distance-difference eliminating device includes a mounting-unit pivotally moving device operable to pivot at least one of said first and second mounting units each about a pivot axis substantially parallel to said predetermined reference plane.

21. An electric-component mounting system according to claim 13, wherein said first X-axis slide moving device includes one first X-axis guide rail extending in said first X-axis direction, and a first X-axis-slide supporting device which supports said first X-axis slide at one end portion thereof and which is movable on said first X-axis guide rail, and said second X-axis slide moving device includes one second X-axis guide rail extending in said second X-axis direction, and a second X-axis-slide supporting device which supports said second X-axis slide at one end portion thereof and which is movable on said second X-axis guide rail.

22. An electric-component mounting system according to claim 13, wherein said first X-axis-slide moving device includes two first X-axis guide rails extending in said first X-axis direction, and two first X-axis-slide supporting devices which support said first X-axis slide at opposite end portions thereof and which are movable on said two first X-axis guide rails, respectively, and said second X-axis-slide moving device includes two second X-axis guide rails extending in said second X-axis direction, and two second X-axis-slide supporting devices which support said second X-axis slide at opposite end portions thereof and which are movable on said two second X-axis guide rails, respectively.

23. An electric-component mounting system according to claim 13, wherein said at least one first mounting unit consists of at least two first mounting units, and said at least one second mounting unit consists of at least two second mounting units, and wherein said first mounting-unit moving device includes at least two first Y-axis slides which respectively carry said at least two first mounting units and which are moved by said first Y-axis-slide moving device independently of each other on said first X-axis slide, said second mounting-unit moving device including at least two second Y-axis slides which respectively carry said at least two second mounting units and which are moved by said second Y-axis-slide moving device independently of each other on said second X-axis slide.

24. An electric-component mounting system according to claim 23, wherein said first X-axis-slide moving device is operable to incline said first X-axis slide in a plane parallel to said predetermined reference plane, with respect to a straight line perpendicular to said first X-axis direction, and said second X-axis-slide moving device is operable to incline said second X-axis slide in said plane parallel to said predetermined reference plane, with respect to a straight line perpendicular to said second X-axis direction.

25. An electric-component mounting system according to claim 24, wherein said first X-axis-slide moving device includes (a) two first X-axis guide rails extending in said first X-axis direction, (b) two first X-axis-slide pivotally supporting devices which respectively support said first X-axis slide at respective opposite end portions thereof such that said first X-axis slide is pivotable at its opposite end portions, said two first X-axis-slide pivotally supporting devices being movable on said two first X-axis guide rails, respectively, and (c) a first distance-change permitting device operable in response to a pivotal motion of said first X-axis slide, to permit a change of a distance between two positions at which said first X-axis slide is supported by said two first X-axis-slide pivotally supporting devices, and said second X-axis-slide moving device includes (i) two second X-axis guide rails extending in said second X-axis direction, (ii) two second X-axis-slide pivotally supporting devices which respectively support said second X-axis slide at respective opposite end portions thereof such that said second X-axis slide is pivotable at its opposite end portions, said two second X-axis-slide pivotally supporting devices being movable on said two second X-axis guide rails, respectively, and (iii) a second distance-change permitting device operable in response to a pivotal motion of said second X-axis slide, to permit a change of a distance between two positions at which said second X-axis slide is supported by said two second X-axis-slide pivotally supporting devices.

26. An electric-component mounting system according to claim 24, further comprising an angular-component-position adjusting device operable to adjust an angular position of the electric component as held by each mounting head of each of said first and second mounting units, for compensation for an angle of inclination of the corresponding one of said first and second X-axis slides in said plane.

27. An electric-component mounting system according to claim 26, wherein said angular-component-position adjusting device includes a head rotating device operable to rotate the mounting head holding the electric component, to adjust the angular position of the electric component, when said corresponding X-axis slide is inclined.

28. An electric-component mounting system according to claim 1, wherein each of at least one of said first and second mounting units has a plurality of mounting heads.

29. An electric-component mounting system according to claim 1, further comprising;
a component-recognition device disposed between said component-supplying and component-mounting areas and operable to recognize the electric component;
a component-positioning-error obtaining device operable on the basis of an output of said component-recognition device, to obtain an amount of positioning error of the electric component as held by the mounting head; and a head-position compensating device operable on the basis of the amount of positioning error of the electric component obtained by said component-positioning-error obtaining device, to compensate the position of said mounting head.

30. An electric-component mounting system comprising:

a substrate-holding device operable to hold at least one circuit substrate each having a component-mounting surface on which electric components are to be mounted;

an XY slide assembly including (a) an X-axis slide disposed movably in a first direction parallel to a predetermined reference plane parallel to said component-mounting surface of each of said at least one circuit substrate, said X-axis slide extending in a second direction which is parallel to said reference plane and which intersects said first direction, (b) an X-axis-slide moving device operable to move said X-axis slide in said first direction, such that said X-axis slide is inclinable in a plane parallel to said predetermined reference plane, with respect to a straight line perpendicular to said first direction, (c) a plurality of Y-axis slides disposed movably on said X-axis slide in said second direction, and (d) a Y-axis-slide moving device operable to move said plurality of Y-axis slides independently of each other on said X-axis slide in said second direction; and a plurality of mounting units which are respectively provided on said plurality of Y-axis slides and each of which has at least one mounting head each operable to receive a selected one of the electric components while said each mounting unit is located in a component-supplying area in which the electric components are supplied, said each mounting head being further operable to mount the electric component onto said component-mounting surface of said at least one circuit substrate held by said substrate-holding device in a component-mounting area.

31. An electric-component mounting system according to claim 30, wherein said component-supplying area is provided on at least one of opposite sides of said component-mounting area.

32. An electric-component mounting system according to claim 31, wherein said component-supplying area is provided on only one of opposite sides of said component-mounting area.

33. An electric-component mounting system according to claim 31, wherein said substrate-holding device is operable to hold at least two circuit substrates such that said at least two circuit substrates are arranged in a direction in which said component-supplying and component-mounting areas are spaced from each other.

34. An electric-component mounting system according to claim 31, wherein said first direction in which said X-axis slide is moved is substantially parallel to a direction in which said component-supplying and component-mounting areas are spaced from each other.

35. An electric-component mounting system according to claim 30, wherein said XY slide assembly includes;

two X-axis guide rails extending in said first direction;

two X-axis-slide pivotally supporting devices which respectively support said X-axis slide at respective opposite end portions thereof such that said X-axis slide is pivotable at its opposite end portions, said two X-axis-slide pivotally supporting devices being movable on said two X-axis guide rails, respectively; and a distance-change permitting device operable in response to a pivotal motion of said X-axis slide, to permit a change of a distance between two positions at which said X-axis slide is supported by said two X-axis-slide pivotally supporting devices.

36. An electric component mounting system according to claim 35, wherein said distance-change permitting device includes an X-axis-slide telescopic-movement permitting device which permits a change in a length of an intermediate portion of said X-axis slide located between said opposite end portions at which said X-axis slide is pivotally supported by said two X-axis-slide pivotally supporting devices.

37. An electric-component mounting system according to claim 35, wherein said distance-change permitting device includes an X-axis-slide relative-movement permitting device which permits a relative movement between one of said two X-axis-slide pivotally supporting devices and said X-axis slide in said second direction in which said X-axis slide extends.

38. An electric-component mounting system according to claim 30, further comprising an angular-component-position adjusting device operable to adjust an angular position of the electric component as held by each mounting head of each of said plurality of mounting units, for compensation for an angle of inclination of said XY slide assembly in said plane.

39. An electric-component mounting system according to claim 38, wherein said angular-component-position adjusting device includes a head rotating device operable to rotate the mounting head holding the electric component, to adjust the angular position of the electric component, when said X-axis slide is inclined.

40. An electric-component mounting system according to claim 30, wherein each of said plurality of mounting units has a plurality of mounting heads.

41. An electric-component mounting system according to claim 30, further comprising a simultaneous-component-mounting control device operable to control said XY slide assembly such that a selected one of said at least one mounting head of one of said plurality of mounting units and a selected one of said at least one mounting head of another of said plurality of mounting units are positioned to mount the respective two electric components substantially simultaneously at respective two predetermined component-mounting spots on one of said at least one circuit substrate.

42. An electric-component mounting system according to claim 30, comprising two XY slide assemblies each including said X-axis slide, said X-axis-slide moving device, said plurality of Y-axis slides and said Y-axis-slide moving device, and wherein said two XY slide assemblies are disposed such that said plurality of mounting units disposed on the respective Y-axis slide of one of said two XY slide assemblies and said plurality of mounting units disposed on the Y-axis slide of the other of said two XY slide assemblies are movable past each other, between said component-supplying and said component-mounting areas in opposite directions, along respective two planes which are spaced from said reference plane by respective different distances, so as to prevent an interference between the mounting units of said one XY slide assembly and the mounting units of the other XY slide assembly.

43. An electric-component mounting system according to claim 42, wherein said X-axis slides of said two XY slide assemblies are moved in respective first and second X-axis directions which are substantially parallel to each other.

44. An electric-component mounting system according to claim 42, further comprising a distance-difference eliminating device operable to eliminate a difference between the distances of the mounting units of said two XY slide assemblies to said predetermined reference plane, in at least one of a component-receiving operation in which the mounting units receive the electric components in said component-supplying area, and a component-mounting operation in which the mounting units mount the electric components on said at least one circuit substrate in said component-mounting area.

45. An electric-component mounting system according to claim 44, wherein said distance-difference eliminating device includes a distance-difference elimination moving device which is disposed between the mounting units of each of at least one of said two XY slide assemblies and the corresponding X-axis slide, and which is operable to move the mounting units of said each of at least one of said two XY slide assemblies, for eliminating said difference between the distances of the mounting units of said two XY slide assemblies.

46. An electric-component mounting system according to claim 45, wherein said distance-difference-elimination moving device includes a mounting-unit translating device operable to translate the mounting units of each of at least one of said two XY slide assemblies in a direction substantially perpendicular to said predetermined reference plane.

47. An electric-component mounting system according to claim 45, wherein said distance-difference-elimination moving device includes a mounting-unit pivotally moving device operable to pivot the mounting units of each of at least one of said two XY slide assemblies each about a pivot axis substantially parallel to said predetermined reference plane.

* * * * *